United States Patent
Kono et al.

(10) Patent No.: US 6,492,863 B2
(45) Date of Patent: Dec. 10, 2002

(54) INTERNAL HIGH VOLTAGE GENERATION CIRCUIT CAPABLE OF STABLY GENERATING INTERNAL HIGH VOLTAGE AND CIRCUIT ELEMENT THEREFOR

(75) Inventors: Takashi Kono, Hyogo (JP); Katsuyoshi Mitsui, Hyogo (JP); Kiyohiro Furutani, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,331

(22) Filed: Jan. 16, 2001

(65) Prior Publication Data

US 2001/0001545 A1 May 24, 2001

Related U.S. Application Data

(62) Division of application No. 09/166,171, filed on Oct. 5, 1998, now Pat. No. 6,201,437.

(30) Foreign Application Priority Data

Apr. 2, 1998 (JP) .................................. 10-089794

(51) Int. Cl.⁷ .................................................. G05F 1/10
(52) U.S. Cl. ...................... 327/538; 327/540; 326/226; 326/227
(58) Field of Search ................................ 327/198, 538, 327/540, 541, 542, 543, 545; 365/226, 227

(56) References Cited

U.S. PATENT DOCUMENTS

| 5,329,168 A | | 7/1994 | Sugibayashi et al. ........ 327/535 |
| 5,341,340 A | | 8/1994 | Hagura ....................... 365/226 |
| 5,917,765 A | * | 6/1999 | Morishita et al. ........... 365/201 |
| 5,929,539 A | * | 7/1999 | Kozaru et al. ................ 307/85 |
| 6,150,860 A | * | 11/2000 | Chun ......................... 327/198 |

* cited by examiner

Primary Examiner—Tuan T. Lam
Assistant Examiner—Hiep Nguyen
(74) Attorney, Agent, or Firm—McDermott, Will & Emery

(57) ABSTRACT

In order to stably generate a high voltage of a prescribed level, a Vpp detection circuit which is activated in response to an activation signal for comparing the high voltage with a reference voltage is forcibly brought into an active state for a prescribed period under control of an initial control circuit.

5 Claims, 28 Drawing Sheets

US 6,492,863 B2

INTERNAL HIGH VOLTAGE GENERATION CIRCUIT CAPABLE OF STABLY GENERATING INTERNAL HIGH VOLTAGE AND CIRCUIT ELEMENT THEREFOR

This application is a Divisional of application Ser. No. 09/166,171 filed Oct. 5, 1998 now U.S. Pat. No. 6,201,437.

BACKGROUND OF THE INVENTION

1. Field of the Invention

The present invention relates to a semiconductor circuit device, and more particularly, it relates to the structure of a circuit generating an internal voltage of a prescribed voltage level in its interior. More specifically, the present invention relates to the structure of a boosted voltage generation circuit generating a boosted voltage of a voltage level higher than that of an operating power supply voltage in a semiconductor memory device.

2. Description of the Prior Art

FIG. 53 schematically illustrates the structure of a conventional semiconductor circuit device CH. Referring to FIG. 53, the semiconductor circuit device CH includes a Vpp generation circuit PG generating a high voltage Vpp of a constant voltage level higher than that of an externally supplied power supply voltage VCC using this power supply voltage VCC, and an internal circuit NK performing a prescribed operation using the high voltage Vpp and the power supply voltage VCC. The internal circuit NK includes a Vpp utilization circuit NKa utilizing the high voltage Vpp from the Vpp generation circuit PG.

When the density and the degree of integration of a semiconductor circuit device including a MOS transistor (insulated gate field effect transistor) are enhanced, the size of the MOS transistor is refined. In order to ensure the reliability of a gate insulation film of the refined MOS transistor, it is necessary to prevent application of an excessive high voltage to the MOS transistor. Therefore, the voltage level of the power supply voltage VCC is reduced as the degree of integration and the density of the semiconductor circuit device are enhanced. Further, a high-speed operation is attained by reducing a signal amplitude, and current consumption is reduced by reducing a charge/discharge current for a signal line.

The semiconductor circuit device having such a refined MOS transistor utilizes the high voltage Vpp of a higher voltage level than the power supply voltage VCC for the following reason.

FIG. 54 illustrates a voltage application manner for an n-channel MOS transistor NQ included in the conventional semiconductor circuit device. Referring to FIG. 54, the n-channel MOS transistor NQ is supplied on its gate CG with a voltage changing between the high voltage Vpp and a ground voltage GND (0 V). An input signal IN changes between the power supply voltage VCC and the ground voltage GND (0 V). When the n-channel MOS transistor NQ has a threshold voltage Vth, it is possible to transmit a voltage (gate voltage V (CG)–Vth) from its source to its drain. When the high voltage Vpp is set at a voltage level exceeding the voltage VCC+Vth, therefore, an output signal OUT changing between the power supply voltage VCC and the ground voltage GND (0 V) can be obtained with no threshold voltage loss across the MOS transistor NQ.

High voltage Vpp is utilized for n-channel MOS transistor NQ in order to prevent the problem of threshold voltage loss thereby reliably transmitting a signal of the amplitude of the power supply voltage VCC. Thus, an internal signal of a desired amplitude can be correctly transmitted even if the power supply voltage VCC is at a low voltage level. Influence by such threshold voltage loss most remarkably appears on data read from a memory cell when this semiconductor circuit device is a semiconductor memory device.

FIG. 55 illustrates the structure of a memory cell MC of a conventional semiconductor memory device. Referring to FIG. 55, the memory cell MC is arranged in correspondence to a crossing between a word line WL and a bit line BL. The memory cell MC includes a capacitor Cm for storing information and an access transistor Qm conducting in response to a signal potential on the word line WL for connecting the capacitor Cm with the bit line BL. The access transistor Qm is formed by an n-channel MOS transistor. Such memory cells MC are arrayed in rows and columns, so that a row of memory cells MC are arranged in correspondence to the word line WL and a column of memory cells MC are arranged in correspondence to bit lines BL and /BL. In the example shown in FIG. 55, no memory cell MC is arranged at a crossing between the word line WL and the bit line /BL.

The bit lines BL and /BL are precharged at an intermediate voltage level. When the word line WL is selected, the access transistor Qm conducts so that the potential of the bit line BL changes in accordance with charges stored in the capacitor Cm. A sense amplifier (not shown) differentially amplifies and latches the potential difference between the bit lines BL and /BL. When the capacitor Cm stores high-level data, the bit line BL is driven to a power supply voltage Vcca (array power supply voltage) level. At this time, the word line WL is driven to a voltage level which is higher than the high-level voltage Vcca by the threshold voltage Vth of the access transistor Qm. Thus, the capacitor Cm stores data of the high-level voltage Vcca level with no influence by the threshold voltage Vth of the access transistor Qm.

The quantity of charges stored in a storage node (connection node between the access transistor Qm and the capacitor Cm) of the capacitor Cm is determined by the difference between the high-level data and a constant voltage (cell plate voltage) Vcp and the capacitance value of the capacitor Cm. Even if refinement (miniaturization) progresses to reduce the capacitance value of the capacitor Cm, therefore, it is possible to stably hold the high-level data by transmitting the voltage Vcca of the high-level data to the capacitor Cm with no threshold voltage loss thereby storing a sufficient quantity of charges. Also in data reading, it is possible to cause sufficient voltage difference (read voltage) on the bit line BL.

In the conventional semiconductor memory device (dynamic random access memory), therefore, the word line WL is generally driven to a voltage level higher than the power supply voltage Vcca supplied to a memory cell array. Therefore, a circuit driving the word line WL to the high voltage Vpp level utilizes the high voltage Vpp.

FIG. 56 shows another structure of the Vpp utilization circuit NKa. Referring to FIG. 56, an output circuit OB converts data D and /D read from an internal memory cell of a semiconductor memory device to external read data DQ and outputs the same. Referring to FIG. 56, the output circuit OB includes a level conversion circuit OBa converting the voltage level of the internal read data D to a high voltage Vpp level, an n-channel MOS transistor OBb conducting, when an output signal of the level conversion circuit OBa is at a high level, for driving the external data DQ to a power supply voltage VQ level, and an n-channel transistor OBc conducting when the complementary internal read data /D is at a high level, for setting the external read data DQ at the ground voltage level.

The power supply voltage VQ determines a high level of the external read data DQ. If the n-channel MOS transistor OBb causes threshold voltage loss when the voltage level of the power supply voltage VQ is lowered, the high level of the external read data DQ is so reduced that an external circuit receiving the read data DQ cannot correctly determine the high/low level. In order to eliminate the threshold voltage loss in the MOS transistor OBb, the level conversion circuit OBa generates a signal of the high voltage Vpp level in accordance with the internal read data D (level conversion of the internal read data). Thus, the output circuit OB outputs the read data DQ of the power supply voltage VQ level to an exterior, enabling correct data reading.

This structure including the n-channel MOS transistors OBb and OBc as MOS transistors for charging/discharging an output node in the output circuit OB shown in FIG. 56 is widely employed in a highly integrated semiconductor memory device, in view of prevention of a latch-up phenomenon and reduction of an occupation area due to reduction of an area for P-N isolation.

FIG. 57 schematically illustrates the structure of the Vpp generation circuit PG shown in FIG. 53, along with a circuit block which is supplied with the high voltage Vpp.

Referring to FIG. 57, the Vpp generation circuit PG includes a Vpp generator PGa generating the high voltage Vpp when activated, and a Vpp level detector PGb detecting the level of the high voltage Vpp and selectively activating the Vpp generator PGa in accordance with the result of detection. The Vpp generator PGa includes a clock signal generator generating a clock signal of a constant cycle, and a charge pump circuit generating the high voltage Vpp through a charge pump operation of a capacitor in accordance with the clock signal from the clock signal generator. The Vpp level detector PGb stops the high voltage generating operation of the Vpp generator PGa when the high voltage Vpp is in excess of a prescribed voltage level. In general, the Vpp level detector PGb selectively activates the Vpp generator PGa in accordance with a result of comparison of the high voltage Vpp with a prescribed reference voltage.

The high voltage Vpp from the Vpp generator PGa is supplied to a Vpp load NK1 included in the internal circuit NK. The Vpp load NK1 includes the Vpp utilization circuit NKa shown in FIG. 53 and the parasitic capacitance of a signal line through which the high voltage Vpp is transmitted.

In the semiconductor circuit device, it is necessary to quickly set an internal circuit in an operable state after the start of power-on. When the Vpp load NK1 has a large load, the Vpp generator PGa cannot drive the high voltage Vpp to the prescribed voltage level at a high speed after the start of power-on. Thus, the semiconductor circuit device cannot be set in an operable state at a faster timing in this case.

On the other hand, the Vpp level detector PGb must correctly detect the voltage level of the high voltage Vpp. If the voltage level of the high voltage Vpp is excessively high, the gate insulation film of the MOS transistor NQ is reduced in reliability. When the high voltage Vpp is at a low level, on the other hand, influence by threshold voltage loss of the MOS transistor NQ cannot be effectively eliminated.

FIG. 58 schematically illustrates the structure of a part of the semiconductor circuit device related to the high voltage Vpp, with the semiconductor circuit device being a semiconductor memory device. Referring to FIG. 58, the internal circuit NK includes a memory cell array NKb including a plurality of memory cells (see FIG. 55) arranged in rows and columns, a row selection circuit NKaa driving an addressed row of the memory cell array NKb to a selected state (high voltage Vpp level) using external power supply voltage VDD and the high voltage Vpp from the Vpp generation circuit PG, and the output circuit OB outputting the data of a selected memory cell of the memory cell array NKb to an exterior.

An output power supply voltage VDQ is supplied to the output circuit OB independently of the external power supply voltage VDD, so that fluctuation of the power supply voltage VDD in operation of the output circuit OB exerts no bad influence on the internal circuit operation and the output circuit OB stably operates even when the number of such output circuits OB is increased (multi-bit structure). The output circuit OB is also supplied with the high voltage Vpp from the Vpp generation circuit PG.

The voltage levels of the power supply voltages VDD and VDQ are set depending on a system including this semiconductor circuit device (semiconductor memory device). In SSTL_2 (operating in accordance with a signal nominally switched in the range of 0 V to 2.5 V) in SSTL (stab series terminated logic) for transmitting a small amplitude signal at a high speed, for example, standards of classes I and II are settled so that the voltage level of the output power supply voltage VDQ is decided in accordance with each standard and the voltage level of a permissable minimum output voltage (external read voltage) is decided accordingly.

The power supply voltage VDD, which is employed for the internal circuit operation, is merely required to be higher than the output power supply voltage VDQ. When the voltage levels of the power supply voltages VDD and VDQ are different from each other, therefore, the output circuit OB cannot be supplied with an optimized high voltage Vpp. Particularly when the voltage level of the output power supply voltage VDQ is varied with a different standard, the level of the high voltage Vpp must also be adjusted. In the conventional structure, however, the high voltage Vpp is generated in accordance with the power supply voltage VDD for the internal circuit operation which is independent of the output power supply voltage VDQ, and hence the high voltage Vpp for the output circuit OB cannot be optimized. Further, no optimum high voltage Vpp can be generated for each standard.

SUMMARY OF THE INVENTION

An object of the present invention is to provide a semiconductor circuit device which can stably generate an internal voltage of a desired voltage level at a high speed.

Another object of the present invention is to provide a semiconductor circuit device which can bring an internal voltage to a desired voltage level at a high speed in power on.

Still another object of the present invention is to provide a semiconductor circuit device which can correctly detect the level of an internal voltage for stably generating a reference voltage of a desired voltage level.

A further object of the present invention is to provide a semiconductor circuit device which can readily cope with a plurality of standards of output supply voltages with a single chip.

A semiconductor circuit device according to a first aspect of the present invention includes internal voltage generation circuitry generating an internal voltage of a prescribed voltage level in activation thereof, internal voltage level detection circuitry for detecting the level of the internal voltage of the prescribed voltage level in activation thereof and selectively activating the internal voltage generation circuitry in accordance with the result of the detection, an internal circuit using the internal voltage, and initialization circuitry for forcibly activating the internal voltage level detection circuitry for a prescribed period in power-on for applying a power supply voltage to a first power supply node.

A semiconductor circuit device according to a second aspect of the present invention includes an internal voltage generation circuit for generating an internal voltage of a prescribed level and an internal voltage level detection circuit for detecting the voltage level of the internal voltage. The internal voltage level detection circuit includes a first conductivity type first insulated gate field effect transistor connected between a first power supply node and a second node for receiving a voltage corresponding to the internal voltage on its gate, a first conductivity type second insulated gate field effect transistor connected between the first node and a second node for receiving a reference voltage on its gate, a first conductivity type third insulated gate field effect transistor connected between the second node and a third node for receiving the voltage of the first node on its gate, and a current stage connected between the second and third nodes and a second power supply node for feeding a current between the second and third nodes and the second power supply node.

A semiconductor circuit device according to a third aspect of the present invention includes a first conductivity type first insulated gate field effect transistor connected between first and second nodes for receiving a first signal on its gate, a first conductivity type second insulated gate field effect transistor connected between the first node and a third node for receiving a second signal on its gate, a first conductivity type third insulated gate field effect transistor is connected between the second node and a fourth node connected to a prescribed voltage source supplying a prescribed voltage with its gate connected to the second node, a first conductivity type fourth insulated gate field effect transistor connected between the third and fourth nodes with its gate connected to the second node, and an output stage outputting a signal indicating a result of comparison of the voltage levels of the first and second signals in accordance with the voltages of the second and third nodes.

A semiconductor circuit device according to a fourth aspect of the present invention includes circuitry generating an internal voltage from the voltage of a power supply node, comparing the internal voltage with a reference voltage and activating the internal voltage generation circuitry in accordance with the result of the comparison, and reference voltage switching circuitry selecting a comparison voltage generated on the basis of the voltage of a power supply node for a prescribed time from the start of application of a power supply voltage to the power supply node as the reference voltage and selecting a voltage corresponding to an internal power supply voltage generated from the voltage of the power supply node after a lapse of the prescribed time as the reference voltage. The reference voltage switching circuitry includes a circuit for determining whether or not the internal power supply voltage has reached a prescribed level on the basis of the voltage level of the power supply node and a selection circuit switching the reference voltage in accordance with an output signal of the determination circuit.

A semiconductor circuit device according to a fifth aspect of the present invention includes circuitry receiving a main clock signal of a constant cycle for generating first, second and third control clock signals synchronized with the main clock signal, a first capacitive element receiving the first control clock signal and transmitting the same to its output node, a second capacitive element receiving the second control clock signal and transmitting the received control clock signal to its output node, a third capacitive element receiving the third control clock signal and transmitting the received third control clock signal to its output node, a first precharge element connected between a power supply node and the output node of the first capacitive element for precharging the output node of the first capacitive element at a prescribed voltage, a second precharge element precharging the output node of the third capacitive element at the voltage level of the power supply node in response to the signal voltage of the output node of the first capacitive element, a third precharge element precharging the output node of the second capacitive element at the voltage level of the power supply node in response to the signal voltage of the output node of the first capacitive element, an output element transmitting the signal voltage of the output node of the third capacitive element to an internal voltage output node in response to the signal voltage of the output node of the second capacitive element, and a clamp element clamping the voltage level of the output node of the first capacitive element at a prescribed voltage level in conduction thereof.

It is possible to activate the internal voltage generation circuitry having relatively large current drivability by forcibly activating the internal voltage level detection circuitry detecting the level of the internal voltage generated by the selectively activated internal voltage generation circuitry for a prescribed period in power-on, thereby generating the internal voltage of a prescribed voltage level at a high speed.

Further, it is possible to stabilize the internal voltage at a high speed in response to the reference voltage by generating the reference voltage determining the level of the internal voltage on the basis of an external power supply voltage immediately after the start of power-on.

In addition, it is possible to correctly determine whether or not the internal voltage has reached a desired voltage level with reference to a stable voltage level by detecting the level of the generated internal voltage on the basis of the level of the external power supply voltage serving as the generation source therefor.

Further, it is possible to drive the insulated gate field effect transistors in substantially identical operating regions for forming a signal responsive to the difference between the internal voltage and the reference voltage thereby enabling correct internal voltage level detection by comparing the internal voltage with the reference voltage with only the same conductivity type insulated gate field effect transistors.

When the output circuit and the internal circuit are supplied with power supply voltages independent of each other, the power supply voltage for the output circuit can be set at an optimum value responsive to the externally supplied power supply voltage and an internal voltage of an optimum level can be generated in response to the level of the externally supplied power supply voltage by generating the internal voltage in response to the respective power supply voltages, thereby coping with interface standards of a plurality of power supply voltages with a single chip.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

[Overall Structure]

Figure 1:
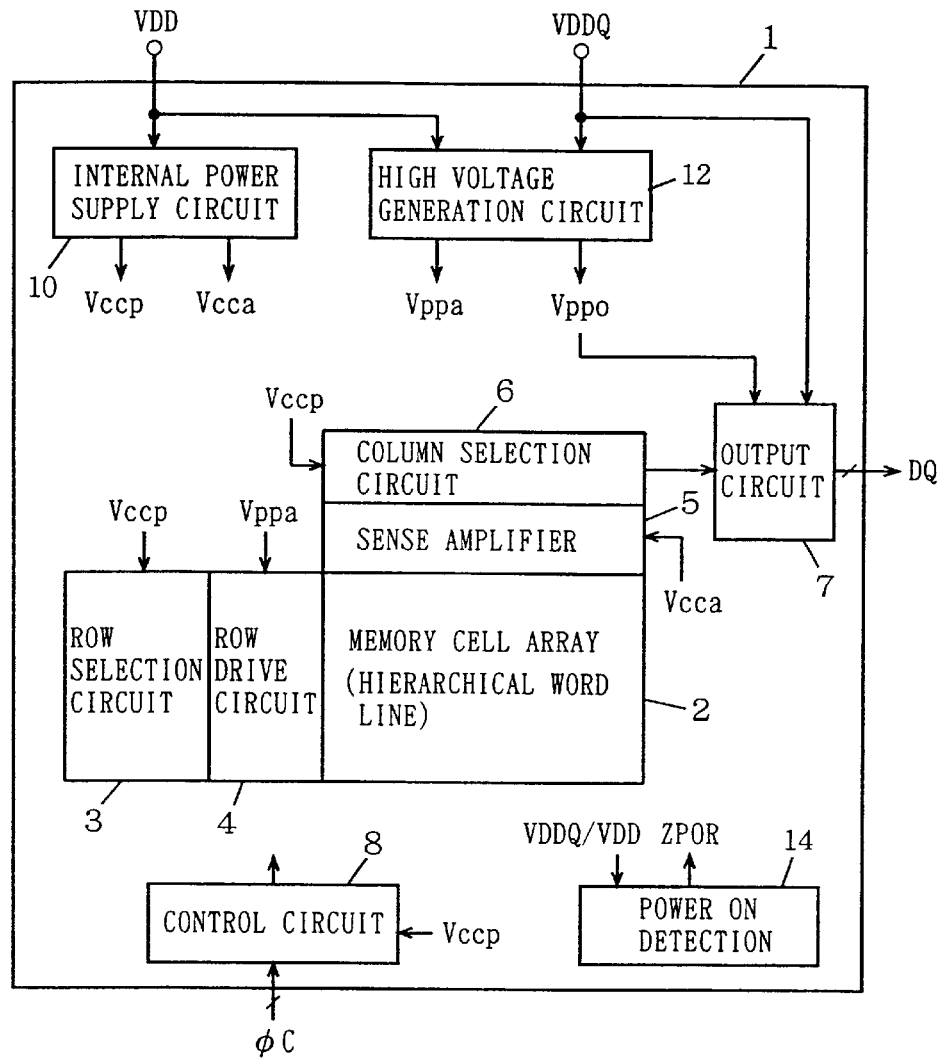
FIG. 1 schematically illustrates the overall structure of a semiconductor circuit device to which the present invention is applied.

FIG. 1 schematically illustrates the overall structure of a semiconductor circuit device according to an embodiment 1 of the present invention. With reference to FIG. 1, the following description is made on the assumption that the semiconductor circuit device is a semiconductor memory device 1.

Referring to FIG. 1, the semiconductor memory device 1 includes a memory cell array 2 having a plurality of memory cells arrayed in rows and columns and having a hierarchical word line structure, a row selection circuit 3 for selecting a row of the memory cell array 2 in accordance with a row address signal from an address buffer (not shown), a row drive circuit 4 driving a word line (sub and main word lines) corresponding to the selected row of the memory cell array 2 in accordance with a row selection signal from the row selection circuit 3, a sense amplifier 5 sensing, amplifying and latching data of memory cells connected to the selected row (sub word line), a column selection circuit 6 selecting a column of the memory cell array 2 in accordance with a column address signal from the address buffer (not shown), and an output circuit 7 reading data of the memory cell selected by the column selection circuit 6 to an exterior.

The semiconductor memory device 1 further includes an internal power supply circuit 10 for down-converting an external power supply voltage (device power supply voltage) VDD and generating internal power supply voltages Vccp and Vcca, a high voltage generation circuit 12 for generating an array high voltage Vppa and an output high voltage Vppo in accordance with the device power supply voltage VDD and the output power supply voltage Vppo, and a power on detection circuit 14 for detecting that the device power supply voltage VDD and/or the output power supply voltage VDDQ is supplied. A control circuit 8 receiving a control signal φC from the exterior controls internal operations of the semiconductor memory device 1. The control circuit 8 generates various internal control signals.

The internal power supply circuit 10 down-converts the device power supply voltage VDD and generates the power supply voltage (peripheral power supply voltage) Vccp supplied to the row selection circuit 3, the column selection circuit 6 and the control circuit 8 while generating the power supply voltage (sense amplifier power supply voltage) Vcca for the sense amplifier 5 and a read/write circuit (circuit for reading/writing data from/in the selected memory cell) (not shown). The peripheral power supply voltage Vccp and the sense amplifier power supply voltage Vcca may be at the same voltage level, or the former, Vccp, may be set at a higher level than the latter, Vcca.

When the peripheral power supply voltage Vccp is higher than the sense amplifier power supply voltage Vcca, a peripheral circuit can be driven at a high speed, and application of a high voltage to the memory cells in the memory cell array 2 can be prevented. When the peripheral power supply voltage Vccp and the sense amplifier power supply voltage Vcca are at the same voltage level, on the other hand, it is possible to supply a current with large driving ability with respect to a current (bit line charge/discharge current) largely flowing in operation of the sense amplifier 5 to stably hold the sense amplifier power supply voltage Vcca by separately generating the sense amplifier power supply voltage Vcca.

High-speed responsibility is not so required to the sense amplifier power supply voltage Vcca as compared to the peripheral power supply voltage Vccp. This is because the peripheral power supply voltage Vccp must respond at a high speed for providing a correct high/low level in order to decide the logical level of an internal signal while memory cell data can be stably latched even if the sense amplifier power supply voltage Vcca is returned to its original state at relatively slow responsibility in sensing, amplification and latching memory cell data. A voltage down-converter can be optimized in response to the response/operation characteristics.

The high voltage generation circuit 12 generates the array high voltage Vppa and the output high voltage Vppo supplied to the row drive circuit 4 and the output circuit 7 respectively in accordance with the device power supply voltage VDD and the output power supply voltage VDDQ. While the high voltage generation circuit 12 has various high voltage generation manners as described later in detail, it is simply described here that the high voltage Vppa (array high voltage transmitted onto any word line) is generated from the device power supply voltage VDD and the output high voltage Vppo is generated from the output power supply voltage VDDQ.

When the device power supply voltage VDD and/or the output power supply voltage VDDQ is supplied (powered on) the power on detection circuit 14 holds a power on detection signal ZPOR at a low level of an active state for a prescribed period, for preventing an internal circuit from operating with an instable power supply voltage. This power on detection circuit 14 may be so structured as to detect the supply (power-on) of the output power supply voltage VDDQ from the exterior for stopping the operation of the output circuit 7 upon supply (power-on) of the output external power supply voltage VDDQ.

Figure 2:
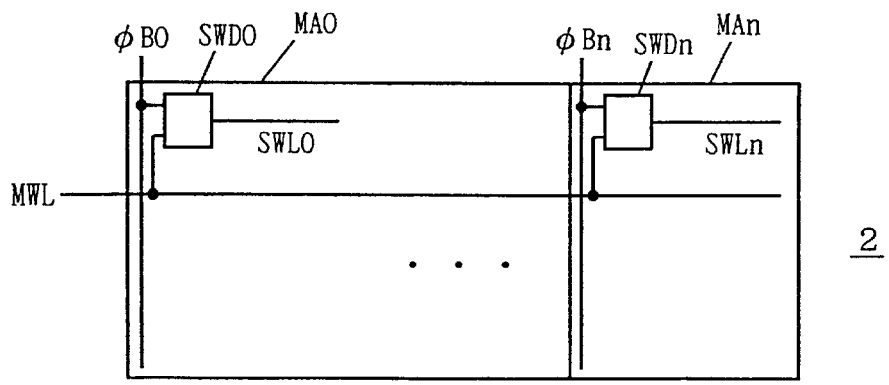
FIG. 2 schematically illustrates the structure of a memory cell array shown in FIG. 1.

FIG. 2 schematically illustrates the structure of the memory cell array 2 shown in FIG. 1. Referring to FIG. 2, the memory cell array 2 is split into a plurality of array blocks MA0 to MAn along the row direction. Each of the array blocks MA0 to MAn includes a plurality of memory cells (dynamic memory cells) arrayed in rows and columns. A main word line MWL is arranged in common to these array blocks MA0 to MAn. Sub word lines SWL0 to SWLn are arranged in the respective array blocks MA0 to Man in correspondence to the main word line MWL. A plurality of sub word lines may be arranged in each array block in correspondence to a single main word line MWL. A row of memory cells in each of the array blocks MA0 to MAn are connected to each of the corresponding sub word lines SWL0 to SWLn.

Sub word line drivers SWD0 to SWDn responsive to a signal potential on the main word line MWL and block selection signals φB0 to φBn respectively are provided between the main word line MWL and the respective sub word lines SWL0 to SWLn. The sub word line drivers SWD0 to SWDn drive the corresponding sub word lines SWL0 to SWLn to selected states when the main word line MWL is in a selected state and the corresponding block selection signals φB0 to φBn are also in selected states. The sub word line drivers SWD0 to SWDn drive the corresponding sub word lines SWL0 to SWLn to the level of the array high voltage Vppa from the high voltage generation circuit 12 when selected.

When selected, the main word line MWL is driven to the ground voltage level or the level of the array high voltage Vppa. This voltage level is decided by the structure of the sub word line drivers SWD0 to SWDn. In the embodiment 1 of the present invention, the sub word line drivers SWD0 to SWDn have functions of invertors, so that the main word line MWL is driven to the ground voltage when selected while held at the level of the array high voltage Vppa when not selected.

Figure 3:
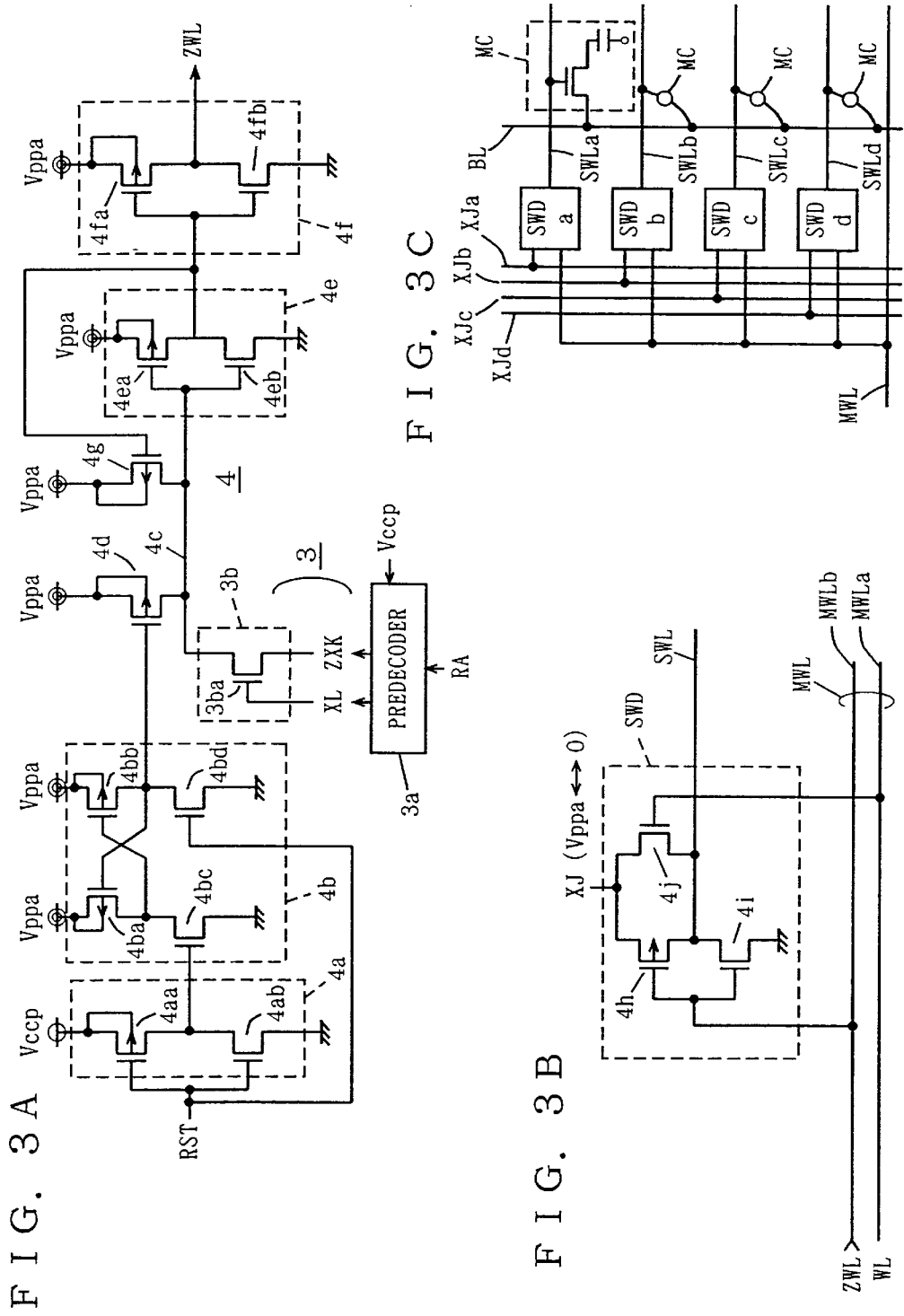
FIGS. 3A to 3C illustrate the structures of a row drive circuit and word lines shown in FIG. 1.

FIG. 3A illustrates the structures of the row selection circuit 3 and the row drive circuit 4 shown in FIG. 1. This figure representatively shows the structures of parts related to a single main word line MWL.

Referring to FIG. 3A, the row selection circuit 3 includes a predecoder 3a for predecoding a row address signal RA supplied from the address buffer (not shown) and outputting predecode signals XL and ZXK, and a decode circuit 3b provided in correspondence to each main word line MWL for further decoding the predecode signals XL and ZXK from the predecoder 3a. The predecode signals XL and ZXK outputted from the predecoder 3a have the amplitude of the peripheral power supply voltage Vccp. The row decode circuit 3b includes an n-channel MOS transistor 3ba for transmitting the predecode signal ZXK onto a row selection signal line 4c in accordance with the predecode signal XL.

The row drive circuit 4 includes a CMOS invertor or inventors 4a operating using the peripheral power supply voltage Vccp as one operating power supply voltage to invert a reset signal RST, a level conversion circuit 4b for converting the amplitude of an output signal of the CMOS invertor 4a to the level of the array high voltage Vppa, a precharge element 4d formed by a p-channel-MOS transistor for selectively precharging the row selection signal line 4a at the level of the array high voltage Vppa in accordance with an output signal of the level conversion circuit 4b, a CMOS invertor 4e for inverting a signal on the row selection signal line 4c, a CMOS invertor 4f for inverting an output signal of the CMOS invertor 4e to generate a main word line drive signal ZWL, and a voltage holding element 4g formed by a p-channel MOS transistor for holding the row selection signal line 4c at the level of the array high voltage Vppa in accordance with the output signal of the CMOS invertor 4e.

The CMOS invertor 4a includes a p-channel MOS transistor 4aa and an n-channel MOS transistor 4ab. The level conversion circuit 4b includes a pair of p-channel MOS transistors 4ba and 4bb having sources connected to a supply node for the array high voltage Vppa and cross-coupled gates and drains, an n-channel MOS transistor 4bc for discharging the gate of the p-channel MOS transistor 4bb to the ground voltage level in accordance with the output signal of the CMOS invertor 4a, and an n-channel MOS transistor 4bd for discharging the gate of the n-channel MOS transistor 4ba to the ground voltage level in accordance with the reset signal RST.

The CMOS invertor 4e includes a p-channel MOS transistor 4ea and an n-channel MOS transistor 4eb, and operates using the array high voltage Vppa as one operating power supply voltage. The CMOS invertor 4f includes a p-channel MOS transistor 4fa and an n-channel MOS transistor 4fb, and operates using the array high voltage Vppa as one operating power supply voltage. Operations of the row selection circuit 3 and the row drive circuit 4 shown in FIG. 3A are now briefly described.

In a standby state, the reset signal RST is at a high level and the output signal of the CMOS invertor 4a is at a low level of the ground voltage level. In the level conversion circuit 4b, the MOS transistors 4bb and 4bc are in ON and OFF states respectively. Therefore, the gate of the p-channel MOS transistor 4ba is discharged to the ground voltage level so that the MOS transistor 4ba enters an ON state, and the gate voltage of the p-channel MOS transistor 4bb reaches the level of the array high voltage Vppa so that the MOS transistor 4bb is in an OFF state. In accordance with a low-level signal of the ground voltage level from the level conversion circuit 4b, the precharge element 4d is in an ON state for precharging the row selection signal line 4c at the level of the array high voltage Vppa.

The output signal from the CMOS invertor 4e is at the ground voltage level, and the voltage holding element 4g enters an ON state in response, to transmit the array high voltage Vppa to the row selection signal line 4c. The CMOS invertor 4f inverts the signal from the CMOS invertor 4e and outputs the main word line drive signal ZWL of the array high voltage Vppa level. In the standby state, therefore, the main word line MWL is held at the array high voltage Vppa level.

When a memory cycle (active cycle) starts, the reset signal RST goes low and the output signal of the CMOS invertor 4a reaches the peripheral power supply voltage Vccp level. In the level conversion circuit 4b, the MOS transistor 4bc enters an ON state for discharging the gate of the p-channel MOS transistor 4bb to the ground voltage level and shifting the MOS transistor 4bb to an ON state. The MOS transistor 4bd enters an OFF state in accordance with the reset signal RST of a low level, and the output signal of the level conversion circuit 4b increases in level to the array high voltage Vppa level. When the output signal of the level conversion circuit 4b reaches the array high voltage Vppa level, the MOS transistor 4ba enters an OFF state and the gate of the MOS transistor 4bb is held at the ground voltage level. In accordance with a high-level (array high voltage Vppa level) signal from the level conversion circuit 4b, the precharge element 4d enters an OFF state.

Due to the start of the memory cycle (active cycle), the predecoder 3a is activated to predecode the supplied row address signal RA, for driving the predecode signals XL and ZXK to high or low levels in accordance with the result of predecoding. When the corresponding main word line MWL is addressed, the predecode signal XL goes high to the peripheral power supply voltage Vccp level, while the predecode signal ZXK goes low. The row decode circuit 3b decodes these predecode signals XL and ZXK, and drives the row selection signal line 4c in accordance with the results of decoding. When the corresponding main word line MWL is addressed and selected, the n-channel MOS transistor 3ba enters an ON state in the row decode circuit 3b, for driving the row selection signal line 4c to the ground voltage level (the predecode signal ZXK is at the ground voltage level). When the voltage level of the row selection signal line 4c is reduced, the output signal of the CMOS invertor 3e increases in level to the array high voltage Vppa level, the voltage holding element 4g enters an OFF state, and the row selection signal line 4c is stably driven to the ground voltage level in accordance with the predecode signal ZXK. The CMOS invertor 4f inverts a high-level signal from the CMOS invertor 4e, and the main word line drive signal ZWL reaches the ground voltage level.

When the corresponding main word line MWL is in a non-selected state, on the other hand, the predecode signal XL is at a low level or the predecode signal ZXK is at a high level. When the predecode signal XL is at a low level, the MOS transistor 3ba of the row decode signal 3b is in an OFF state, and the row selection signal line 4c holds the level of the array high voltage Vppa by a latch circuit of the CMOS invertor 4e and the voltage holding element 4g. When both of the predecode signals XL and ZXK are at high levels, the row decode circuit 3b transmits a high-level signal of the peripheral power supply voltage Vccp level to the row selection signal line 4c. The voltage holding element 4g holds the row selection signal line 4c at the array high voltage Vppa level, whereby the main word line drive signal ZWL holds the level of the array high voltage Vppa also in this case. When both of the predecode signals XL and ZXK are at high levels, the n-channel MOS transistor 3ba receiving a signal of the peripheral power supply voltage Vccp level on its gate, operates as a decoupling transistor for preventing the predecoder 3a from transmitting the array high voltage Vppa.

When the memory cycle is completed, the reset signal RST is driven to a high level and the row selection signal line 4c is set at the array power supply voltage Vppa level.

The reset signal RST is held at a high level of the peripheral power supply voltage Vccp level during the standby state, and held at the ground voltage level during the active cycle. The control circuit 8 shown in FIG. 1 outputs this reset signal RST.

FIG. 3B illustrates the structure of any of the sub word line drivers SWD0 to SWDn shown in FIG. 2. This figure representatively shows a sub word line driver SWD provided in correspondence to a sub word line SWL. Referring to FIG. 3B, the main word line MWL includes a pair of main word lines MWLa and MWLb transmitting complementary main word line drive signals ZWL and WL. The main word line drive signal ZWL from the row drive circuit 4 shown in FIG. 3A is transmitted onto the main word line MWLb.

The sub word line driver SWD includes a p-channel MOS transistor 4h which conducts, when the main word line drive signal ZWL on the main word line MWLb is at a low level (ground voltage level), for transmitting a predecode signal XJ onto the sub word line SWL, an n-channel MOS transistor 4i which enters an ON state, when the main word line drive signal ZWL on the main word line MWLb is at a high level, for driving the sub word line SWL to the ground voltage level, and an n-channel MOS transistor 4j which conducts, when the main word line drive signal WL on the main word line MWLa is at a high level, for transmitting the predecode signal XJ to the sub word line SWL. The predecode signal XJ, which is obtained by further level-converting the predecode signal outputted from the predecoder 3a shown in FIG. 3A, has the amplitude of the array high voltage Vppa. The operation of the sub word line driver SWD shown in FIG. 3B is now briefly described.

When the main word line drive signal ZWL is at a high level, the MOS transistors 4h and 4i are in OFF and ON states respectively, and the sub word line SWL is held at the ground voltage level. In this state, the main word line drive signal WL on the main word line MWLa is at a low level, and the MOS transistor 4j is in an OFF state.

When the main word line drive signal ZWL is driven to a low level, the MOS transistor 4i enters an OFF state. On the other hand, the main word line drive signal WL on the main word line MWLa goes high, and the MOS transistor 4j enters an ON state. When the predecode signal XJ is at a high level of the array high voltage Vppa level, the p-channel MOS transistor 4h enters an ON state, to transmit a signal of the array high voltage Vppa level onto the sub word line SWL for driving the selected sub word line SWL to the array high voltage Vppa level. When the predecode signal XJ is at a low level of the ground voltage level, on the other hand, the p-channel MOS transistor 4h enters an OFF state so that the predecode signal XJ of the ground voltage level is transmitted to the sub word line SWL through the n-channel MOS transistor 4j and the sub word line SWL maintains a non-selected state. The n-channel MOS transistor 4j is provided to prevent the sub word line SWL from entering a floating state due to MOS transistors 4h and 4i entering OFF states when the main word line MWL is selected and the predecode signal XJ is at a low level of a non-selected state. Therefore, the main word line drive signal WL transmitted onto the main word line MWLa may have the amplitude of not the array power supply voltage Vppa but the peripheral power supply voltage Vccp.

FIG. 3C depicts the function of the predecode signal XJ. As shown in FIG. 3C, a plurality of (four in FIG. 3C) sub word lines SWLa to SWLd are provided for one main word line MWL. Sub word line drivers SWDa to SWDd are provided for the sub word lines SWLa to SWLd respectively. These sub word lines SWDa to SWDd are supplied with predecode signals XJa to XJd respectively. The sub word line drivers SWDa to SWDd receive a signal on the main word line MWL in common.

Memory cells MC are arranged at crossings between the sub word lines SWLa to SWLd and a bit line BL respectively. Each memory cell MC has a one transistor/one capacitor structure.

One of the predecode signals XJa to XJd is driven to a selected state in the active cycle. When the main word line MWL is selected, therefore, one of the sub word lines SWLa to SWLd is driven to a selected state in accordance with any of the predecode signals XJa to XJd. Only one main word line drive circuit may be provided for the four sub word lines SWLa to SWLd, and such main word line drive circuits can be arranged with sufficient margin. When sub word line drivers such as the sub word line drivers SWDa to SWDd are alternately provided on both sides of the memory cell array 2 and shared between the memory cell array 2 and an adjacent array, not only pitch conditions for the main word line drive circuits but also those for sub word line drive circuits can be relaxed.

[Structure of High Voltage Generation Circuit]

Figure 4:
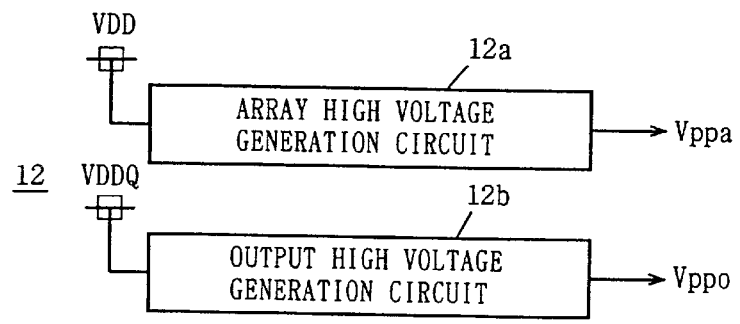
FIG. 4 schematically illustrates the structure of a high voltage generation circuit shown in FIG. 1.

FIG. 4 schematically illustrates the structure of the high voltage generation circuit 12 shown in FIG. 1. Referring to FIG. 4, the high voltage generation circuit 12 includes an array high voltage generation circuit 12a generating the array high voltage Vppa on the basis of the device power supply voltage VDD and an output high voltage generation circuit 12b generating the output high voltage Vppo on the basis of the output power supply voltage VDDQ. The array high voltage generation circuit 12a and the output high voltage generation circuit 12b are identical in internal structure to each other. In the following description, the array high voltage generation circuit 12a and the output high voltage generation circuit 12b are represented by one Vpp generation circuit 20. Further, the generated high voltages Vppa and Vppo are also described as a high voltage Vpp. In the following description, therefore, the high voltage Vpp includes both of the array high voltage Vppa and the output high voltage Vppo, unless otherwise stated.

In addition, the power supply voltages VDD and VDDQ are indicated as a power supply voltage EXVD supplied from an exterior. Therefore, the external power supply voltage EXVD may be either the device power supply voltage VDD or the output power supply voltage VDDQ, unless otherwise stated.

Figure 5:
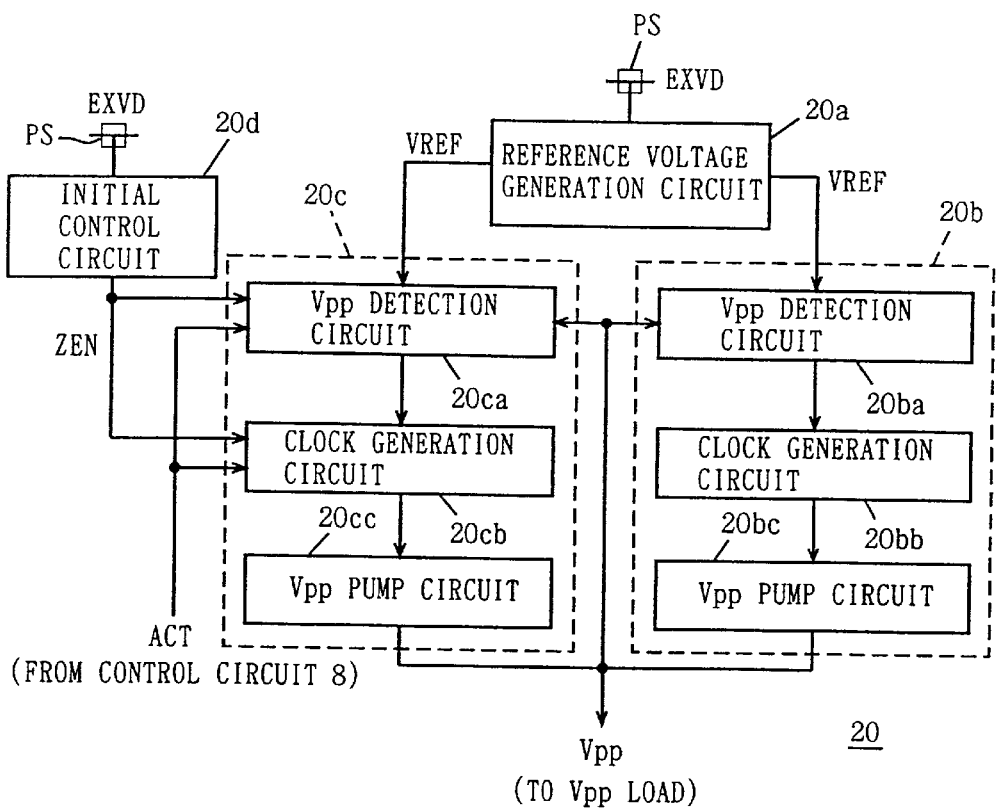
FIG. 5 illustrates a more specific structure of the high voltage generation circuit shown in FIG. 4.

FIG. 5 schematically illustrates the structure of the Vpp generation circuit 20. Referring to FIG. 5, the Vpp generation circuit 20 includes a reference voltage generation circuit 20a generating a reference voltage VREF of a prescribed voltage level from the external power supply voltage EXVD, a standby high voltage generation circuit 20b regularly operating after the start of power on for generating the high voltage Vpp, an active high voltage generation circuit 20c selectively brought into an active state in activation of activation signals ACT and ZEN for generating the high voltage Vpp, and an initial control circuit 20d bringing the activation signal ZEN into an active state for a prescribed period in supply (power-on) of the external power supply voltage EXVD for forcibly making the active high voltage generation circuit 20c perform a high voltage generating operation.

The standby high voltage generation circuit 20b includes a Vpp detection circuit 20ba for detecting the voltage level of the high voltage Vpp on the basis of the reference voltage VREF, a clock generation circuit 20bb selectively activated in response to a level detection signal from the Vpp detection circuit 20ba for generating a clock signal, and a Vpp pump circuit 20bc performing a charge pump operation in accordance with the clock signal from the clock generation circuit 20bb for generating the high voltage Vpp.

The Vpp detection circuit 20ba regularly detects whether or not the level of the high voltage Vpp is above a prescribed voltage level in accordance with the difference between the high voltage Vpp and the reference voltage VREF. When a voltage level detection signal from the Vpp detection circuit 20ba indicates that the high voltage Vpp is beyond the prescribed voltage level, the clock generation circuit 20bb is brought into an inactive state to stop the clock generating operation. When the voltage level detection signal from the Vpp detection circuit 20ba indicates that the high voltage Vpp is lower than the prescribed voltage level, on the other hand, the clock generation circuit 20bb is activated to generate the clock signal. The Vpp pump circuit 20bc performs the charge pump operation through a capacitive element in accordance with the clock signal from the clock generation circuit 20bb, to generate the high voltage Vpp.

The standby high voltage generation circuit 20b regularly operates after the start of power on, to prevent the level of the high voltage Vpp in the standby state from being reduced by a leakage current or the like. Therefore, the charge suppliability of the Vpp pump circuit 20bc is made sufficiently small, to reduce current consumption in the standby cycle.

The active high voltage generation circuit 20c includes a Vpp detection circuit 20ca which is activated in activation of either the activation signal ZEN from the initial control circuit 20d or the activation signal ACT from the control circuit 8 for detecting the level of the high voltage Vpp, a clock generation circuit 20cb which is selectively activated in response to the voltage level detection signal from the Vpp detection circuit 20ca and the activation signals ZEN and ACT for generating a clock signal, and a Vpp pump circuit 20cc performing a charge pump operation in accordance with the clock signal from the clock generation circuit 20cb to generate the high voltage Vpp.

The active high voltage generation circuit 20c is activated in operation of a circuit (Vpp load) using the high voltage Vpp, and performs the charge pump operation when the voltage level of the high voltage Vpp is reduced due to voltage consumption, for returning the high voltage Vpp to the prescribed voltage level.

When the activation signal ACT indicates an active state of a circuit (RAS circuit) related to a row selecting operation, for example, the predecoder 3a performs a predecode operation for transmitting the high voltage Vpp (Vppa) onto a selected sub word line SWL. At this time, the voltage level of the output signal from the level conversion circuit 4b shown in FIG. 3A changes from a low level to a high level, thereby consuming the high voltage Vpp (Vppa). When the Vpp load is the output circuit 7, the activation signal ACT is driven to an active state during a data read period, to prevent the voltage level reduction of the high voltage Vpp (Vppo) resulting from consumption thereof in data output. Therefore, the charge suppliability of the Vpp pump circuit 20cc of the active high voltage generation circuit 20c is made sufficiently large.

The initial control circuit 20d, the structure of which is described later in detail, forcibly activates the Vpp detection circuit 20ca and the clock generation circuit 20cb until the high voltage Vpp reaches a stable voltage level upon power supply (power-on). Thus, the active high voltage generation circuit 20c having large charge suppliability generates the high voltage Vpp after the start of power supply, whereby the high voltage Vpp is driven to a stable state at a high speed after the start of power on, so that the semiconductor memory device can be set in an operable state at a faster timing after the start of power supply.

Structure 1 of Initial Control Circuit

Figure 6:
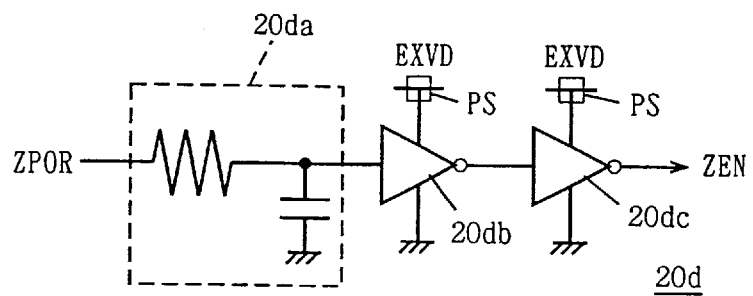
FIG. 6 illustrates a first structure of an initial control circuit shown in FIG. 5.

FIG. 6 illustrates a first structure of the initial control circuit 20d shown in FIG. 5. Referring to FIG. 6, the initial control circuit 20d includes an RC delay circuit 20da for delaying the power on detection signal ZPOR from the power on detection circuit 14 shown in FIG. 1, an invertor 20db inverting an output signal of the RC delay circuit 20da, and an invertor 20dc inverting an output signal of the invertor 20db and outputting the forcible activation signal ZEN. The invertors 20db and 20dc operate using the external power supply voltage EXVD at power supply nodes PS as one operating power supply voltage. The RC delay circuit 20da including a resistor and a capacitor, slows down the rise speed of the power on detection signal ZPOR. The operation of the initial control circuit 20d shown n FIG. 6 is now described with reference to a signal waveform diagram shown in FIG. 7.

Figure 7:
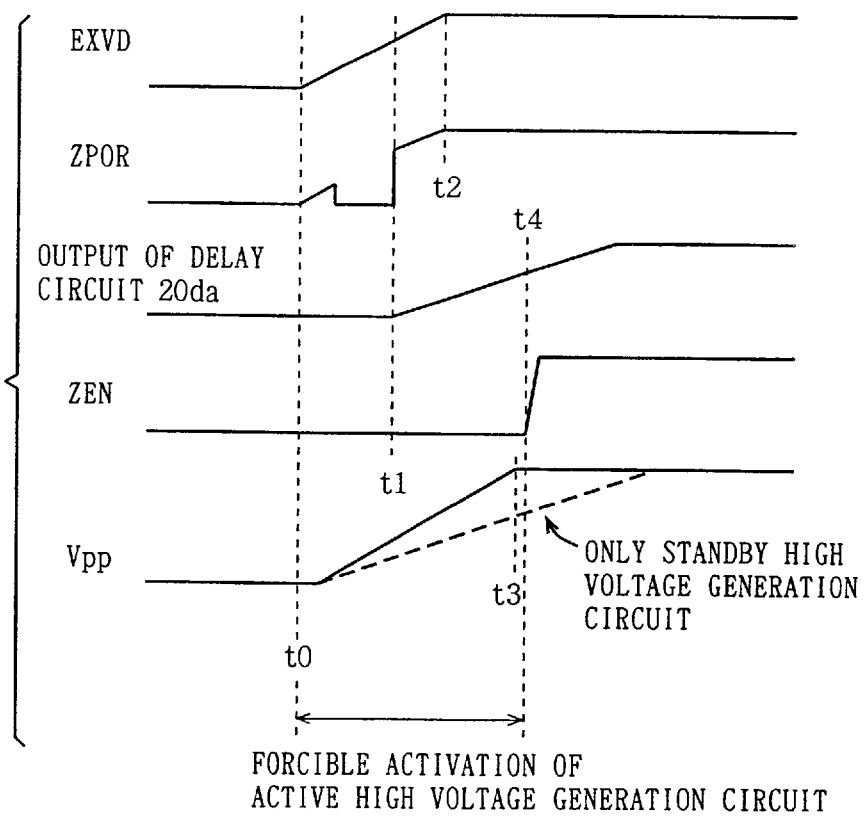
FIG. 7 is a signal waveform diagram representing an operation of the initial control circuit shown in FIG. 6.

Power is supplied at a time t0, to increase the voltage level of the external power supply voltage EXVD. In this supply of power, the power on detection signal ZPOR holds a low level for a prescribed time. While FIG. 7 illustrates such a state that the power on detection signal ZPOR slightly increases in accordance with the external power supply voltage EXVD immediately after the start of power on, this is logically at a low level and exerts no influence on the circuit operation.

The RC delay circuit 20da slowing down the rise speed of the power on detection signal ZPOR, outputs a low-level signal while the power on detection signal ZPOR is at a low level. The invertor 20db inverts the output signal of the RC delay circuit 20da, its output voltage level increases in accordance with the external power supply voltage EXVD, and the invertor 20dc inverts the output signal of the invertor 20db. Therefore, the forcible activation signal ZEB maintains an active state of a low level. The Vpp detection circuit 20ca and the clock generation circuit 20cb shown in FIG. 5 are brought into active states during this period.

The Vpp detection circuit 20ca detects the voltage level of the high voltage Vpp. Upon (the start of) power supply, the high voltage Vpp is at a low level, the clock generation circuit 20cb is activated, and the Vpp pump circuit 20cc performs a charge pump operation for increasing the voltage level of the high voltage Vpp at a high speed with large charge suppliability.

When the external power supply voltage EXVD reaches a prescribed voltage level at a time t1, the power on detection signal ZPOR rises to a high level (the voltage level of the external power supply voltage EXVD). Then, the external power supply voltage EXVD reaches a prescribed voltage level at a time t2, and is stabilized at this voltage level.

In response to the rise of the power on detection signal ZPOR at the time t1, the output signal of the RC delay circuit 20*da* slowly increases in level at a time constant determined by the resistor and the capacitor. At this time, the forcible activation signal ZEN is still in an active state of a low level, and the voltage level of the high voltage Vpp increases and reaches a prescribed voltage level at a time t3. When the high voltage Vpp reaches the prescribed voltage level, the Vpp detection circuit 20*ca* outputs a signal for stopping the clock generating operation to the clock generation circuit 20*cb*, the high voltage generating operation is stopped, and the high voltage Vpp is stabilized at the prescribed voltage level.

At a time t4, the output signal of the RC delay circuit 20*da* exceeds the input logic threshold voltage of the invertor 20*db*, the forcible activation signal ZEN goes high in response and is inactivated, and the Vpp detection circuit 20*ca* and the clock generation circuit 20*cb* are inactivated. After inactivation of the forcible activation signal ZEN, the Vpp detection circuit 20*ca* and the clock generation circuit 20*cb* are selectively activated/inactivated in response to activation/inactivation of the internal circuit activation signal ACT.

As shown in FIG. 6, it is possible to bring the high voltage Vpp to the prescribed voltage level at a high speed by forcibly driving the active high voltage generation circuit 20*c* having large charge suppliability for a prescribed time after the start of power supply for generating the high voltage Vpp.

Therefore, it is possible to bring the high voltage Vpp to the prescribed voltage level at a faster timing as compared with the case of generating the high voltage Vpp with only the standby high voltage generation circuit 20*b* as shown by a broken line in FIG. 7. The activation period for the forcible activation signal ZEN is only required to at least have a time width required for bringing the high voltage Vpp to the prescribed voltage level.

In the structure shown in FIG. 6, the RC delay circuit 20*da* may be omitted. A structure for simply activating the forcible activation signal ZEN in accordance with the power on detection signal ZPOR may be employed. When the Vpp circuit 20*cc* having large charge suppliability is driven for a prescribed period in initialization of the device, the voltage level rising speed of the high voltage Vpp is higher than that in the case of employing only the standby high voltage generation circuit 20*b*, and it is possible to bring the high voltage Vpp to the prescribed voltage level at a faster timing as compared with the case of employing only the standby high voltage generation circuit 20*b*.

Figure 8:
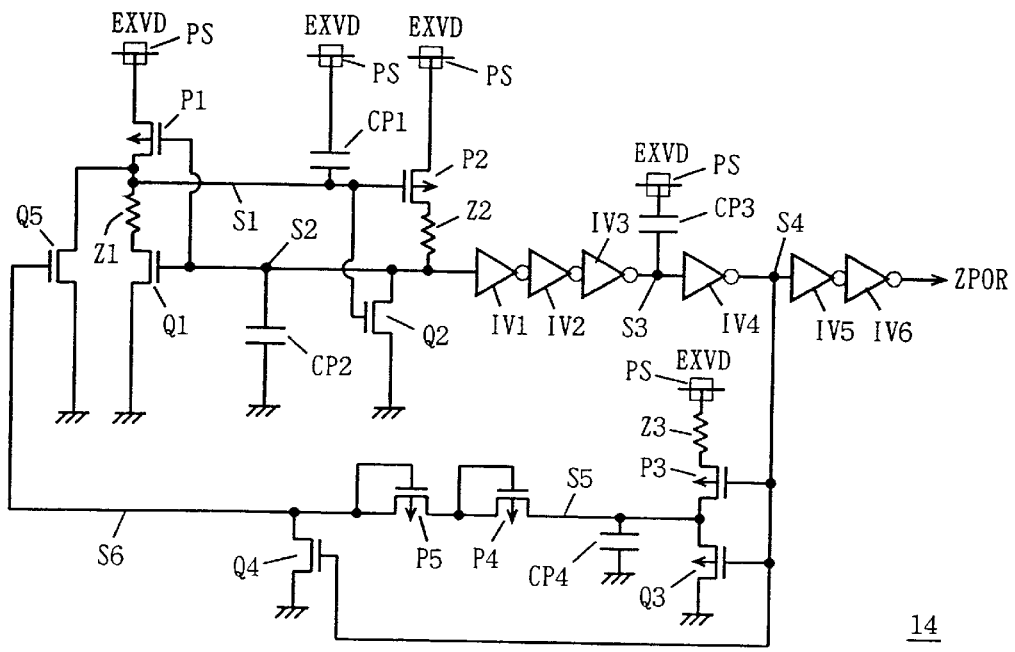
FIG. 8 illustrates an exemplary structure of a power on detection circuit shown in FIG. 1.

FIG. 8 illustrates an exemplary structure of the power on detection circuit 14 shown in FIG. 1. Referring to FIG. 8, the power on detection circuit 14 includes a p-channel MOS transistor P1 connected between a node S1 and a power supply node PS receiving the external power supply voltage EXVD with its gate connected to a node S2, a resistive element Z1 having a first end connected to the node S1, an n-channel MOS transistor Q1 connected between a second end of the resistive element Z1 and a ground node with its gate connected to the node S2, a coupling capacitive element CP1 connected between a power supply node PS and the node S1, an n-channel MOS transistor Q2 connected between the node S2 and a ground node with its gate connected to the node S1, and a p-channel MOS transistor P2 and a resistive element Z2 serially connected between a power supply node PS and the node S2. The gate of the p-channel MOS transistor P2 is connected to the node S1. A capacitive element CP2 for stabilizing the voltage level of the node S2 is provided between the node S2 and a ground node.

The power on detection circuit 14 further includes three stages of cascaded invertors IV1, IV2 and IV3 receiving and inverting a signal on the node S2 for transmission to a node S3, a coupling capacitive element CP3 connected between the node S3 and a power supply node PS, an invertor IV4 inverting a signal potential on the node S3 for transmission to a node S4, and two-stages of cascaded invertors IV5 and IV6 outputting the power on detection signal ZPOR in accordance with a signal potential on the node S4.

The power on detection circuit 14 further includes a p-channel MOS transistor P3 and a resistive element Z3 which are serially connected between a power supply node PS and a node S5. The gate of the p-channel MOS transistor P3 is connected to the node S4.

Figure 9:
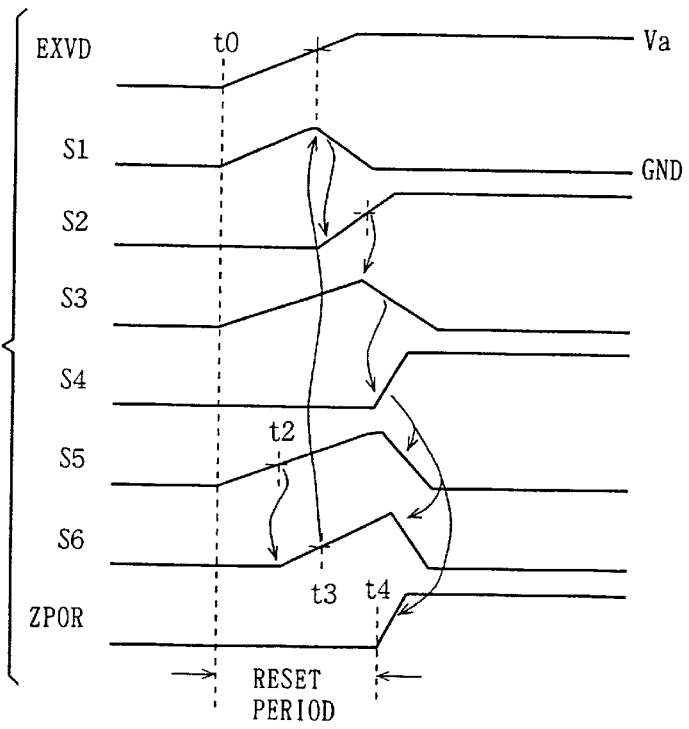
FIG. 9 is a signal waveform diagram representing an operation of the power on detection circuit shown in FIG. 8.

The power on detection circuit 14 further includes an n-channel MOS transistor Q3 connected between a node S5 and a ground node with its node connected to the node S4, a capacitive element CP4 connected between the node S5 and a ground node, p-channel MOS transistors P4 and P5 serially connected between the node S5 and a node S6, an n-channel MOS transistor Q4 connected between the node S6 and a ground node with its gate connected to the node S4, and an n-channel MOS transistor Q5 connected between the node S1 and a ground node with its gate connected to the node S6. Each of the p-channel MOS transistors P4 and P5 has the gate and drain thereof connected with each other and serves as a voltage drop element. The operation of the power on detection circuit 14 shown in FIG. 8 is now described with reference to an operation waveform diagram shown in FIG. 9.

Power is supplied on at a time t0, to increase the voltage level of the external power on voltage EXVD at the power supply node PS. In response to this power on, the voltage level of the node S1 increases due to capacitive coupling of the capacitive element CP1, the n-channel MOS transistor Q2 shifts to a conducting state, and the p-channel MOS transistor P2 enters an OFF state. The node S2 is held at the ground voltage level due to the transition of the n-channel MOS transistor Q2 to the conducting state. The invertors IV1 to IV3 increase the voltage level of the node S3 in accordance with the increase of the voltage level of the external power supply voltage EXVD. The voltage level of the node S3 is initialized at a high level upon power on due to capacitive coupling of the capacitive element C3, whereby a signal outputted at the node S4 goes low by the invertor IV4, and the power on detection signal ZPOR holds a low level.

While the node S4 is at a low level, the p-channel MOS transistor P3 is in a conducting state and the voltage of the node S5 slowly increases in accordance with the time constant of the resistive element Z3 and the capacitive element CP4.

When the voltage level of the node S5 exceeds the threshold voltage of the MOS transistors P4 and P5 at a time t2, both of the MOS transistors P4 and P5 enter conducting states, and the voltage level of the node S6 starts to increase.

When the voltage level of the node S6 exceeds the threshold voltage of the MOS transistor Q5 at a time t3, the MOS transistor Q5 conducts to discharge the node S1 to a low level of the ground voltage level.

The external power supply voltage EXVD exceeds a prescribed voltage level at a time t3.

Following the reduction of the voltage level of the node S1, the n-channel MOS transistor Q2 enters an OFF state, while the p-channel MOS transistor P2 conducts so that the voltage level of the node S2 increases in accordance with a time constant determined by the resistive element Z2 and the capacitive element CP2. The p-channel MOS transistor P1 enters a non-conducting state in accordance with the increase of the voltage level of the node S2, and the node S1 is reliably discharged to a low level of the ground voltage level through the MOS transistor Q5.

The MOS transistor Q2 enters a non-conducting state in accordance with reduction of the voltage level of the node S1, and the voltage level of the node S2 increases in accordance with the increase of the voltage level of the external power supply voltage EXVD. When the voltage level of the node S2 exceeds the input logic threshold voltage of the invertor IV1, the three stages of invertors IV1 to IV3 reduce the voltage level of the node S3, and the voltage level of the node S4 receiving an output signal of the invertor IV4 increases in response. In accordance with this increase of the voltage level of the node S4, the power on detection signal ZPOR rises to a high level at a time t4 through the invertors IV5 and IV6.

When the voltage level of the node S4 increases, the p-channel MOS transistor P3 enters an OFF state, while the n-channel MOS transistors Q3 and Q4 conduct, the nodes S5 and S6 are discharged to the ground voltage level, and the MOS transistor Q5 enters an OFF state. Thus, the MOS transistor Q1 conducts in accordance with the increase of the voltage level of the node S2, and the node S1 is held at a low level of the ground voltage level. Due to a loop of the MOS transistors P2 and Q1 and the resistive elements Z1 and Z2, the node S2 is held at a high level corresponding to the voltage level of the external power supply voltage EXVD, and the power on detection signal ZPOR is also held at a high level in response. Between the time t0 when power is first supplied and the time t4 when the power on detection signal ZPOR rises to a high level, the power on detection signal ZPOR remains at a low level, to initialize (reset) the internal nodes. The power on detection signal ZPOR enters an inactive state of a high level when the external power supply voltage EXVD reaches a prescribed or constant voltage level and is stabilized. While at least the power on detection signal ZPOR is in an active state of a low level, the forcible activation signal ZEN is activated and the active high voltage generation circuit 20c is also activated for generating the high voltage Vpp and driving the high voltage Vpp to a prescribed voltage level at a high speed.

It is possible to readily forcibly activate the active high voltage generation circuit 20c for a prescribed period after the start of power supply by employing the power on detection signal ZPOR employed for initializing the internal nodes upon power on, thereby generating the high voltage Vpp through its large charge suppliability.

Structure 2 of Initial Control Circuit

Figure 10A:
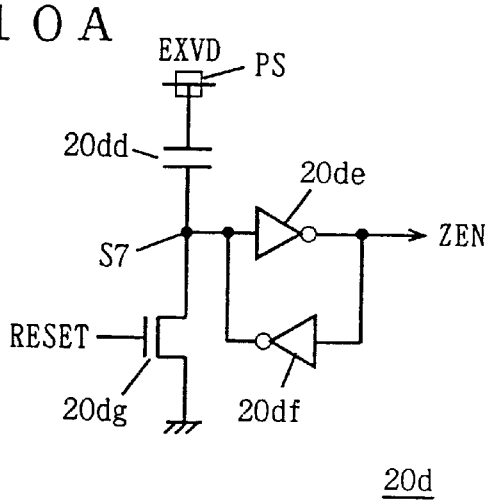
FIG. 10A illustrates a second structure of the initial control circuit shown in FIG. 5.
Figure 10B:
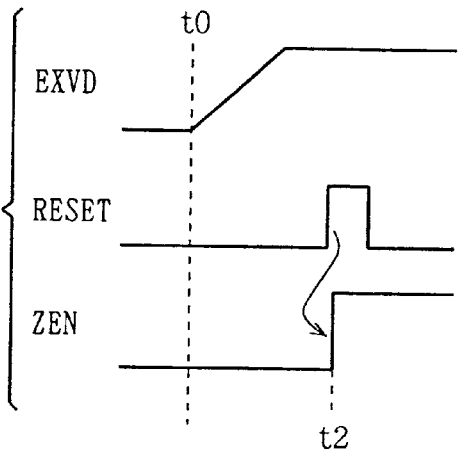
FIG. 10B is a signal waveform diagram representing the operation of the initial control circuit shown in FIG. 10A.

FIG. 10A illustrates a second structure of the initial control circuit 20d shown in FIG. 5. Referring to FIG. 10A, the initial control circuit 20d includes a capacitive element 20dd connected between a power supply node PS and a node S7, an invertor 20de inverting a signal potential on the node S7 to output the forcible activation signal ZEN, an invertor 20df inverting the forcible activation signal ZEN for transmission to the node S7, and an n-channel MOS transistor 20dg driving the node S7 to the ground voltage level in response to a reset signal RESET. The invertors 20de and 20df operate using the external power supply voltage EXVD as one operating power supply voltage respectively, and form a latch circuit. The operation of the initial control circuit 20d shown in FIG. 10A is now described with reference to a signal waveform diagram shown in FIG. 10B.

Before power on, the reset signal RESET is at a low level, and the MOS transistor 20dg is in an OFF state. Power is first supplied at a time t0, to increase the voltage level of the external power supply voltage EXVD at the power supply node PS. The voltage increase of the power supply node PS is transmitted to the node S7 through the capacitive element 20dd, whereby the voltage level of the node S7 also increases in response. The invertor 20de inverts the signal voltage of the node S7, whereby the forcible activation signal ZEN maintains an active state of a low level. The invertor 20df inverts the forcible activation signal ZEN for transmission to the node S7. Therefore, the voltage level of the node S7 increases following the voltage level increase of the external power supply voltage EXVD through the invertor 20df and the capacitive element 20dd.

After a lapse of a prescribed period, the reset signal RESET is driven to a high level of an active state and the MOS transistor 20dg enters an ON state to drive the node S7 to the ground voltage level, whereby the forcible activation signal ZEN goes high in response at a time t2. The invertors 20de and 20df latch the high-level forcible activation signal ZEN. Between the times t0 and t2, the forcible activation signal ZEN is in an active state of a low level, and the active high voltage generation circuit 20c generates the high voltage Vpp.

The reset signal RESET is driven to an active state of a high level in response to a signal brought into a high level after a lapse of a prescribed period from the power on or the internal circuit activation signal ACT generated in a dummy cycle carried out for reliably setting the internal circuit into an initial state.

(Modification)

Figure 11:
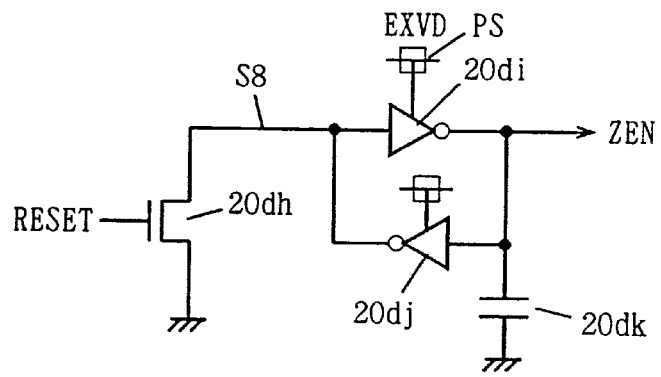
FIG. 11 schematically illustrates a modification of the initial control circuit shown in FIG. 10A.

FIG. 11 illustrates a modification of the second structure of the initial control circuit 20d. Referring to FIG. 11, the initial control circuit 20d includes an n-channel MOS transistor 20dh connected between a ground node and a node S8 and receiving the reset signal RESET on its gate, an invertor 20di inverting a signal of the node S8 and outputting the forcible activation signal ZEN, an invertor 20dj inverting the forcible activation signal ZEN for transmission to the node S8, and a capacitive element 20dk connected between an input node of the invertor 20dj (output node of the invertor 20di) and a ground node. The invertors 20di and 20dj operate using the external power supply voltage EXVD as one operating power supply voltage, and form a latch circuit.

In the structure shown in FIG. 11, the output load of the invertor 20di is larger than that of the invertor 20dj, due to the capacitive element 20dk. When the voltage level of the external power on voltage EXVD increases after the start of power supply, therefore, the voltage level of an output signal of the invertor 20dj increases more quickly than that of an output signal of the invertor 20di (the invertor 20di must charge the capacitive element 20dk) in accordance with the voltage level increase of the external power supply voltage EXVD, even if the voltage levels of input nodes of the invertors 20di and 20dj are at the ground voltage level in an initial state (immediately after the start of power supply). Therefore, the invertors 20*di* and 20*dj* are set in a latch state for holding the forcible activation signal ZEN at a low level in power on. When a prescribed time elapses or an internal circuit operation is performed, the reset signal RESET goes high, the MOS transistor 20*dh* enters an ON state, the node S8 is driven to the ground voltage level, and the forcible activation signal ZEN is driven to a high level in response. Thereafter the invertors 20*di* and 20*dj* hold the forcible activation signal ZEN at the high level.

In the structure shown in FIG. 11, the capacitive element 20*dk* may be replaced with a resistive element of high resistance. In this case, the forcible activation signal ZEN can be held in an active state of a low level in the start of power supply, although a small current regularly flows through the resistive element.

Structure 3 of Initial Control Circuit

Figure 12:
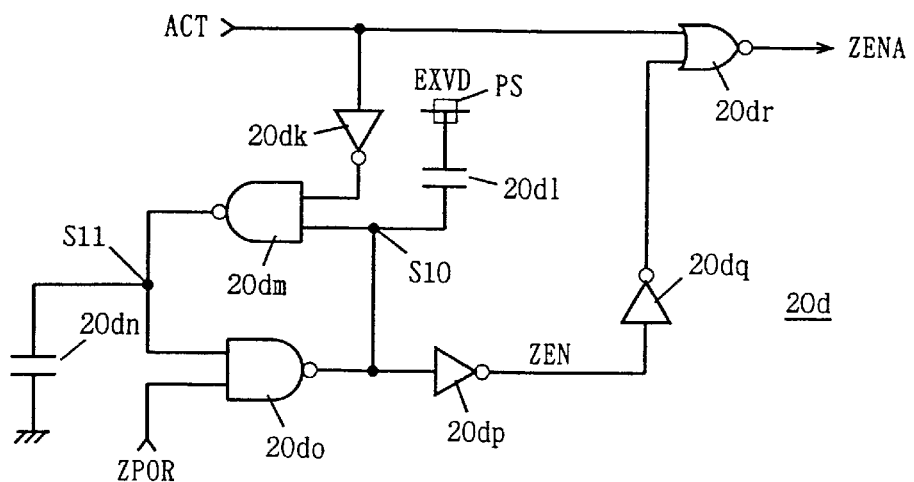
FIG. 12 illustrates a third structure of the initial control circuit shown in FIG. 5.

FIG. 12 illustrates a third structure of the initial control circuit 20*d* shown in FIG. 5. Referring to FIG. 12, the initial control circuit 20*d* includes an invertor 20*dk* receiving the internal circuit activation signal ACT, a capacitive element 20*dl* connected between a power supply node PS and a node S10, a NAND circuit 20*dm* receiving an output signal of the invertor 20*dk* and a signal voltage on the node S10, a capacitive element 20*dn* connected between an output node S11 of the NAND circuit 20*dm* and a ground node, a NAND circuit 20*do* receiving an output signal on node S11 supplied from NAND circuit 20*dm* S11 and the power on detection signal ZPOR, an invertor 20*dp* inverting an output signal of the NAND circuit 20*do* and generating the forcible activation signal ZEN, an invertor 20*dq* inverting the forcible activation signal ZEN outputted from the invertor 20*dp*, and a NOR circuit 20*dr* receiving an output signal of the invertor 20*dq* and the internal circuit activation signal ACT and outputting a high voltage generating operation activation signal ZENA.

Figure 13:
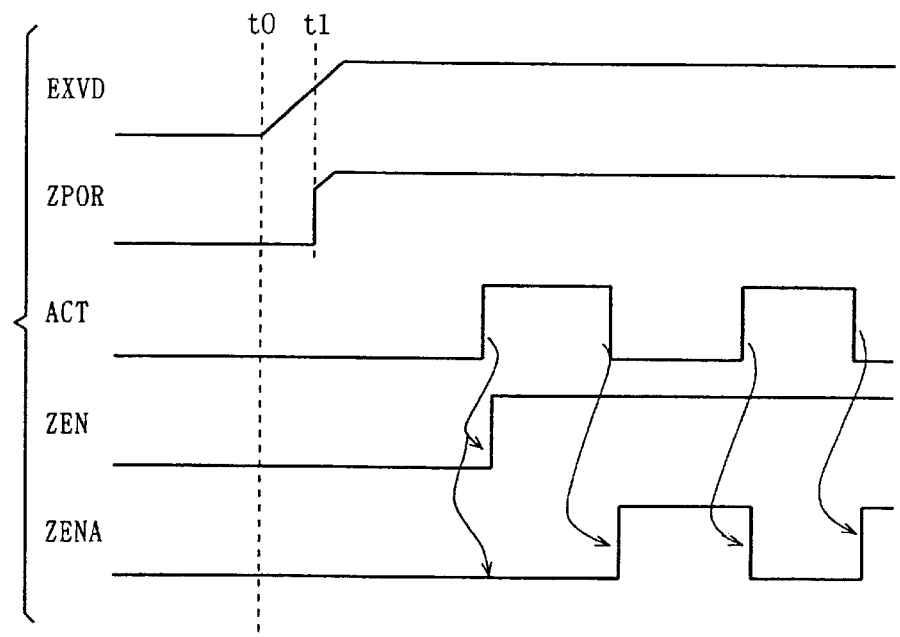
FIG. 13 is a signal waveform diagram representing an operation of the circuit shown in FIG. 12.

The output of the NAND circuit 20*do* is connected to the node S10. All these circuit elements operate using the external power supply voltage EXVD supplied to the power supply node PS as one operating power supply voltage. The internal circuit activation signal ACT is set at a high level of an active state during a period when the circuit utilizing the high voltage Vpp operates. The operation of the initial control circuit 20*d* shown in FIG. 12 is now described with reference to a signal waveform diagram shown in FIG. 13.

Power is supplied at a time t0, and the voltage level of the external power supply voltage EXVD at the power supply node PS increases. In response to this power supply (power-on), the capacitive element 20*dl* pulls up the voltage of the node S10 to a high level, while the capacitive element 20*dn* holds the voltage of the node S11 at a low level. Immediately after the start of power supply, the internal circuit activation signal ACT is at a low level, and the output signal of the invertor 20*dk* is driven to a high level in accordance with increase of the voltage level of the external power supply voltage EXVD. Therefore, the output signal of the NAND circuit 20*do* goes high, and the forcible activation signal ZEN outputted from the invertor 20*dp* maintains an active state of a low level. The output signal of the invertor 20*dq* goes high in accordance with the voltage level increase of the external power supply voltage EXVD, and the high voltage generating operation activation signal ZENA from the NOR circuit 20*dr* is held in the active state of a low level.

When the external power supply voltage EXVD reaches a prescribed voltage level at a time t1, the power on detection signal ZPOR rises to a high level. The NAND circuit 20*do* operates as an invertor in response to the rise of the power on detection signal ZPOR. Further, the NAND circuit 20*dm* also operates as an invertor since the internal circuit activation signal ACT is at a low level and the output signal of the invertor 20*dk* is at a high level. Therefore, a latch circuit formed by the NAND circuits 20*dm* and 20*do* latches the voltage levels of the nodes S10 and S11, and the forcible activation signal ZEN from the invertor 20*dp* holds a low level.

After a lapse of a constant time, the internal circuit activation signal ACT is driven to a high level for carrying out a dummy cycle, for example. The dummy cycle is done to operate the internal circuitry a prescribed number of times for reliably setting the internal nodes in an initial state after the start of power supply. When the internal circuit activation signal ACT is driven to a high level, the output signal of the invertor 20*dk* goes low, and the output signal of the NAND circuit 20*dm* goes high in response. Signals on both inputs of the NAND circuit 20*do* go high together, so that the voltage level of the signal outputted from the NAND circuit 20*do* onto the node S10 goes low and the forcible activation signal ZEN from the invertor 20*dp* goes high in response. In this state, the high voltage generating operation activation signal ZENA is in an active state of a low level in accordance with the high level of the internal circuit activation signal ACT, and the active high voltage generation circuit 20*c* generates the high voltage Vpp.

When the internal circuit activation signal ACT falls to a low level, the output signal of the invertor 20*dk* rises to a high level. The output signal of the NAND circuit 20*do* is at a low level in this state, and hence the state of the forcible activation signal ZEN remains unchanged. The latch state of the latch circuit formed by the NAND circuits 20*do* and 20*dm* is reset due to activation of the internal circuit activation signal ACT, and the forcible activation signal ZEN is held in an inactive state of a high level. When the internal circuit activation signal ACT falls to a low level, both inputs of the NOR circuit 20*dr* go low, the high voltage generating operation activation signal ZENA goes low, and the active high voltage generation circuit 20*c* stops the high voltage generating operation.

Even if the internal circuit activation signal ACT is driven to a high level of an active state again, the state of the forcible activation signal ZEN remains unchanged and maintains an inactive state of a high level since the node S10 is held at the low level. On the other hand, the NOR circuit 20*dr* drives the high voltage generating operation activation signal ZENA to an active state of a low level in accordance with the activation of the internal circuit activation signal ACT. Thereafter the high voltage generating operation activation signal ZENA is activated in accordance with activation of the internal circuit activation signal ACT.

When the capacitive elements 20*dl* and 20*dn* are provided for the nodes S10 and S11 as in the structure shown in FIG. 12, the nodes S10 and S11 can be reliably driven to high and low levels respectively immediately after the start of power supply. Even if the power supply voltage EXVD changes at an extremely slow speed and the power on detection signal ZPOR changing in accordance with voltage increase of the external power supply voltage EXVD is not activated, the forcible activation signal ZEN can be reliably driven to an active state after the start of power supply.

Figure 14:
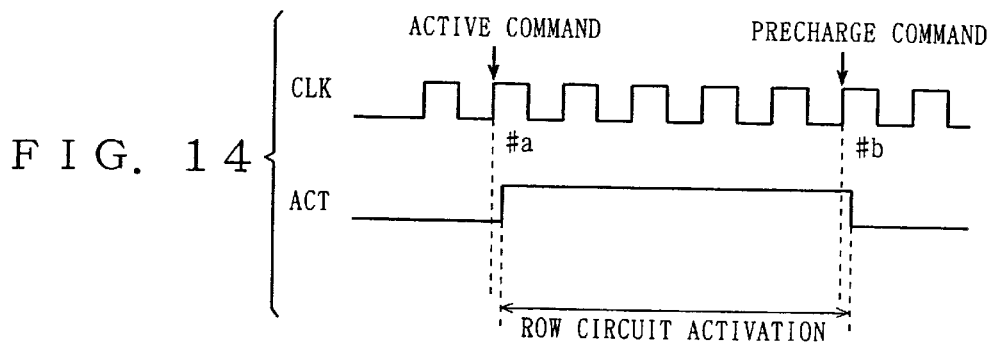
FIG. 14 illustrates a mode of generation of a control signal ACT shown in FIG. 12.

FIG. 14 illustrates a generation mode of the internal circuit activation signal ACT. Referring to FIG. 14, the internal circuit relates to row selection (row circuit). The row circuit includes the row selection circuit 3, the row drive circuit 4 and the sense amplifier 5 in the structure shown in FIG. 1.

When the semiconductor memory device is a synchronous semiconductor memory device operating in synchronization with the clock signal CLK, an operation mode instruction is supplied as a command. The command is supplied by a combination of the states of a plurality of external control signals (the combination may include an address signal bit). An active command is supplied to specify row selection in a cycle #a of the clock signal CLK. The row related circuit activation signal ACT is driven to an active state in accordance with the active command. A memory cell row is selected and the sense amplifier 5 performs sensing, amplification and latching in the interior. When an access operation to a memory cell is completed and a precharge command is supplied in a cycle #b of the clock signal CLK, the row related circuit activation signal ACT is driven to an inactive state of a low level. Thus, a word line (main/sub word line) in a selected state is driven to a non-selected state.

In activation of the row related circuit activation signal ACT, the row related drive circuit 4 consumes the array high voltage Vpp. Therefore, the active high voltage generation circuit 20c is activated in this period.

Figure 15A:
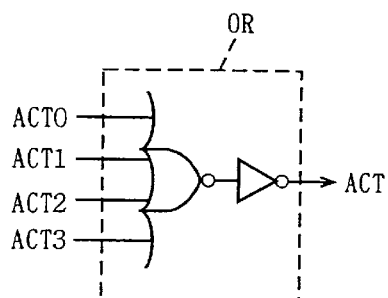
FIG. 15A schematically illustrates a bank structure of the semiconductor circuit device shown in FIG. 1.
Figure 15B:
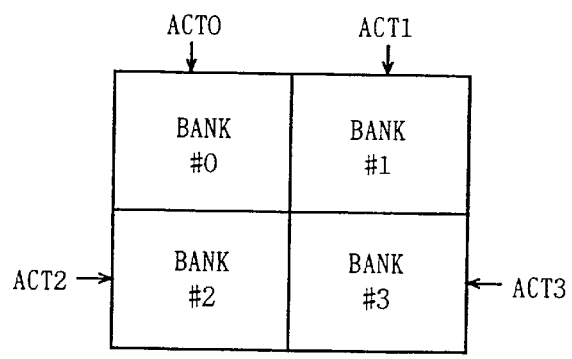
FIG. 15B illustrates a structure for generating control signals in case of the bank structure shown in FIG. 15.

When the semiconductor memory device includes four banks #0, #1, #2 and #3 as shown in FIG. 15B, an OR circuit OR ORes row related circuit activation signals ACT0 to ACT3 supplied to the banks #0 to #3 respectively to generate the internal circuit activation signal ACT supplied to the initial control circuit 20d shown in FIG. 12. The banks #0 to #3 can be driven to an active state (state that a row of the memory cell array 2 is selected) independently of each other. When the high voltage generation circuit 12 is provided in common for the banks #0 to #3, the high voltage generation circuit 12 can be forcibly driven to an active state in the start of power supply and the forcible activation signal ZEN can be reset in an inactive state in first activation of a bank using the structure shown in FIG. 15B. When the high voltage generation circuit 12 is provided for each of the banks #0 to #3, on the other hand, a structure of activating the high voltage generation circuit 12 in accordance with each of the row related circuit activation signals ACT0 to ACT3 corresponding to the banks #0 to #3 may be employed.

Figure 16:
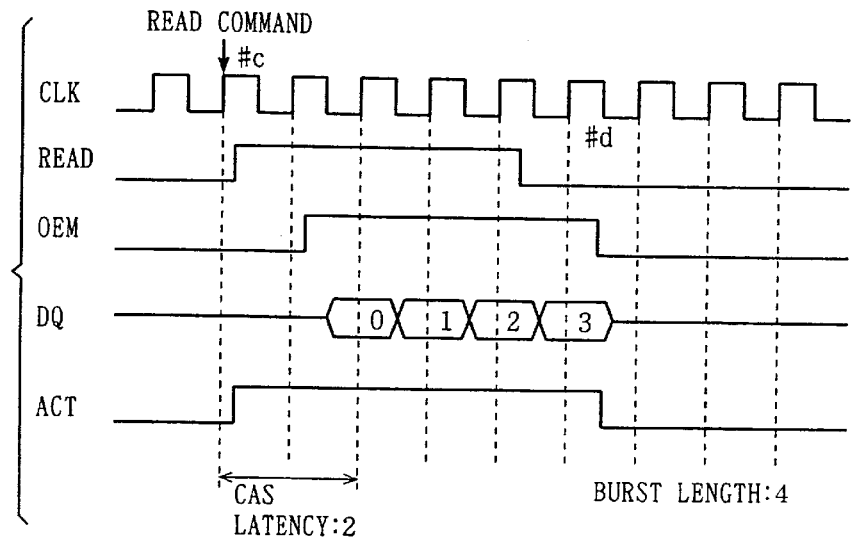
FIG. 16 illustrates a manner of generation of the activation control signal ACT shown in FIG. 12.

FIG. 16 is a timing chart representing a data read operation of the semiconductor memory device. When the semiconductor memory device is a clock synchronous semiconductor memory device, valid data is outputted after a lapse of a clock cycles called CAS latency after supply of a read command instructing data reading. When a read command is supplied in a cycle #c of the clock signal CLK as shown in FIG. 16 in this case, a read circuit activation signal READ is driven to an active state in CAS latency—two clock cycles. The CAS latency is 2 in FIG. 16, and hence the read activation signal READ is activated in the clock cycle #c. This read activation signal READ is driven to the active state for a period of a clock cycle number equal to a burst length. The burst length indicates the number of data continuously read when a single read command is supplied. When the read command is supplied, an output buffer enable signal OEM is driven to an active state of a high level for the burst length period after CAS latency—one clock cycle In accordance with the activation of the output buffer activation signal OEM, data read by a read circuit are supplied to an output buffer (output circuit) and successively read in synchronization with the clock signal CLK. When the final data (3) of the burst length is read in a clock cycle #d, the output buffer activation signal OEM enters an inactive state of a low level.

When the internal circuit is an output circuit for outputting the data to the exterior, therefore, a signal entering an active state for the period of activation of the read circuit activation signal READ and activation of the output buffer activation signal OEM may be generated and utilized as the internal circuit activation signal ACT. The read activation signal READ activates the column selection circuit 6 and a preamplifier for reading, amplifying and transferring data of the selected memory cell.

Therefore, an appropriate signal may be employed as the internal circuit activation signal ACT in coincidence with the operation characteristics of the circuit utilizing the high voltage Vpp.

Structure 4 of Initial Control Circuit

Figure 17:
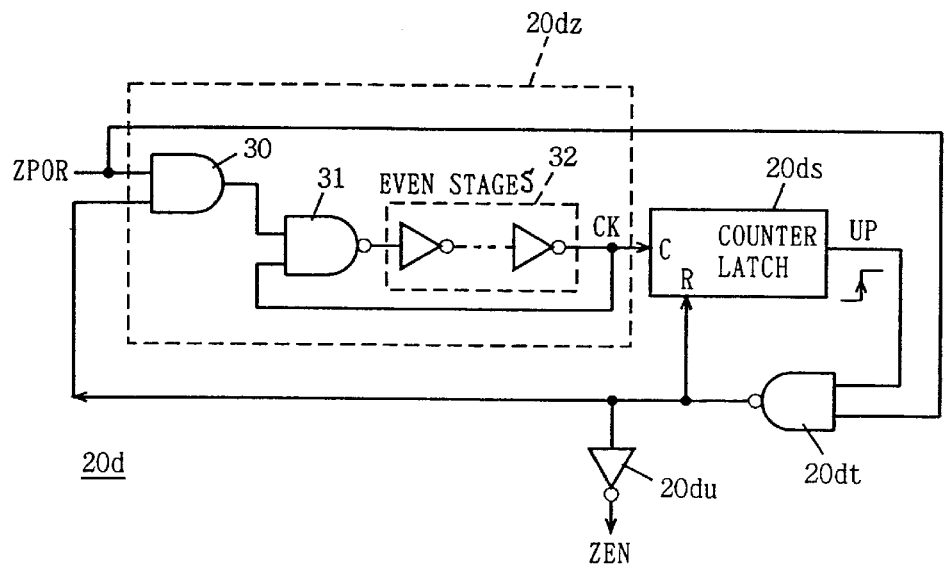
FIG. 17 schematically illustrates a fourth structure of the initial control circuit shown in FIG. 5.

FIG. 17 schematically illustrates a fourth structure of the initial control circuit 20d shown in FIG. 5. Referring to FIG. 17, the initial control circuit 20d includes an oscillation circuit 20dz oscillating in response to inactivation of the power on detection signal ZPOR and generating a clock signal CK, a counter latch 20ds counting the clock signal CK outputted from the oscillation circuit 20dz for outputting and latching a count-up instruction signal UP when the count reaches a prescribed value, a NAND circuit 20dt receiving the count-up instruction signal UP from the counter latch 20ds and the power on detection signal ZPOR, and an invertor 20du inverting an output signal of the NAND circuit 20dt and outputting the forcible activation signal ZEN. The output signal of the NAND circuit 20dt is also supplied to the oscillation circuit 20dz, to stop the oscillation of the oscillation circuit 20dz when the count-up instruction signal UP is generated (activated).

Figure 18:
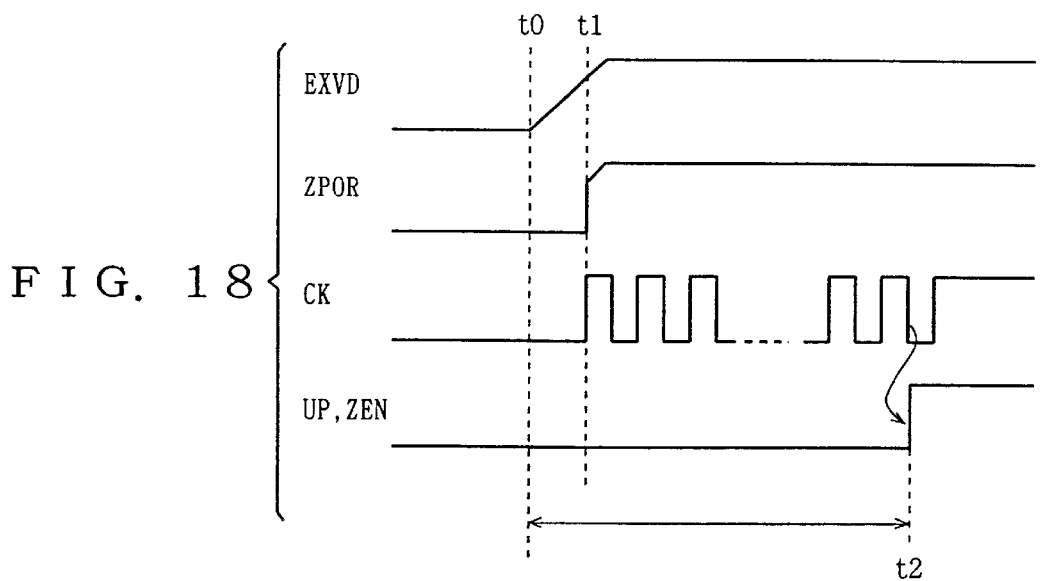
FIG. 18 is a signal waveform diagram representing an operation of the circuit shown in FIG. 17.

The oscillation circuit 20dz includes an AND circuit 30 receiving the power on detection signal ZPOR and the output signal of the NAND circuit 20dt, a NAND circuit 31 receiving an output signal of the AND circuit 30 in its one input, and an invertor train 32 including an even number of stages of cascaded invertors receiving an output signal of the NAND circuit 31. The invertor train 32 outputs the clock signal CK and supplies the same to the counter latch 20ds. The invertor train 32 also supplies the clock signal CK to another input of the NAND circuit 31. The operation of the initial control circuit 20d shown in FIG. 17 is now described with reference to a signal waveform diagram show in FIG. 18.

Power is first supplied at a time t0, to increase the voltage level of the external power supply voltage EXVD. At this time, the power on detection signal ZPOR is in an active state of a low level, the output signal of the AND circuit 30 is at a low level, the output signal of the NAND circuit 31 is fixed at a high level in response, and the oscillation circuit 20dz performs no oscillation. On the other hand, both inputs of the NAND circuit 20dt are at low levels in power on, and its output signal increases to a high level in accordance with the external power supply voltage EXVD, while the forcible activation signal ZEM maintains a low level.

When the external power supply voltage EXVD reaches a prescribed voltage level at a time t1, the power on detection signal ZPOR rises to a high level, and the output signal of the AND circuit 30 goes high. The NAND circuit 31 operates as an invertor in response, to form a ring oscillator along with the invertor train 32 including an even number of stages of invertors, and the oscillation circuit 20dz starts oscillating. The counter latch 20ds counts the clock signal CK from the oscillation circuit 20dz.

When the count value of the counter latch 20ds reaches a prescribed value at a time t2, the count-up instruction signal UP from the counter latch 20ds goes high and is latched. The power on detection signal ZPOR is at a high level, and the output signal of the NAND circuit 20dt goes low while the forcible activation signal ZEN goes high in response. In response to the fall of the voltage level of the output signal from the NAND circuit 20dt, the output signal of the AND circuit 30 goes low and the oscillation circuit 20dz stops oscillating. In the period from the power supply start till counting of the prescribed period by the counter latch 20ds, i.e., between the times t0 and t2, therefore, the forcible activation signal ZEN is held in an active state of a low level, and the active high voltage generation circuit 20c generates the high voltage Vpp.

Structure 5 of Initial Control Circuit

Figure 19A:
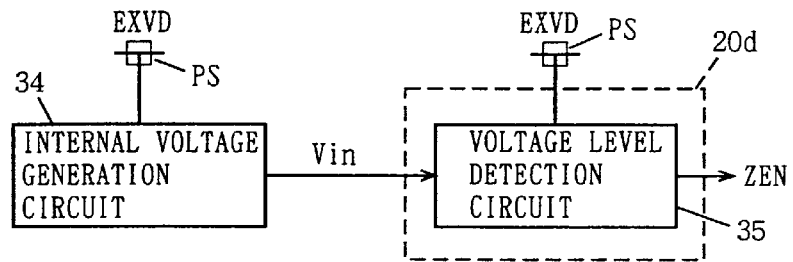
FIG. 19A schematically illustrates a fifth structure of the initial control circuit shown in FIG. 5.

FIG. 19A schematically illustrates a fifth structure of the initial control circuit 20d shown in FIG. 5. Referring to FIG. 19A, the initial control circuit 20d detects the voltage level of an internal voltage Vin from an internal voltage generation circuit 34 on the basis of the external power supply voltage EXVD supplied to a power supply node PS, and drives the forcible activation signal ZEN to an inactive state when the voltage level of the internal voltage Vin reaches a prescribed voltage level.

Figure 19B:
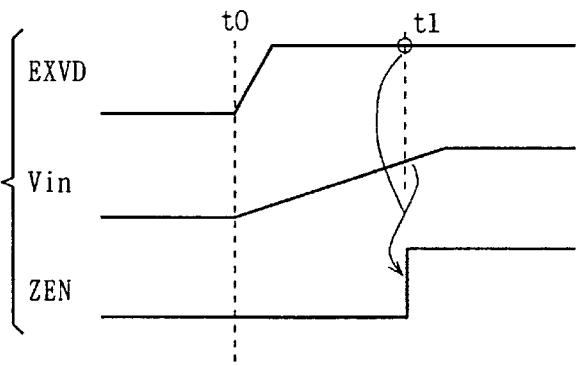
FIG. 19B is a signal waveform diagram representing an operation of the circuit shown in FIG. 19A.

The internal voltage generation circuit 34 generates the internal voltage Vin of the prescribed voltage level from the external power supply voltage EXVD supplied to the power supply node PS. The internal voltage Vin generated from the external power supply voltage EXVD may be any of a reference voltage, an internal power supply voltage and an internal high voltage. A voltage level detection circuit 35 inactivates the forcible activation signal ZEN when the internal voltage Vin reaches a voltage level satisfying a prescribed relation with respect to the external power supply voltage EXVD. The operation of the initial control circuit 20d shown in FIG. 19A is now described with reference to a signal waveform diagram shown in FIG. 19B.

Power is supplied at a time t0, to increase the voltage level of the external power supply voltage EXVD at the power supply node PS. The internal voltage generation circuit 34 generates the internal voltage Vin from the external power supply voltage EXVD. Therefore, the voltage level of the internal voltage Vin increases at a speed slower than the voltage increase speed of the external power supply voltage EXVD.

When the voltage levels of the external power supply voltage EXVD and the internal voltage Vin satisfy the prescribed relation at a time t1, the voltage level detection circuit 35 inactivates the forcible activation signal ZEN.

It is possible to stably detect the voltage level by detecting the voltage level of the internal voltage Vin using the external power supply voltage EXVD stabilized at a fast timing, to inactivate the forcible activation signal ZEN at a correct timing. In case of generating a reference voltage for comparison from the external power supply voltage EXVD and comparing the same with the internal voltage Vin, the reference voltage for comparison may require much time to reach a prescribed voltage level so that the voltage levels of the internal voltage Vin and the reference voltage cannot be correctly compared with each other. Stable voltage level detection is guaranteed when the voltage level of the internal voltage Vin is detected using the external power supply voltage EXVD stabilized at the fastest timing in the circuit device.

[Structure 1 of Voltage Level Detection Circuit]

Figure 20:
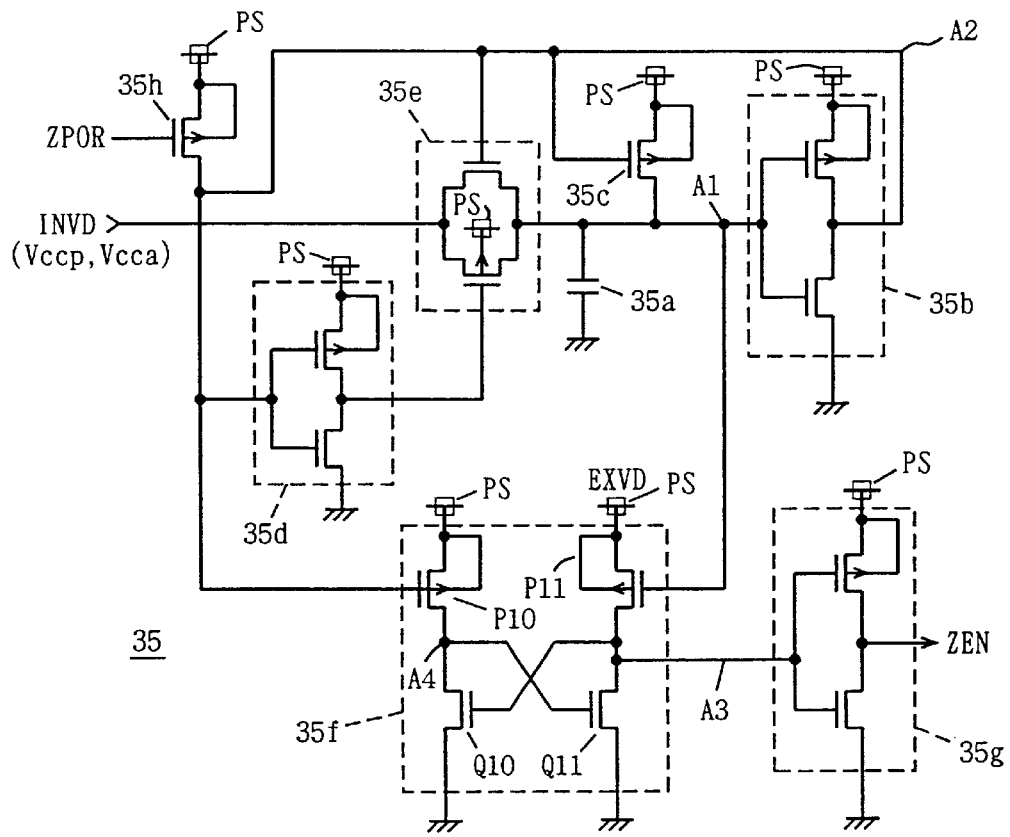
FIG. 20 illustrates the structure of a voltage level detection circuit shown in FIG. 19A.

FIG. 20 illustrates a first structure of the voltage level detection circuit 35 shown in FIG. 19A. Referring to FIG. 20, the voltage level detection circuit 35 includes a capacitive element 35a connected between a node A1 and a ground node, a CMOS invertor 35b operating using the external power supply voltage EXVD supplied to a power supply node PS as one operating power supply voltage and receiving a signal on the node A1, a p-channel MOS transistor 35c selectively connecting the node A1 with a power supply node PS in accordance with an output signal of the invertor 35b at a node A2, a CMOS invertor 35d operating using the external power supply voltage EXVD at a power supply node PS as one operating power supply voltage and receiving the output signal of the CMOS invertor 35b at node A2, a CMOS transmission gate 35e selectively conducting in response to output signals of the CMOS invertors 35b and 35d for selectively transmitting an internal voltage INVD to the node A1, a compare latch circuit 35f comparing signal voltages on the nodes A1 and A2 with each other and latching the result of the comparison, and a CMOS invertor 35g operating using the external power supply voltage EXVD supplied to a power supply node PS as one operating power supply voltage to invert a signal on an output node A3 of the compare latch circuit 35f and outputting the forcible activation signal ZEN.

The CMOS invertors 35b, 35d and 35g each include a p-channel MOS transistor and an n-channel MOS transistors connected between the power supply node PS and ground node. The CMOS transmission gate 35e includes an n-channel MOS transistor receiving an output signal of the CMOS invertor 35b on its gate and a p-channel MOS transistor connected in parallel with the n-channel MOS transistor and receiving an output signal of the CMOS invertor 35d on its gate.

The compare latch circuit 35f includes a p-channel MOS transistor P10 connected between a power supply node PS and a node A4 with its gate connected to the node A2, a p-channel MOS transistor P11 connected between a power supply node PS and the node A3 with its gate connected to the node A1, an n-channel MOS transistor Q10 connected between the node A4 and a ground node with its gate connected to the node A3, and an n-channel MOS transistor Q11 connected between the node A3 and a ground node with its gate connected to the node A4.

Figure 21:
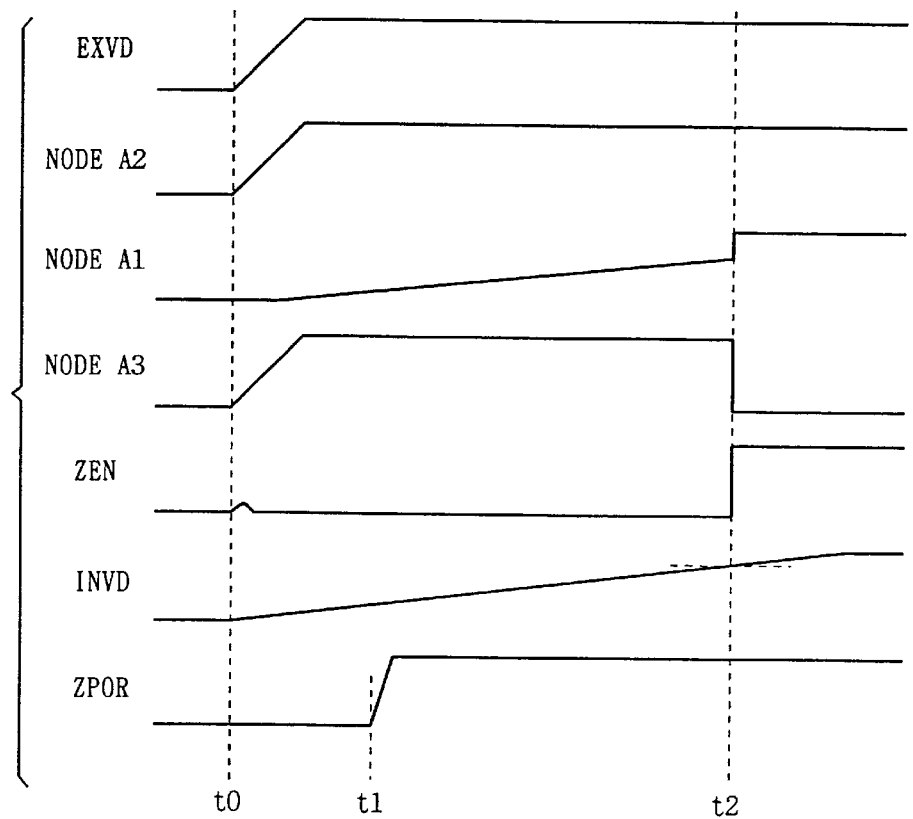
FIG. 21 is a signal waveform diagram representing an operation of the circuit shown in FIG. 20.

The voltage level detection circuit 35 further includes a p-channel MOS transistor 35h connected between a power supply node PS and the node A2 and receiving the power on detection signal ZPOR on its gate. The internal voltage INVD is the internal power supply voltage Vccp or Vcca outputted from the internal power supply circuit 10 shown in FIG. 1. The operation of the voltage level detection circuit 35 shown in FIG. 20 is now described with reference to a signal waveform diagram shown in FIG. 21.

Power is first supplied at a time t0, to increase the voltage level of the external power supply voltage EXVD. In power on, the power on detection signal ZPOR is at a low level, the p-channel MOS transistor 35h enters an ON state, and the voltage level of the node A2 increases along with the voltage level of the external power supply voltage EXVD. The voltage of the node A1 is lower than the input logic threshold voltage of the CMOS invertor 35b, and the voltage level of the output signal of the CMOS invertor 35b also increases in accordance with the voltage level of the external power supply voltage EXVD. On the other hand, the p-channel MOS transistor of the CMOS invertor 35d maintains an OFF state and the output signal of the CMOS invertor 35d goes low to the ground voltage level since the voltage level of the node A2 increases in response to the voltage level of the external power supply voltage EXVD. Therefore, the CMOS transmission gate 35e enters an ON state, and transmits the internal power supply voltage INVD to the node A1. The node A1 is connected with the capacitive element 35a to be charged in accordance with the internal power supply voltage INVD, so that its voltage level slowly increases.

The internal power supply voltage INVD, is generated from the external power supply voltage EXVD on the basis of comparison with a reference voltage generated from the external power supply voltage EXVD, and its voltage level increases in accordance with the voltage level of the external power supply voltage EXVD after the start of power on.

In the compare latch circuit 35f, the voltage level of the node A2 is higher than that of the node A1 and hence the conductance of the p-channel MOS transistor P11 is larger than that of the p-channel MOS transistor P10. The cross-coupled n-channel MOS transistors Q10 and Q11 hold the node A4 at the ground voltage level, and the voltage level of the node A3 increases in response to the voltage level increase of the external power supply voltage EXVD due to a charging current from the p-channel MOS transistor P11. When the voltage level of the node A3 is lower than the input logic threshold voltage of the CMOS invertor 35g immediately after the start of power on, therefore, the voltage level of the forcible activation signal ZEN is temporarily increased by the CMOS invertor 35g but soon discharged so that the forcible activation signal ZEN holds a low level.

When the external power supply voltage EXVD reaches a prescribed voltage level or reaches the prescribed voltage level and is stabilized, the power on detection signal ZPOR rises to a high level at a time t1, and the p-channel MOS transistor 35h enters an OFF state. At the time t1, the external power supply voltage EXVD is stabilized at a prescribed voltage level, and the voltage level of the node A2 is also stabilized at the voltage level of the external power supply voltage EXVD. Also in this state, the CMOS transmission gate 35e is in an ON state, and the voltage level of the node A1 increases in response to voltage level increase of the internal power supply voltage INVD. In the compare latch circuit 35f, the p-channel MOS transistor P10 is in an OFF state (the voltages of the source and the gate are at the same level), and the node A3 maintains a high level.

Following increase of the voltage level of the internal power supply voltage INVD, the capacitive element 35a is charged and the voltage level of the node A1 increases. When the voltage level of the node A1 exceeds the input logic threshold voltage of the CMOS invertor 35b at a time t2, the output signal of the CMOS invertor 35b changes to a low level. Thus, the node A2 is discharged to the ground voltage level, the p-channel MOS transistor 35c enters an ON state, and the node A1 is connected to the external power supply node PS and has its voltage level increased to the voltage level of the external power supply voltage EXVD. In response to the reduction of the voltage level of the node A2, the output signal of the CMOS invertor 35d goes high, and the CMOS transmission gate 35e enter an OFF state to prevent the external power supply voltage EXVD at the node A1 from being transmitted to a node supplying the internal power supply voltage INVD.

In response to the reduction of the voltage level of the node A2, the p-channel MOS transistor P10 enters an ON state while the p-channel MOS transistor P11 enters an OFF state in the compare latch circuit 35f, and the node A4 is charged by the p-channel MOS transistor P10 and has its voltage level increased, and the voltage level of the node A3 is reduced. The cross-connected n-channel MOS transistors Q10 and Q11 discharge and charge the nodes A3 and A4 at a high speed. The forcible activation signal ZEN from the CMOS invertor 35g rises to a high level in response to the reduction of the voltage level of the node A3.

In the structure of the voltage level detection circuit 35 shown in FIG. 20, the forcible activation signal ZEN is inactivated when the voltage level of the node A1 exceeds the input logic threshold voltage of the CMOS invertor 35b. The input logic threshold voltage of the CMOS invertor 35b is provided by the external power supply voltage EXVD supplied to the power supply node PS and the β ratio of MOS transistors included therein. It is possible to correctly determine whether or not the internal power supply voltage INVD has reached a prescribed voltage level using the external power supply voltage EXVD which in turn is most quickly stabilized after the start of power on (the input logic threshold voltage of the CMOS invertor 35b is at a constant value when the external power supply voltage EXVD is constant). The β is the ratio of the channel width to the channel length of an MOS transistor.

The time period between the times t0 and t2 is set at an appropriate value by adjusting the input logic threshold voltage of the CMOS invertor 35b. Alternatively, a resistive element may be inserted between the CMOS transmission gate 35e and the capacitive element 35a to make the increase speed of the voltage level of the node A1 differ from that of the voltage level of the internal power supply voltage INVD for adjusting the active period of the forcible activation signal ZEN.

[Structure 2 of Voltage Level Detection Circuit]

Figure 22:
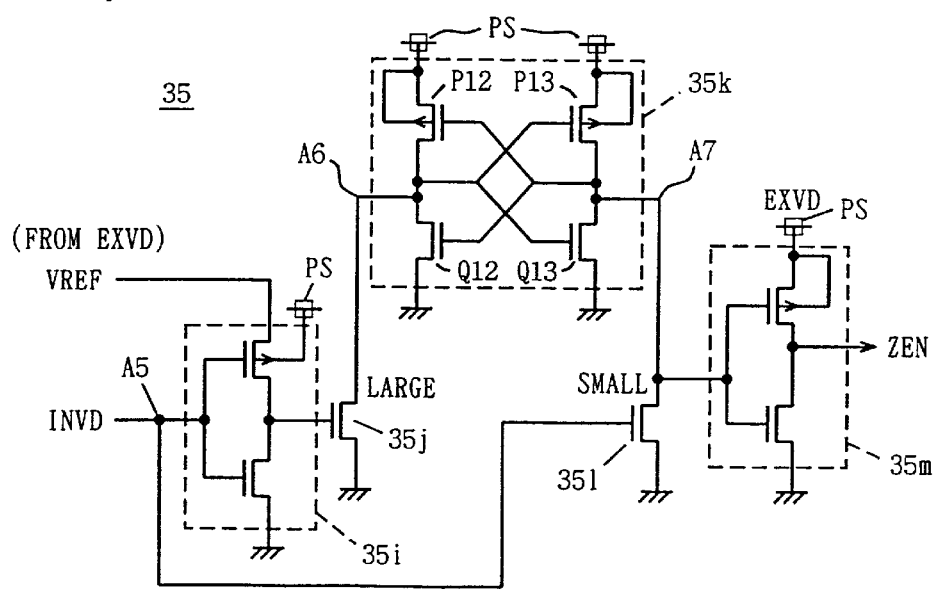
FIG. 22 illustrates another structure of the voltage level detection circuit shown in FIG. 19A.

FIG. 22 illustrates a second structure of the voltage level detection circuit 35 shown in FIG. 19. Referring to FIG. 22, the voltage level detection circuit 35 includes a CMOS invertor 35i operating using the reference voltage VREF from the reference voltage generation circuit 20a shown in FIG. 5 as one operating power supply voltage for inverting the internal power supply voltage INVD, an n-channel MOS transistor 35j discharging a node A6 to the ground voltage level in accordance with an output signal of the CMOS invertor 35i, a CMOS invertor latch 35k for latching voltages of the node A6 and a node A7, an n-channel MOS transistor 35l discharging the node A7 to the ground voltage level in accordance with the internal power supply voltage INVD, and a CMOS invertor 35m inverting a signal voltage on the node A7 to output the forcible activation signal ZEN.

The CMOS invertor latch 35k includes a CMOS invertor including a p-channel MOS transistor P12 and an n-channel MOS transistor Q12 connected between a power supply node PS and a ground node with gates thereof connected to the node A7, and a CMOS invertor including a p-channel MOS transistor P13 and an n-channel MOS transistor Q13 connected between a power supply node PS and a ground node with gates thereof connected to the node A6.

Figure 23:
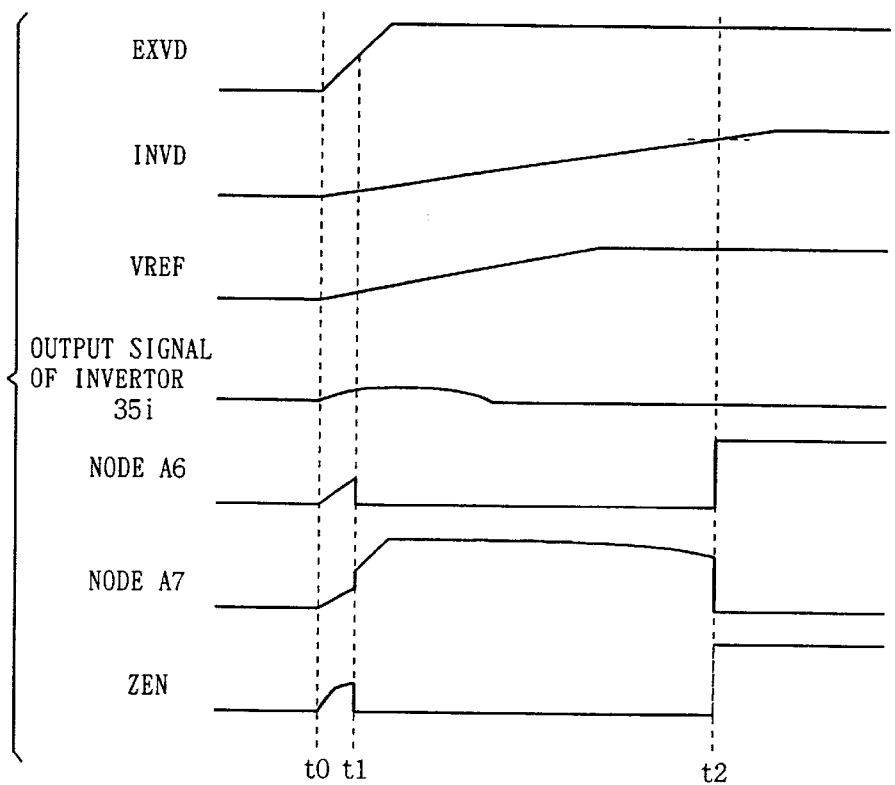
FIG. 23 is a signal waveform diagram representing an operation of the circuit shown in FIG. 22.

The reference voltage VREF, which is employed for detecting the level of the high voltage Vpp, is generated from the external power supply voltage EXVD. The CMOS invertor latch 35k and the CMOS invertor 35m operate using the external power supply voltage EXVD supplied to the power supply node PS as one operating power supply voltage. The voltage level of the reference voltage VREF in stabilization is set to be lower than that of the internal power supply voltage INVD in stabilization. The operation of the voltage level detection circuit 35 shown in FIG. 22 is now described with reference to a signal waveform diagram shown in FIG. 23.

Power is supplied at a time t0, to increase the voltage level of the external power supply voltage EXVD at the power supply node PS. The voltage increase speed of the reference voltage VREF is higher than that of the internal power supply voltage INVD immediately after the start of power supply, whereby the conductance of a p-channel MOS transistor is larger than that of an n-channel MOS transistor in the CMOS invertor 35*i* and the voltage level of the output signal of the CMOS invertor 35*i* increases in accordance with the voltage level increase of the reference voltage VREF. In the CMOS invertor latch 35*k*, on the other hand, the p-channel MOS transistors P12 and P13 are in ON states (the gate-to-source voltages are larger than the absolute values of threshold voltages) immediately after the start of power supply, and the voltage levels of the nodes A6 and A7 increase in accordance with the voltage level increase of the external power supply voltage EXVD. Also in the CMOS invertor 35*m*, the conductance of a p-channel MOS transistor is larger than that of an n-channel MOS transistor, and the voltage level of the forcible activation signal ZEN slowly increases.

When the voltage level of the output signal of the CMOS invertor 35*i* exceeds the threshold voltage of the n-channel MOS transistor 35*j*, the n-channel MOS transistors 35*j* and Q12 drive the node A6 to the ground voltage level. The n-channel MOS transistor 35*l* is employed for determining the voltage level of the internal power supply voltage INVD, and its threshold voltage or current drivability is rendered smaller than that of the n-channel MOS transistor 35*j*. When the node A6 is driven to the ground voltage level, the n-channel MOS transistor Q13 enters an OFF state, while the p-channel MOS transistor P13 enters a stronger conducting state for connecting the node A7 to the power supply node PS to increase its voltage level to the external power supply voltage EXVD level. Since the voltage level of the node A7 increases to the external power supply voltage EXVD level, the p-channel MOS transistor and the n-channel MOS transistor enter OFF and ON states respectively in the CMOS invertor 35*m*, and the forcible activation signal ZEN is driven to the ground voltage level.

As the voltage level of the internal power supply voltage INVD increases, the conductance of the n-channel MOS transistor exceeds that of the p-channel MOS transistor in the CMOS invertor 35*i*, and the voltage level of the output signal from the CMOS invertor 35*i* is reduced and finally driven to the ground voltage level (since the difference between the reference voltage VREF and the internal power supply voltage INVD is smaller than that between the internal power supply voltage INVD and the ground voltage). Thus, the n-channel MOS transistor 35*j* enters an OFF state, and the n-channel MOS transistor Q12 holds the node A6 at the ground voltage level. On the other hand, the p-channel MOS transistor P13 holds the node A7 at the voltage level of the external power supply voltage EXVD.

When the voltage level of the internal power supply voltage INVD increases, the conductance of the n-channel MOS transistor 35*l* increases. When this conductance of the transistor 35*l* exceeds that of the p-channel MOS transistor P13, the voltage level of the node A7 starts to reduce.

When the voltage level of the internal power supply voltage INVD supplied to the node A5 reaches a prescribed voltage level, the conductance of the n-channel MOS transistor 35*l* is sufficiently increased, the current suppliability of the p-channel MOS transistor P12 exceeds that of the n-channel MOS transistor Q12, the voltage level of the node A6 increases, and the p-channel MOS transistor P13 shifts to an OFF state. Through the series of these operations, the latch state of the CMOS invertor latch 35*k* is inverted and the node A7 reaches the ground voltage level, while the node A6 reaches the voltage level of the external power supply voltage EXVD. Due to the reduction of the voltage level of the node A7, the forcible activation signal ZEN from the CMOS invertor 35*m* rises to a high level (the level of the external power supply voltage EXVD).

By employing the reference voltage VREF which changes slightly more quickly than the internal power supply voltage INVD but sufficiently more slowly than the external power supply voltage EXVD as one operating power supply voltage for the CMOS invertor 35*i* as shown in FIG. 22, it is possible to stably and reliably set the internal latch nodes A6 and A7 in initial states by making different the drivabilities of the latch nodes A6 and A7 by the MOS transistors 35*j* and 35*l* and by slowly increasing the output signal of the CMOS invertor 35*i* to temporarily increase the voltage levels of the internal latch nodes A6 and A7 in an initial state.

When the external power supply voltage EXVD is stabilized and the internal power supply voltage INVD reaches the prescribed voltage level, current drivability by the gate voltages of the MOS transistors Q12 and 35*l* are adjusted, and determination is made as to whether or not the internal power supply voltage INVD has reached the prescribed voltage level on the basis of the voltage level of the external power supply voltage EXVD as a result (the current drivability of the MOS transistor 35*l* is adjusted to be constant to set the determination level for the internal power supply voltage INVD, while the determination is made on the basis of the difference in current drivability between the MOS transistors Q12 and 35*l*, to detect the voltage level of the internal power supply voltage INVD on the basis of the voltage level of the external power supply voltage EXVD as a result). Thus, stable internal voltage detection is implemented.

In case of utilizing the external power supply voltage EXVD as one operating power supply voltage in the CMOS invertor 35*i*, the internal power supply voltage INVD is lower than the external power supply voltage EXVD and a current regularly flows in the CMOS invertor 35*i* to increase current consumption. Even if the internal power supply voltage INVD reaches the prescribed voltage level, the output signal of the CMOS invertor 35*i* is not discharged to the ground voltage level (the n-channel MOS transistor 35*j* cannot be set in a complete OFF state), and the latch state of the CMOS invertor latch 35*k* cannot be inverted at a high speed even when the internal power supply voltage INVD reaches the prescribed voltage level. The latch state of the CMOS invertor latch 35*k* can be inverted at a high speed when the internal power supply voltage INVD reaches the prescribed voltage level by utilizing the reference voltage VREF having a voltage level lower than that of the internal power supply voltage INVD and generated from the external power supply voltage EXVD (since the MOS transistor 35*j* can be completely brought into an OFF state).

(Modification)

Figure 24:
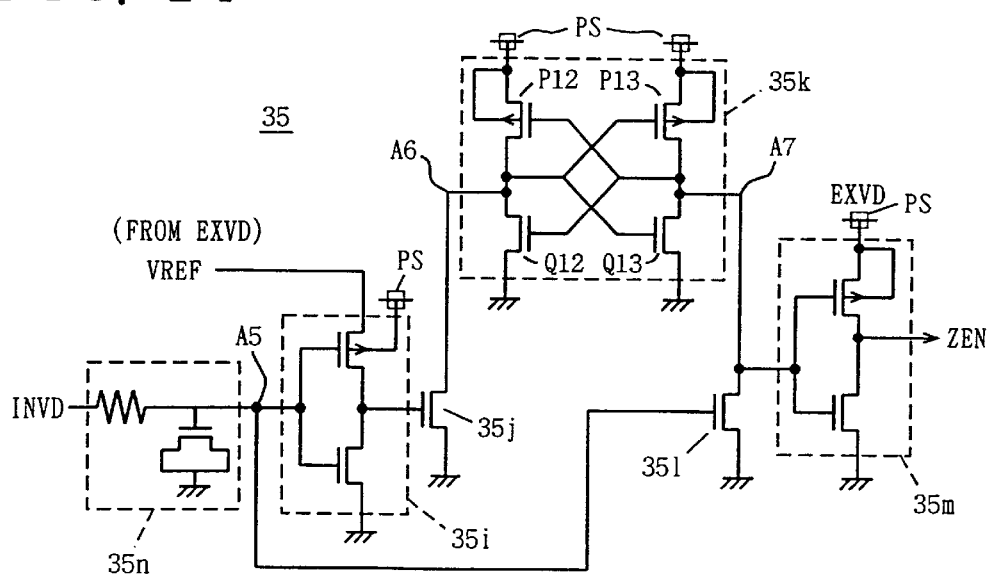
FIG. 24 illustrates a modification of the circuit shown in FIG. 22.

FIG. 24 illustrates the structure of a modification of the voltage level detection circuit 35 shown in FIG. 22. In the voltage level detection circuit 35 shown in FIG. 24, an RC delay circuit 35*n* receiving the internal power supply voltage INVD is provided on an input node A5 of a CMOS invertor 35*i*. This RC delay circuit 35*n* includes a resistive element and a MOS capacitor. The remaining structure is identical to that shown in FIG. 22, and corresponding parts are denoted by the same reference numerals, to omit the description thereon.

In the structure shown in FIG. 24, the RC delay circuit 35*n* can adjust the change speed of a signal voltage of the input node A5 of the CMOS invertor 35*i*. Therefore, the time t2 for inactivating the forcible activation signal ZEN in the signal waveform diagram shown in FIG. 23 can be set at any desired timing. Further, it is possible to reliably set the voltage levels of internal latch nodes A6 and A7 at low and high levels after increasing the voltages at nodes A6 and A7 by adjusting the voltage change speed of the input node A5 in correspondence to the change speed of the reference voltage VREF. Thus, it is possible to prevent nodes A6 and A7 from being placed into erroneous internal latch states through latching in instable states of the voltage levels of the internal latch nodes A6 and A7, thereby guaranteeing a correct circuit operation. In this structure, the reference voltage VREF may be the one for generating the internal power supply voltage INVD. Even if a circuit employing the internal power supply voltage INVD operates to temporarily increase current consumption and the internal power supply voltage INVD abruptly fluctuates after the internal power supply voltage INVD rises, the RC delay circuit 35n functions as a low-pass filter for such high-frequency voltage fluctuation of the internal power supply voltage INVD, for inhibiting the voltage level detection circuit 35 from erroneously starting an internal latch operation.

The voltage level of the internal power supply voltage INVD is detected on the basis of the external power supply voltage EXVD which in turn is stabilized at the fastest timing in the voltage level detection circuit 35 shown in FIG. 22 or 24, for forming a timing signal. Therefore, the voltage level detection circuit 35 can be utilized as a circuit for operating the internal circuit at a constant timing after the start of power supply.

(Other Applications)

Figure 25:
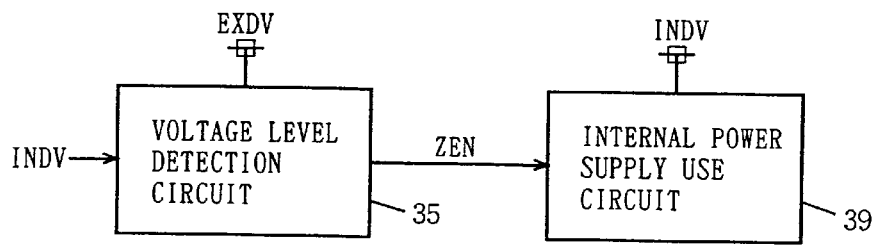
FIG. 25 illustrates another exemplary usage of the voltage level detection circuit shown in FIG. 19A.

FIG. 25 illustrates an exemplary usage of the voltage level detection circuit 35. Referring to FIG. 25, the signal ZEN from the voltage level detection circuit 35 is supplied to an internal power supply use circuit 39 using the internal power supply voltage INVD. The internal power supply use circuit 35 is inhibited from operating while the signal ZEN from the voltage level detection circuit 35 is at a low level. Therefore, it is possible to prevent the internal power supply use circuit 39 from malfunctioning by inhibiting its operation until the internal power supply voltage INVD generated from the external power supply voltage EXVD reaches a prescribed voltage level or is stabilized after the start of power supply, thereby correctly setting the internal state of the internal power supply use circuit 39 in an initial state.

Further, it is possible to enable the internal power supply use circuit 39 at a correct timing by employing the signal ZEN from the voltage level detection circuit 35 in place of the so-called power on detection signal ZPOR.

In addition, it is also possible to forcibly drive the internal power supply use circuit 39 through the signal ZEN outputted from the voltage level detection circuit 35.

Figure 26:
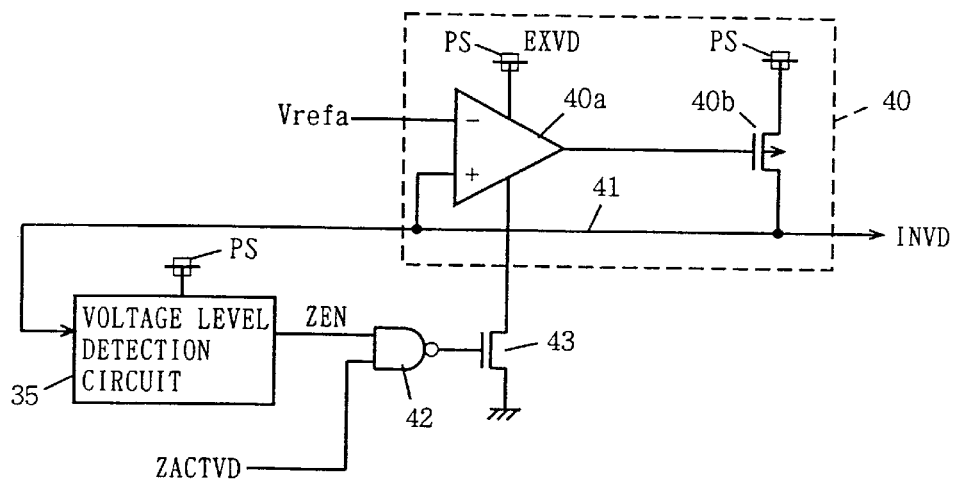
FIG. 26 illustrates another structure of an internal power supply use circuit shown in FIG. 25.

FIG. 26 illustrates another exemplary usage of the voltage level detection circuit 35. In the structure shown in FIG. 26, an internal power supply circuit (internal voltage down converter) 40 converting down the external power supply voltage EXVD supplied to a power supply node PS to generate the internal power supply voltage INVD in activation thereof is forcibly activated in activation of the output signal ZEN from the voltage level detection circuit 35. An activation control part of the internal power supply circuit 40 includes a NAND circuit 42 receiving the output signal ZEN from the voltage level detection circuit 35 and an activation control signal ZACTVD of the external power supply voltage EXVD level, and a current source transistor 43 conducting when an output signal of the NAND circuit 42 is at a high level for activating the internal power supply circuit 40. The NAND circuit 42 operates using the external power supply voltage EXVD as one operating power supply voltage. The activation control signal ZACTVD is driven to a low level of an active state in activation of a circuit utilizing the internal power supply voltage INVD generated by the internal power supply circuit 40.

The internal power supply circuit 40 includes a comparison circuit 40a operating using the external power supply voltage EXVD as one operating power supply voltage for comparing the internal power supply voltage INVD on an internal power supply line 41 with a reference voltage Vrefa, and a p-channel MOS transistor 40b connected between a power supply node PS and the internal power supply line 41 for receiving an output signal of the comparison circuit 40a on its gate. The comparison circuit 40a receives the internal power supply voltage INVD and the reference voltage Vrefa in its positive and negative inputs respectively.

In the internal power supply circuit 40, the output signal of the comparison circuit 40a goes high to bring the MOS transistor 40b into an OFF state when the internal power supply voltage INVD is higher than that of the reference voltage Vrefa. When the internal power supply voltage INVD is lower than the reference voltage Vrefa, on the other hand, the output signal of the comparison circuit 40a is reduced to a low voltage level corresponding to the difference between the internal power supply voltage INVD and the reference voltage Vrefa, to drive the MOS transistor 40b to a conducting state. The MOS transistor 40b supplies a current from the power supply node PS to the internal power supply line 41, to increase the voltage level of the internal power supply voltage INVD. Therefore, the internal power supply voltage INVD is held at the voltage level of the reference voltage Vrefa.

The MOS transistor 43 of the activation control circuit part functions as a current source for the comparison circuit 40a. When the MOS transistor 43 is in an OFF state, a current path from the power supply node PS to a ground node is cut off in the comparison circuit 40a and its output signal is driven to a high level. When the MOS transistor 43 is in an ON state, on the other hand, the current path from the power supply node PS to the ground node is formed in the comparison circuit 40a, which in turn compares the internal power supply voltage INVD with the reference voltage Vrefa.

When either the output signal ZEN from the voltage level detection circuit 35 or the activation control signal ZACTVD is at a low level, the NAND circuit 42 outputs a high-level signal for driving the MOS transistor 43 into an ON state, thereby activating the internal power supply circuit having large current drivability. In the structure shown in FIG. 26, therefore, the signal ZEN from the voltage level detection circuit 35 is held at a low level of an active state until the internal power supply voltage INVD reaches the prescribed voltage level or enters a stable state after the start of power supply. Therefore, the internal power supply circuit 40 is activated and the internal power supply voltage INVD can reach the prescribed voltage level at a high speed after the start of power supply.

When the output signal ZEN of the voltage level detection circuit 35 goes high, activation of the internal power supply circuit 40 is thereafter controlled in accordance with the activation control signal ZACTVD. The internal power supply circuit 40, which is activated in activation of the circuit utilizing the internal power supply voltage INVD, has relatively large current suppliability. Therefore, it is possible to set the internal power supply voltage INVD at the prescribed voltage level at a high speed by activating the internal power supply circuit 40 in accordance with the signal ZEN after the start of power supply.

In the structure shown in each of FIGS. 22 and 24, activation/inactivation of the signal ZEN is controlled by detecting the voltage level of the internal power supply voltage INVD. However, a similar effect can also be attained even by employing an internal voltage held at a prescribed voltage level in place of the internal power supply voltage INVD. Therefore, it is also possible to utilize the high voltage Vpp in the structure shown in FIG. 22 or 24, for example (in this case, however, the level of the high voltage Vpp must be higher than that of the reference voltage VREF).

According to the embodiment 1 of the present invention, as hereinabove described, the circuit activated in response to the activation signal for generating the high voltage Vpp in activation is forcibly driven to an active state for a prescribed period after the start of power supply, whereby the high voltage Vpp can be brought to the prescribed voltage level at a high speed after the start of power supply.

[Embodiment 2: Reference Voltage Generation Circuit]

Figure 27:
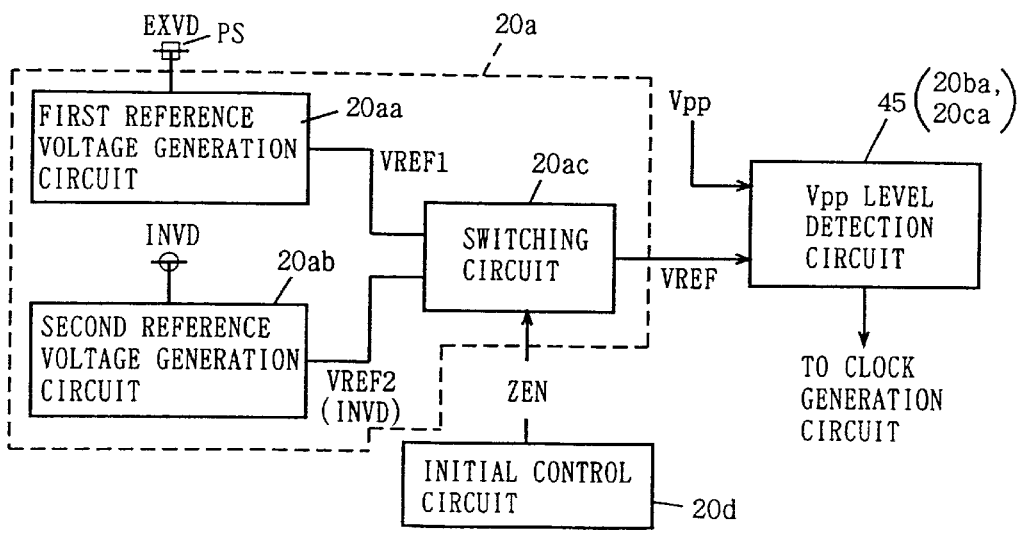
FIG. 27 schematically illustrates the structure of a reference voltage generation circuit shown in FIG. 5.

FIG. 27 schematically illustrates the structure of the reference voltage generation circuit 20a shown in FIG. 5. Referring to FIG. 27, the reference voltage generation circuit 20a includes a first reference voltage generation circuit 20aa generating a reference voltage VREF1 from the external power supply voltage EXVD, a second reference voltage generation circuit 20ab generating a reference voltage VREF2 from the internal power supply voltage INVD, and a switching circuit 20ac selecting one of the reference voltages VREF1 and VREF2 and supplying the same to a Vpp level detection circuit 45 in response to a control signal ZEN from an initial control circuit 20d. The initial control circuit 20d having the same structure as the initial control circuit 20d shown in FIG. 5 drives its output signal ZEN to an active state of a low level for a predetermined period after the start of power supply. Also, the initial control circuit 20d can be formed of the voltage reference level detection circuit shown in FIG. 20 or FIG. 22. The Vpp level detection circuit 45 is equivalent to the Vpp detection circuit 20ba and/or 20ca shown in FIG. 5. A reference voltage VREF from the reference voltage generation circuit 20a is supplied to a standby Vpp generation circuit and an active Vpp generation circuit in common.

Figure 28:
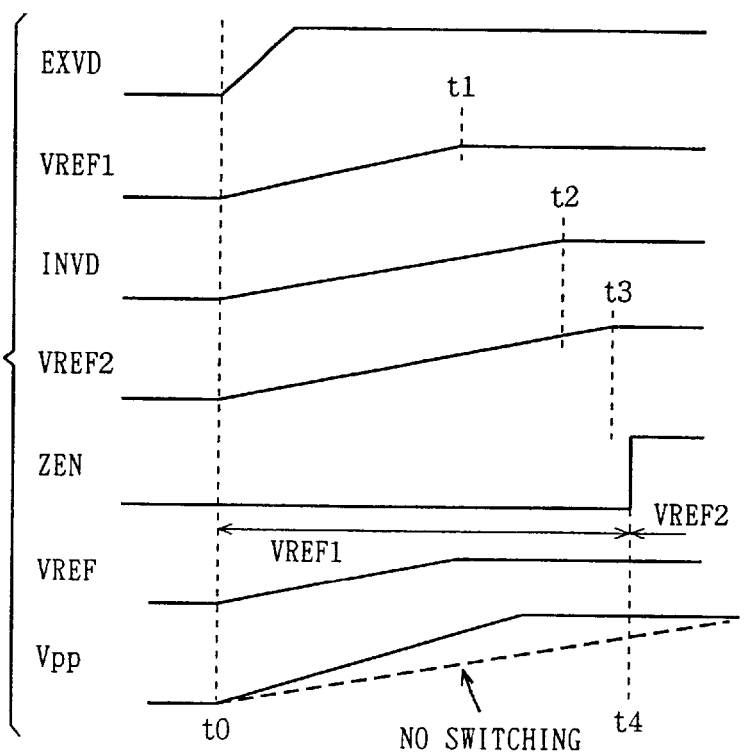
FIG. 28 is a signal waveform diagram representing an operation of the reference voltage generation circuit shown in FIG. 27.

The operation of the reference voltage generation circuit 20a shown in FIG. 27 is now described with reference to a signal waveform diagram shown in FIG. 28.

At a time t0, power is supplied to increase the voltage level of the external power supply voltage EXVD. The first reference voltage generation circuit 20aa generates the reference voltage VREF1 from the external power supply voltage EXVD. Therefore, the voltage level of the first reference voltage VREF1 relatively slowly increases in accordance with the external power supply voltage EXVD. On the other hand, the second reference voltage generation circuit 20ab generates the reference voltage VREF2 in accordance with the internal power supply voltage INVD which is generated from the internal power supply circuit 40 shown in FIG. 26, for example. The internal power supply voltage INVD is generated from the external power supply voltage EXVD, and hence its voltage change speed is slower than that of the external power supply voltage EXVD. Therefore, the change speed of the second reference voltage VREF2 from the second reference voltage generation circuit 20ab is identical to or slower than that of the internal power supply voltage INVD.

The control signal ZEN from the initial control circuit 20d goes low for a prescribed period after the start of power supply. The switching circuit 20ac selects the first reference voltage VREF1 from the first reference voltage generation circuit 20aa and supplies the same to the Vpp level detection circuit 45 as the reference voltage VREF in accordance with the low-level control signal ZEN. In accordance with a detection result instruction signal from the Vpp level detection circuit 45, a clock generation circuit and a charge pump circuit generate the high voltage Vpp. Therefore, the high voltage Vpp increases in accordance with the change of the reference voltage VREF1 after the start of power supply (the change speed of the high voltage Vpp is slower than that of the reference voltage VREF, since the high voltage Vpp is generated from the reference voltage VREF).

The reference voltage VREF1, the internal power supply voltage INVD and the second reference voltage VREF2 are stabilized at times t1, t2 and t3 respectively. Thereafter the signal ZEN from the initial control circuit 20d rises to a high level at a time t4. In response, the switching circuit 20ac selects the second reference voltage VREF2 from the second reference voltage generation circuit 20ab and supplies the same to the Vpp level detection circuit 45 as the reference voltage VREF. Thereafter the high voltage Vpp is generated on the basis of the reference voltage REF generated in accordance with the internal power supply voltage INVD. When the high voltage Vpp is generated in accordance with the reference voltage VREF1 generated in accordance with the external power supply voltage EXVD immediately after the start of power supply, the high voltage Vpp can be set at a stable level at a faster timing as compared with the case of generating the high voltage Vpp in accordance with the reference voltage VREF2 which is generated from the internal power supply voltage INVD as shown by a broken line in FIG. 28, thereby performing the internal operation of the circuit at a quick timing.

The reference voltage VREF2 generated from the internal power supply voltage INVD is employed as the reference of level detection of the high voltage Vpp, since the high voltage Vpp is supplied to circuitry using the internal power supply voltage INVD. Thus, the high voltage Vpp is prevented from being applied to gate insulation films of MOS transistors forming the semiconductor circuit device, thereby guaranteeing reliability of the gate insulation films.

As to the initial control circuit 20d, any structure for forcibly activating a Vpp level detector immediately after the start of power supply can be selected and employed.

When the Vpp generation circuit 20 is an output high voltage generation circuit, the high voltage Vpp is determined in accordance with an output power supply voltage VDDQ, and hence the reference voltage VREF is generated in accordance with the external power supply voltage VDDQ.

As shown within parentheses in FIG. 27, the internal power supply voltage INVD may be employed as the second reference voltage VREF2.

Figure 29:
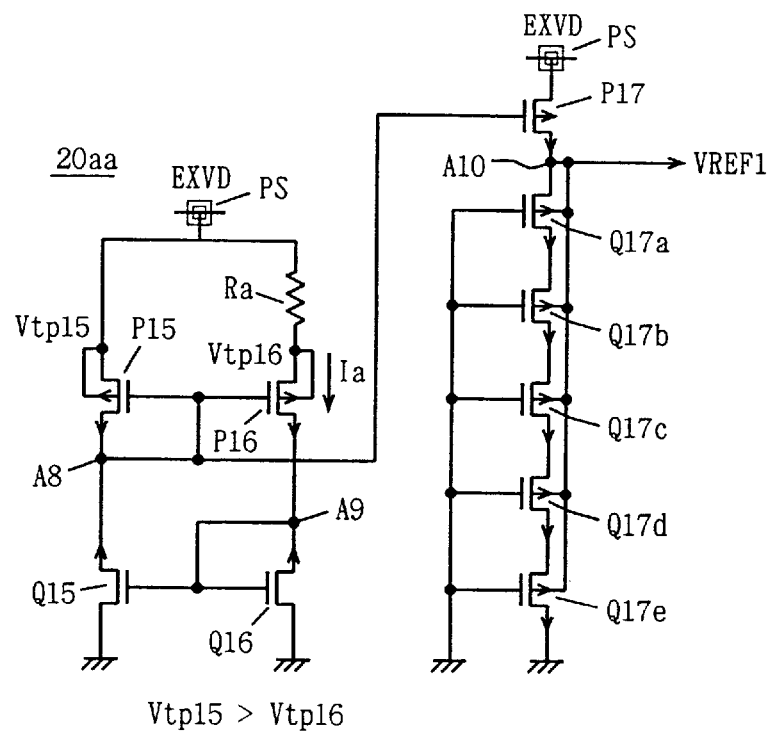
FIG. 29 illustrates an exemplary structure of a first or second reference voltage generation circuit shown in FIG. 27.

FIG. 29 illustrates the structure of the first reference voltage generation circuit 20aa generating the reference voltage VREF1 in accordance with the external power supply voltage EXVD. The second reference voltage generation circuit 20ab, which has the same structure as that shown in FIG. 29, receives the internal power supply voltage INVD in place of the external power supply voltage EXVD.

Referring to FIG. 29, the reference voltage generation circuit 20aa includes a p-channel MOS transistor P15 connected between a power supply node PS and a node A8 with its gate connected to the node A8, a resistive element Ra having an end connected to the power supply node PS, a p-channel MOS transistor P16 connected between another end of the resistive element Ra and a node A9 with its gate connected to the node A8, an n-channel MOS transistor Q15 connected between the node A8 and a ground node with its gate connected to the node A9, and an n-channel MOS transistor Q16 connected between the node A9 and the ground node with its gate connected to the node A9. The MOS transistors P15 and P16 have threshold voltages Vtp 15 and Vtp 16 in absolute value respectively. The absolute value Vtp 15 of the threshold voltage is larger than the absolute value Vtp 16 of the threshold voltage. The MOS transistors Q15 and Q16 form a current mirror circuit.

The reference voltage generation circuit 20aa further includes a p-channel MOS transistor P17 connected between a power supply node PS and an output node A10 with its gate connected to the node A8, and n-channel MOS transistors Q17a to Q17e serially connected between the output node A10 and a ground node. The MOS transistors Q17a to Q17e each a gate connected to the ground node and substrate region has connected to the output node A10 to serve a resistive element. The operation of the reference voltage generation circuit 20aa shown in FIG. 29 is now described.

When the power supply voltage EXVD exceeds a prescribed value and the MOS transistors Q15 and Q16 enter ON states after the start of power supply, a current flows in the circuit of the MOS transistors P15, P16, Q15 and Q16. The MOS transistors P15 and Q16 each have the gate and drain interconnected, to operate in the saturated region. When the voltage level of the node A8 increases, the gate-to-source voltage of the MOS transistor 16 reduces and a current Ia flowing through the MOS transistor P16 also reduces. The MOS transistors Q15 and Q16 form the current mirror circuit, and a mirror current of the current Ia flows through the MOS transistors P15 and Q15. If the current Ia reduces, the mirror current also reduces, the drain-to-source voltage in the MOS transistor Q15 reduces, and the voltage level of the node A8 is lowered. When the voltage level of the node A8 reduces, the current Ia flowing through the MOS transistor P16 increases, the mirror current flowing through the node A8 also increases in response, the drain voltage of the MOS transistor Q15 increases in response, and the voltage level of the node A8 increases. Now, the node A8 reaches a constant voltage level, and the current Ia flowing through the MOS transistor P16 also reaches a constant level. Now, the value of the current Ia is obtained. The MOS transistors P15 and P16 operate in the saturated regions, whereby the following expression is obtained:

$$\beta 15(EXVD - V8 - Vtp15)^2 = \beta 16(Vr - V8 - Vtp16)^2 \quad (1)$$

where $\beta 15$ and $\beta 16$ represent the ratios of the channel widths to the channel lengths of the MOS transistors P15 and P16 respectively, V8 represents the voltage of the node A8, and Vr represents the source voltage of the MOS transistor P16.

When the size (the ratio of the channel width to the channel length) of the MOS transistor P15 is sufficiently larger than that of the MOS transistor P16, the MOS transistor P15 operates in a diode mode, to cause a voltage drop of the voltage Vtp 15. Therefore, the left side of the above expression becomes zero, to provide the following expression:

$$Vr = V8 + Vtp16$$
$$= EXVD - Vtp15 + Vtp16$$

A voltage EXVD−Vr is applied across the resistive element Ra, and hence the current Ia is expressed as follows:

$$Ia = (Vtp15 - Vtp16)/Ra$$

When the conductance coefficients $\beta$ of the MOS transistors P15 and P16 are equal to each other, the following expression is obtained from the above expression (1):

$$EXVD - Vtp15 = Vr - Vtp16$$

Also in this case, therefore, the value of the current Ia is similar to that flowing when the MOS transistor P15 operates in a diode mode.

This current Ia depends on only the resistance value Ra of the resistive element Ra and the threshold voltages of the MOS transistors P15 and P16, and is not dependent on the external power supply voltage EXVD.

The MOS transistor P17 forms a current mirror circuit with the MOS transistor P15, and supplies a current corresponding to the voltage level of the node A8 from the power supply node PS to the output node A10. The current supplied from the MOS transistor P17 to the node A10 is converted to a voltage through the channel resistance of the MOS transistors Q17a to Q17e, to generate the reference voltage VREF1. When all MOS transistors Q17a to Q17e enter ON states, therefore, the reference voltage VREF1 has a voltage level determined by the channel resistances of the MOS transistors Q17a to Q17e and reaches a constant voltage level not dependent on the external power supply voltage EXVD. When at least one of the MOS transistors Q17a to Q17e is in an OFF state, the reference voltage VREF1 increases in accordance with increase of the external power supply voltage EXVD as a constant current is supplied from the MOS transistor P17.

According to an embodiment 2 of the present invention, as hereinabove described, the reference voltage for generating the high voltage Vpp is generated from the external power supply voltage EXVD after the start of power supply, and then the voltage generated in accordance with the internal power supply voltage INVD or the internal power supply voltage INVD is employed as the reference voltage for generating the high voltage Vpp when a prescribed time elapses and the internal power supply voltage INVD is stabilized. After the supply of power, the voltage level of the reference voltage is increased at a high speed so that the voltage level of the high voltage Vpp can be increased at a high speed in response, and the time required for stabilizing the high voltage Vpp can be reduced.

[Embodiment 3: Structure of Vpp Level Detection Circuit]
[Structure 1 of Vpp Level Detector]

Figure 30:
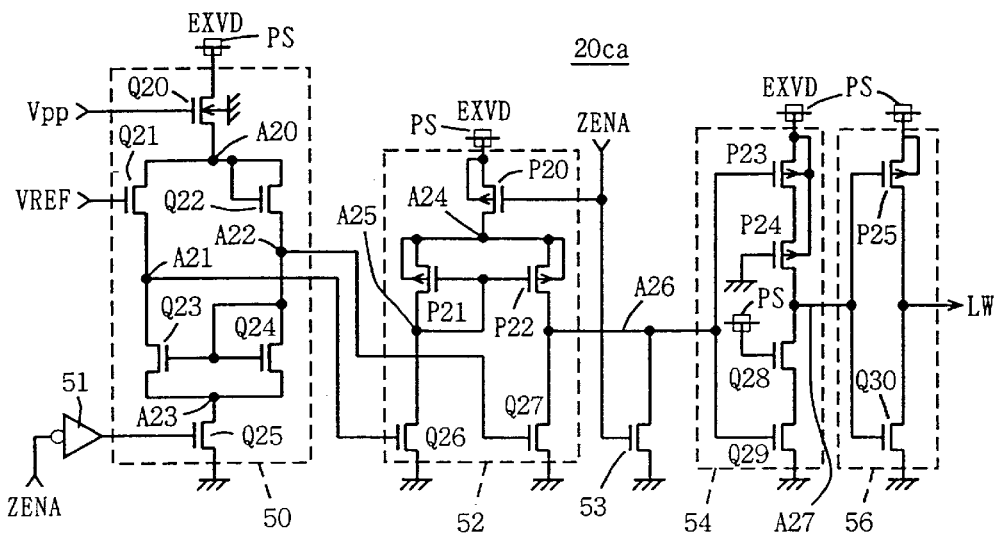
FIG. 30 illustrates a first structure of a Vpp detection circuit shown in FIG. 5.

FIG. 30 illustrates a first structure of the Vpp level detection circuit 20ca shown in FIG. 5. The Vpp level detection circuit 20ba included in the standby Vpp generation circuit 20b also has the same structure except for that the circuit 20ca receives an activation control signal ZENA (the standby Vpp generation circuit 20b operates after the start of power supply).

Referring to FIG. 30, the Vpp level detection circuit 20ca includes a Vpp level detector 50 activated in response to activation of the activation control signal ZENA supplied through an invertor 51 for comparing the high voltage Vpp with the reference voltage VREF, a current mirror differential amplifier 52 activated in activation of the activation control signal ZENA for differentially amplifying an output signal of the Vpp level detector 50, a CMOS invertor 54 having a current limiting function and amplifying an output signal of the differential amplifier 52, and a CMOS invertor 56 inverting an output signal of the CMOS invertor 54 and outputting a clock activation signal LW of a CMOS level. The clock activation signal LW from the CMOS invertor 56 is supplied to the clock generation circuit 20cb shown in FIG. 5.

The Vpp level detector 50 includes an n-channel MOS transistor Q20 connected between a power supply node PS and a node A20 and receiving the high voltage Vpp on its gate, an n-channel MOS transistor Q21 connected between the node A20 and a node A21 and receiving the reference voltage VREF on its gate, an n-channel MOS transistor Q22 connected between the node A20 and a node A22 with its gate connected to the node A20, an n-channel MOS transistor Q23 connected between the node A21 and a node A23 with its gate connected to the node A22, an n-channel MOS transistor Q24 connected between the nodes A22 and A23 with its gate connected to the node A22, and an n-channel MOS transistor Q25 connected between the node A23 and a ground node and receiving an output signal of the invertor 51 on its gate. The MOS transistors Q20 to Q24 have the same size, while the MOS transistor Q25 has sufficiently large current drivability.

The differential amplifier 52 includes a p-channel MOS transistor P20 connected between a power supply node PS and a node A24 and receiving the activation control signal ZENA on its gate, a p-channel MOS transistor P21 connected between the node A24 and a node A25 with its gate connected to the node A25, a p-channel MOS transistor P22 connected between the node A24 and a node A26 with its gate connected to the node A25, an n-channel MOS transistor Q26 connected between the node A25 and a ground node with its gate connected to the node A21, and an n-channel MOS transistor Q27 connected between the node A26 and a ground node with its gate connected to the node A22. The MOS transistors P21 and P22 form a current mirror circuit.

The CMOS invertor 54 having a current limiting function includes p-channel MOS transistors P23 and P24 connected between a power supply node PS and a node A27, and n-channel MOS transistors Q28 and Q29 connected between the node A27 and a ground node. The gates of the MOS transistors P23 and Q29 are connected to the node A26. The gate of the MOS transistor P24 is connected to a ground node, and that of the MOS transistor Q28 is connected to the power supply node PS. These MOS transistors P24 and Q28 serve as resistive elements, and limit a charge/discharge current of the CMOS invertor 54 for preventing a signal of the node A27 from abruptly changing. Thus, the clock activation signal LW for generating the high voltage Vpp is prevented from being outputted in an incomplete form due to influence by noise or the like, and generation of an instable high voltage is prevented.

The CMOS invertor 56 includes a p-channel MOS transistor P25 connected between a power supply node PS and an output node with its gate connected to a node A27, and an n-channel MOS transistor Q30 connected between the output node and a ground node with its gate connected to the node A27.

The Vpp level detection circuit 20ca further includes an n-channel MOS transistor 53 which conducts in inactivation of the activation control signal ZENA for holding the node A26 at the ground voltage level. The operation of the Vpp level detection circuit 20ca shown in FIG. 30 is now described. First, the operation of the Vpp level detector 50 is described with reference to an operation waveform diagram shown in FIG. 31.

Power is supplied at a time t0. After the power supply, the activation control signal ZENA is in an active state of a low level for activating the Vpp level detection circuit 20ca. Even if the external power supply voltage EXVD increases and stabilizes, the reference voltage VREF increases in accordance with the power supply voltage EXVD and is stabilized at a prescribed voltage. Since the high voltage Vpp is generated in accordance with the reference voltage VREF, the voltage level of the high voltage Vpp further increases even if the reference voltage VREF is stabilized.

In the Vpp level detector 50, the MOS transistor Q20 operates as a level shift element since the high voltage Vpp on its gate is at a voltage level lower than the power supply voltage EXVD at the power supply node PS, and the voltage level of the node A20 reaches Vpp−Vth. The MOS transistors Q22 and Q24 each have the gate and the drain interconnected to operate in saturated region. Therefore, the voltage level of the node A22 reaches a level obtained by dividing the voltage difference between the nodes A20 and A23 by the combined channel resistance of the MOS transistors Q22 and Q24, and increases in accordance with increase of the voltage Vpp−Vth on the node A20, where Vth represents the threshold voltage of the MOS transistor Q20.

On the other hand, the MOS transistor Q21 receives the reference voltage VREF0 on its gate, while the MOS transistor Q23 receives the same gate voltage as that of the MOS transistor Q24. The MOS transistors Q23 and Q24 form a current mirror circuit, whereby currents of the same magnitude flow through the MOS transistors Q23 and Q24. While the reference voltage VREF is higher than the gate voltage of the MOS transistor Q22, i.e., the voltage Vpp−Vth on the node A20, the conductance of the MOS transistor Q21 is larger than that of the MOS transistor Q22, and the voltage level of the node A21 exceeds that of the node A22.

As the voltage Vpp−Vth of the node A20 approaches the reference voltage VREF, the difference between the conductance values of the MOS transistors Q23 and Q21 is reduced to reduce the voltage increase speed of the node A21.

When the voltage Vpp−Vth of the node A20 exceeds the reference voltage VREF at a time t1, the conductance of the MOS transistor Q21 becomes smaller than that of the MOS transistor Q22 and the voltage level of the node A21 becomes lower than that of the node A22. Therefore, the nodes A21 and A22 output the voltages according to the difference between the reference voltage VREF and the voltage Vpp−Vth.

The differential amplifier 52 receives the signal voltages of the nodes A21 and A22 on the gates of the MOS transistors Q26 and Q27, which in turn discharge currents according to the gate voltages to the ground node. The MOS transistors Q26 and Q27 are supplied with currents from the current mirror circuit formed by the MOS transistors P21 and P22. When the voltage level of the node A21 is higher than that of the node A22, the conductance of the MOS transistor Q26 exceeds that of the MOS transistor Q27 and the MOS transistor Q27 cannot wholly discharge a mirror current supplied from the MOS transistor P22 and the voltage level of the node A26 is driven to a high level.

Figure 31:
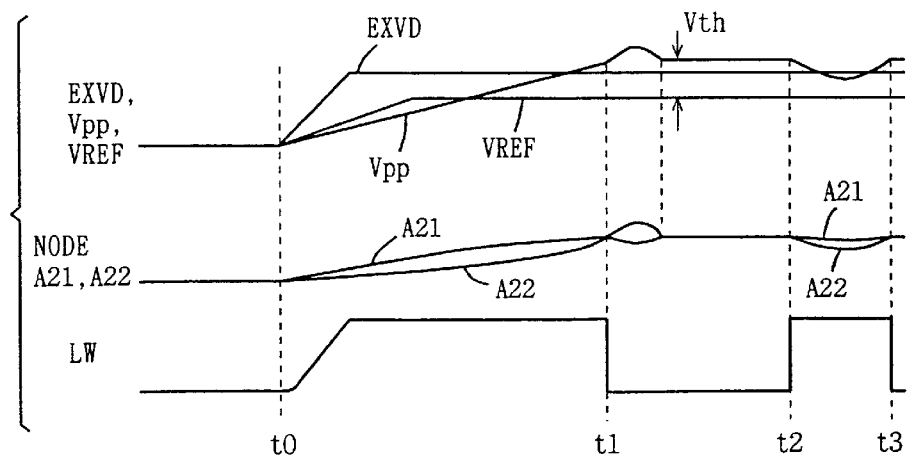
FIG. 31 is a signal waveform diagram representing an operation of the circuit shown in FIG. 30.

When the voltage level of the node A21 is lower than that of the node A22, on the other hand, the conductance of the MOS transistor Q26 becomes smaller than that of the MOS transistor Q27, which in turn entirely discharges the mirror current supplied from the MOS transistor P22, and the voltage level of the node A26 is reduced to a low level. The CMOS invertors 54 and 56 amplify and output an output signal from the differential amplifier 52. Between the times t0 and t1, i.e., while the voltage level of the node A21 is higher than that of the node A22, therefore, the clock generation activation signal LW is in an active state of a high level as shown in FIG. 31. When the voltage Vpp−Vth exceeds the reference voltage VREF, on the other hand, the voltage level of the node A22 exceeds that of the node A21 and the clock generation activation signal LW enters an inactive state of a low level.

When the high voltage Vpp is used in a circuit operation and its voltage level is reduced, the voltage level of the node A22 becomes lower than that of the node A21 again, and the clock generation activation signal LW enters an active state of a high level.

In the structure of the Vpp level detection circuit 20ca shown in FIG. 30, the reference voltage VREF is compared with the voltage Vpp−Vth, and the clock generation activation signal LW is activated/inactivated in accordance with the result of the comparison.

The Vpp level detector 50 shown in FIG. 30 includes only the n-channel MOS transistors Q20 to Q25, to be capable of canceling influence due to variation of temperature characteristics (the nodes A21 and A22 output a differential signal) by utilizing the MOS transistors Q20 to Q25 of the same size to stably detect the high voltage Vpp. Further, the voltage levels of the nodes A21 and A22 are set in response to the difference between the gate voltages of the MOS transistors Q21 and Q22. The voltage levels of the nodes A21 and A22 change in accordance with the gate voltages of the MOS transistors Q21 and Q22, and the voltage change quantities are decided in accordance with the currents flowing in the MOS transistors Q21, Q22, Q23 and Q24. Therefore, the Vpp level detector 50 is a current controlled level detection circuit, and can compare the reference voltage VREF with the voltage Vpp−Vth at a high speed. Further, this current controlled level detection circuit can implement low current consumption by reducing the quantity of the flowing current (operating current).

The MOS transistors Q21 and Q22, which merely form resistance dividing circuits by channel resistance with the MOS transistors Q23 and Q24 respectively, perform operations similar to that of a so-called level shift circuit while performing no voltage amplification.

Since the Vpp level detector 50 is formed only by the n-channel MOS transistors Q20 to Q25, it is not necessary to form p- and n-channel MOS transistors in separate well regions and the circuit occupation area can be reduced (no P-N isolation region may be provided).

Further, the Vpp level detector 50, which simply receives the high voltage Vpp on its gate, shifts the level thereof, transmits the shifted voltage and compares the same with the reference voltage VREF, can perform correct level detection as compared with a current mirror differential amplifier of a CMOS structure such as the differential amplifier 52. When the n-channel MOS transistors Q26 and Q27 are employed as a comparison stage in case of comparing the reference voltage VREF with the high voltage Vpp in the differential amplifier 52, for example, the conductance values of these transistors are increased so that no correct detection can be performed since the conductance difference between the n-channel MOS transistors Q26 and A27 forming the comparison stage cannot be so increased in a high voltage region.

In case of supplying the reference voltage VREF and the high voltage Vpp to the gates of p-channel MOS transistors, further, a voltage higher than the external power supply voltage EXVD cannot be compared, and the same must be compared in the p-channel MOS transistors after its level is shifted through a voltage-down (level shift) circuit. When a voltage dividing circuit dividing the high voltage Vpp at a high dividing ratio is employed in this case, the voltage dividing circuit reduces the change amount of the high voltage Vpp and hence the level cannot be precisely detected.

Therefore, it is possible to correctly detect the level of the high voltage Vpp by employing the same conductivity type MOS transistors and the current controlled level shift circuit as shown in FIG. 30. It is possible to drive the differential amplifier 52 in its most sensitive region by supplying the output signal of the Vpp level detector 50 to the n-channel MOS transistors Q26 and Q27 of the differential amplifier 52, thereby guaranteeing correct level detection.

The MOS transistors P24 and Q28 in the CMOS invertor 54 control the charge/discharge current of this CMOS invertor 54, for preventing abrupt change of the voltage of the node A27. Even if the voltage level of the node A26 repetitively changes rapidly between high and low levels, repetitive rapid change of the clock generation activation signal LW is prevented, and stable high voltage generation (operation of generating a charge pump clock signal) is guaranteed.

The high voltage Vpp, whose level is shifted to be transmitted to the node A20, is at a voltage level higher than the external power supply voltage EXVD (Vpp≧EXVD+ Vth).

When the activation control signal ZENA is in an inactive state of a high level, the path of the current flowing from the power supply node PS to the ground node is cut off in the Vpp level detector 50, to stop level detection. Also in the differential amplifier 52, the MOS transistor P20 enters an OFF state, the path of the operation current of the differential amplifier 52 is cut off, and differential amplification operation of the differential amplifier 52 is stopped. The MOS transistor 53 enters an ON state in response to the rising edge of the activation control signal ZENA, to hold the node A26 at the ground voltage level. This is for the purpose of preventing both MOS transistors P22 and Q27 from entering OFF states to put the node A26 in the floating state in inactivation of the differential amplifier 52, thereby preventing the voltage level of the node A26 from being unstabilized.

[Structure 2 of Vpp Level Detector]

Figure 32:
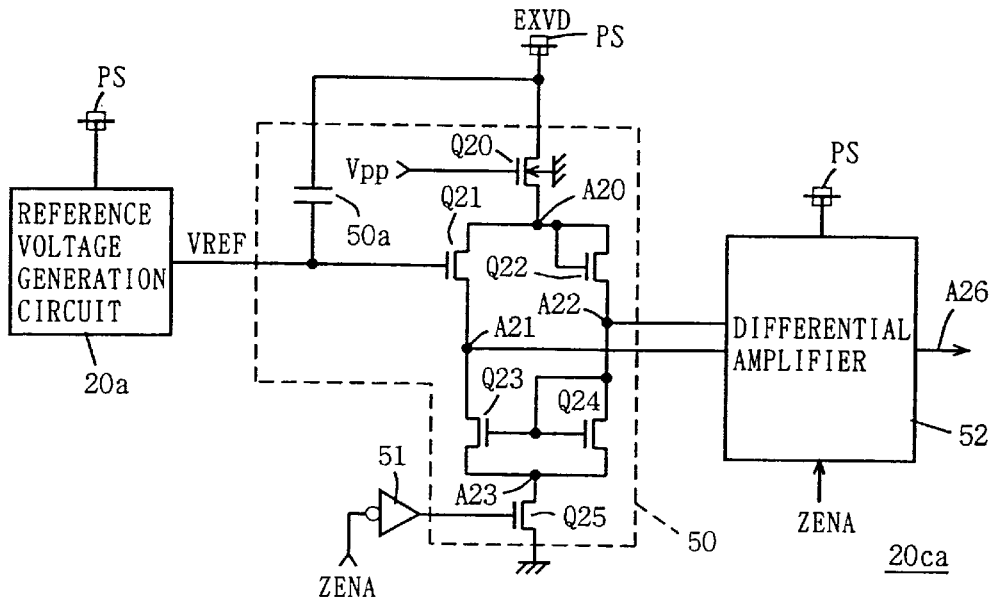
FIG. 32 illustrates a second structure of the Vpp detection circuit shown in FIG. 5.

FIG. 32 illustrates a second structure of the Vpp level detection circuit 20ca. This figure shows the structure of Vpp level detector 50. Referring to FIG. 32, the Vpp level detector 50 includes a capacitive element 50a connected between a power supply node PS and the gate of an n-channel MOS transistor Q21. The remaining structure of this Vpp level detection circuit 20ca is identical to that shown in FIG. 30, and corresponding parts are denoted by the same reference numerals, to omit the description thereof The capacitive element 50a capacitively couples the power supply node PS with the gate of the MOS transistor Q21. The MOS transistor Q21 is supplied on its gate with the reference voltage VREF from the reference voltage generation circuit 20a. The reference voltage generation circuit 20a has a high output impedance and supplies an extremely small current, as previously shown in FIG. 29. Therefore, the gate of the MOS transistor Q21 is equivalently connected with a high impedance element, and change of the external power supply voltage EXVD on the power supply node PS can be transmitted to the gate of the MOS transistor Q21 at a high speed.

A target voltage level of the node A20 is Vpp−Vth. When both of the external power supply voltage EXVD and the reference voltage VREF are stable, the MOS transistor Q20 transmits the voltage Vpp−Vth to the node A20. In a stable state, the voltage level of the voltage Vpp−Vth is substantially equal to that of the reference voltage VREF.

Figure 33:
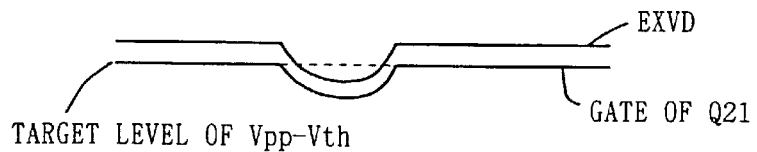
FIG. 33 illustrates an effect of a capacitive element shown in FIG. 32.

Consider that noise is superposed on the power supply node PS and the external power supply voltage EXVD becomes lower than the target voltage level Vpp−Vth as shown in FIG. 33. The MOS transistor Q20 receives the high voltage Vpp on its gate. When the voltage level of the power supply node PS becomes lower than the level of the reference voltage VREF, i.e., the voltage level of the node A20, the MOS transistor Q20 has the power supply node PS serving as a source thereof, to reduce the voltage level of the node A20 so that the voltage level of the node A20 reaches the level of the external power supply voltage EXVD. In this state, the external power supply voltage EXVD is lower than the reference voltage VREF, whereby the voltage level of a node A21 exceeds that of a node A22 and the Vpp level detector 50 outputs a signal indicating that the high voltage Vpp has not reached a prescribed voltage level for driving the clock activation signal LW to an active state through a differential amplifier 52 and the CMOS invertors 54 and 56 shown in FIG. 30. In this state, the high voltage Vpp is generated in accordance with the noise on the power supply node PS, regardless of the level thereof.

The change speed of the high voltage Vpp is sufficiently slower than that of the power supply noise. While the reference voltage VREF is generated from the external power supply voltage EXVD, merely a small current flows by a constant current source transistor and a high-resistance load MOS transistor of an output stage thereof, and the reference voltage VREF from the reference voltage generation circuit 20a does not follow the change of the external power supply voltage EXVD. When the voltage level of the external power supply voltage EXVD abruptly changes by noise or the like, the voltage level of the gate of the MOS transistor Q21 changes while the voltage difference between the external power supply voltage EXVD and the reference voltage VREF remains unchanged due to capacitive coupling of the capacitive element 50a, as shown in FIG. 32. Even if the external power supply voltage EXVD is transmitted to the node A20 through the MOS transistor Q20 due to influence by noise or the like, therefore, the reference voltage VREF is lower than the voltage level of the node A20 and the clock activation signal LW is not activated. When the voltage level of the high voltage Vpp is reduced in accordance with change of the external power supply voltage EXVD, the MOS transistor Q20 operates as a level shift element again for transmitting the voltage Vpp−Vth to the node A20, and the reduced reference voltage VREF is compared with the voltage Vpp−Vth.

Due to the provision of the capacitive element 50a, therefore, it is possible to prevent the dock activation signal LW for activating generation of the high voltage Vpp from being driven to an active state when noise is superposed on the power supply node PS regardless of the voltage level of the high voltage Vpp, thereby guaranteeing stable level detection.

When noise is superposed on the reference voltage VREF from the reference voltage generation circuit 20a, this noise is transmitted to the power supply node PS through the capacitive element 50a. However, the power supply node PS has a large load capacitance by a power supply line or the like, and influence of the noise from the reference voltage VREF exerted on the external power supply voltage EXVD can be substantially neglected. When the noise is superposed on the external power supply voltage EXVD and its voltage level increases, the capacitive element 50a increases the voltage level of the gate of the MOS transistor Q21. In this case, a high-resistance resistive element of the reference voltage generation circuit 20a relatively slowly discharges the noise since a p-channel MOS transistor for supplying a constant current enters an OFF state in this state. Therefore, influence on the level detection can be substantially neglected in this case.

Due to the provision of the capacitive element 50a shown in FIG. 32, therefore, the voltage level of the reference voltage VREF supplied to the gate of the MOS transistor Q21 can be reduced in response when noise is superposed on the power supply node PS to reduce the voltage level of the external power supply voltage EXVD, thereby guaranteeing stable level detection.

In the start of power supply, further, the reference voltage level of the reference voltage generation circuit 20a is also pulled up through the capacitive element 50a in response to voltage level increase of the power supply voltage EXVD of the power supply node PS, whereby the reference voltage VREF can be brought into a stable state at a relatively fast timing.

Particularly when the difference between the voltage levels of the external power supply voltage EXVD and the reference voltage VREF is reduced under such a low power supply voltage condition that the voltage level of the external power supply voltage EXVD is low, the level of the high voltage Vpp can be stably detected under such a low power supply voltage EXVD.

[Structure 3 of Vpp Level Detector]

Figure 34:
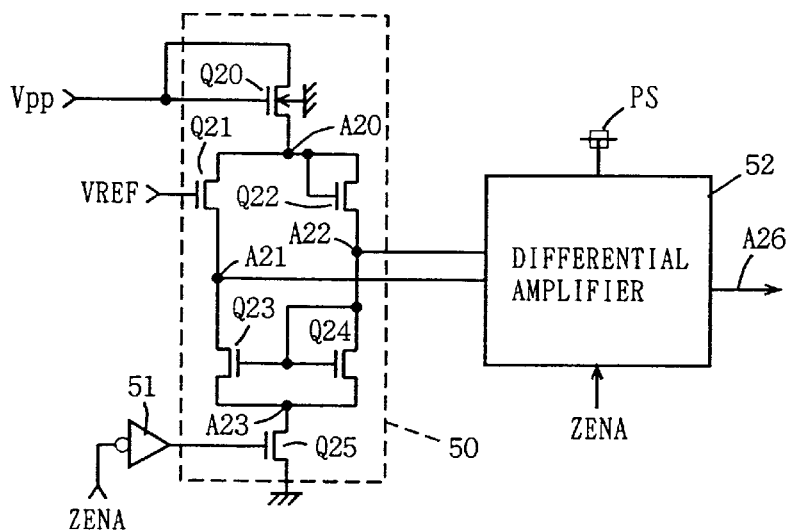
FIG. 34 illustrates a third structure of the Vpp detection circuit shown in FIG. 5.

FIG. 34 illustrates a third structure of the Vpp level detection circuit 20ca. This figure shows the structure of a Vpp level detector 50. In the Vpp level detector 50 shown in FIG. 34, the gate and the drain of an n-channel MOS transistor Q20 for level shifting are interconnected with each other to receive the high voltage Vpp. The remaining structure of this Vpp level detection circuit 20ca is identical to that shown in FIG. 30, and corresponding parts are denoted by the same reference numerals to omit the description thereof.

In the structure of the Vpp level detector 50 shown in FIG. 34, the MOS transistor Q20 and a MOS transistor Q22 regularly operate in the saturated region. Further, a MOS transistor Q21 can have the gate and drain voltages substantially equalized with each other, to be capable of satisfying a saturated region operation condition (Vds≧Vgs−Vthn). More specifically, $$Vpp-Vth20 \geq VREF-Vth21,$$

Vpp≧VREF−(Vth21−Vth20), where Vth20 and Vth21 represent the threshold voltages of the MOS transistors Q20 and Q21 respectively. The threshold voltage of the MOS transistor Q20, whose substrate region is connected to ground node, increases due to a relatively large substrate bias effect, while it is possible to satisfy the saturated region operating condition by substantially equalizing the threshold voltages Vth20 and Vth21 with each other.

Therefore, all MOS transistors Q20, Q21 and Q22 performing voltage level shift operations operate in saturated regions, for attaining stable operations.

Further, external power supply voltage EXVD is not supplied to the Vpp level detector 50, to exert no influence on the voltage level of the node A20. Also when the voltage level of the high voltage Vpp exceeds that of the external power supply voltage EXVD, therefore, the level of the high voltage Vpp can be stably detected (when the MOS transistor Q21 operates in a non-saturated region, its drain voltage rapidly changes in response to change of the voltage level of the node A20, and the voltage level of the node A21 rapidly changes in response). Thus, the level of the high voltage Vpp can be relatively slowly detected in a stable manner.

Figure 35:
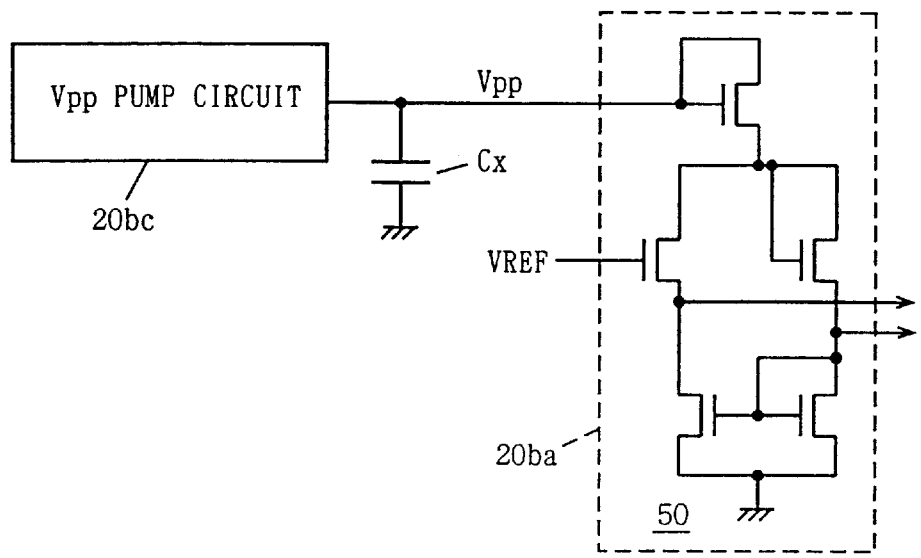
FIG. 35 illustrates the structure of a Vpp level detection circuit.

FIG. 35 illustrates the structure of the Vpp level detection circuit 20ba included in the standby high voltage generation circuit 20b. The high voltage Vpp from the Vpp pump circuit 20bc is supplied to the initial stage level detector 50 of the Vpp level detection circuit 20ba. The high voltage Vpp from the Vpp pump circuit 20bc is utilized as one operating power source for the Vpp level detector 50 of the Vpp level detection circuit 20ba. The standby Vpp generation circuit 20b operates in a standby cycle, and hence its current consumption is made sufficiently small. In the Vpp level detection circuit 20ba, the Vpp level detector 50 consumes a current of about several $\mu A$, for example (current consumption is reduced by adjusting the transistor size).

A capacitive element Cx for stabilizing the high voltage Vpp is provided on an output node of the Vpp pump circuit 20bc. If the capacitance value of the capacitive element Cx is about 20 to 30 nF, a time of several 100 $\mu S$ is required for reducing the high voltage Vpp by 0.1 V. Even if the Vpp level detector 50 consumes the high voltage Vpp in the Vpp level detection circuit 20ba while only the standby Vpp generation circuit 20b operates, therefore, the current suppliability of the Vpp pump circuit 20bc included in the standby Vpp generation circuit 20b can sufficiently compensate for the consumed current (when an active cycle starts, the active Vpp generation circuit having high drivability operates to drive the high voltage Vpp to a prescribed voltage level). Therefore, the Vpp level detection circuit 20ba can be stably driven without particularly increasing current consumption of the standby Vpp generation circuit 20b.

[Structure 4 of Vpp Level Detector]

Figure 36:
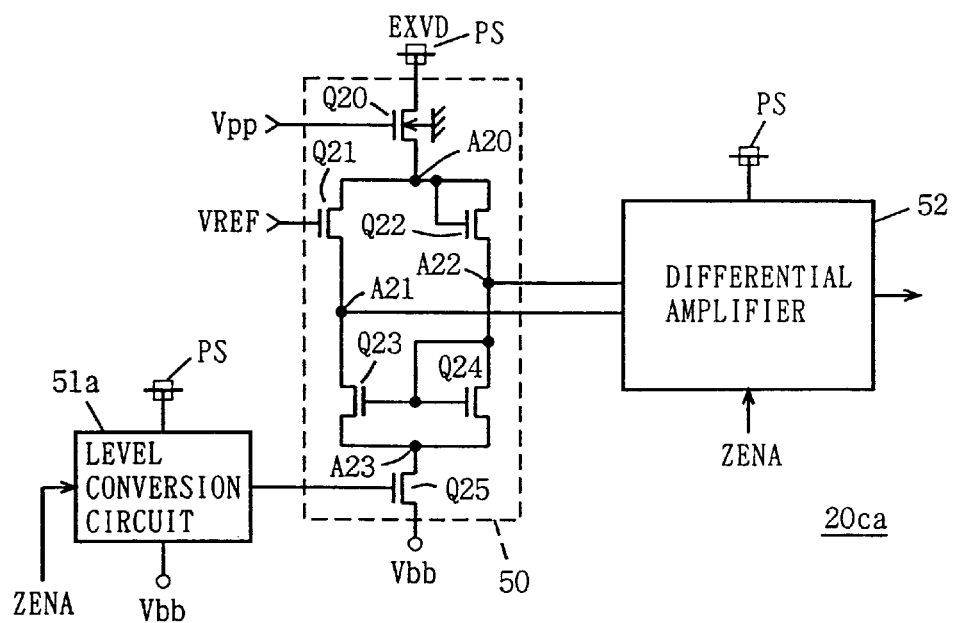
FIG. 36 illustrates a fourth structure of the Vpp detection circuit shown in FIG. 5.

FIG. 36 illustrates a fourth structure of the Vpp level detection circuit 20ba. This figure also shows the structure of a Vpp level detector 50. In the Vpp level detector 50 shown in FIG. 36, a negative voltage Vbb is supplied to the source of a current source transistor Q25. Therefore, a level conversion circuit 51a converts the activation control signal ZENA to a signal changing between the external power supply voltage EXVD and the negative voltage Vbb level.

The lower limit of the reference voltage VREF is limited, since it is necessary to hold MOS transistors Q21 and Q23 in ON states. Further, the lower limit of the external power supply voltage EXVD is determined by the reference voltage VREF since a voltage of the level of the reference voltage VREF must be transmitted to a node A20. Therefore, the lower limit of the external power supply voltage EXVD is also limited. The voltage level of the reference voltage VREF can be reduced by utilizing the negative voltage Vbb as another power supply voltage for the Vpp level detector 50. Therefore, the lower limit of the external power supply voltage EXVD can also be reduced in response, the lower limit value of the operating power supply voltage EXVD for the Vpp level detector 50 can be reduced, an operating margin for the external power supply voltage EXVD can be widened, and stable Vpp level detection can be guaranteed.

[Structure 5 of Vpp Level Detector]

Figure 37:
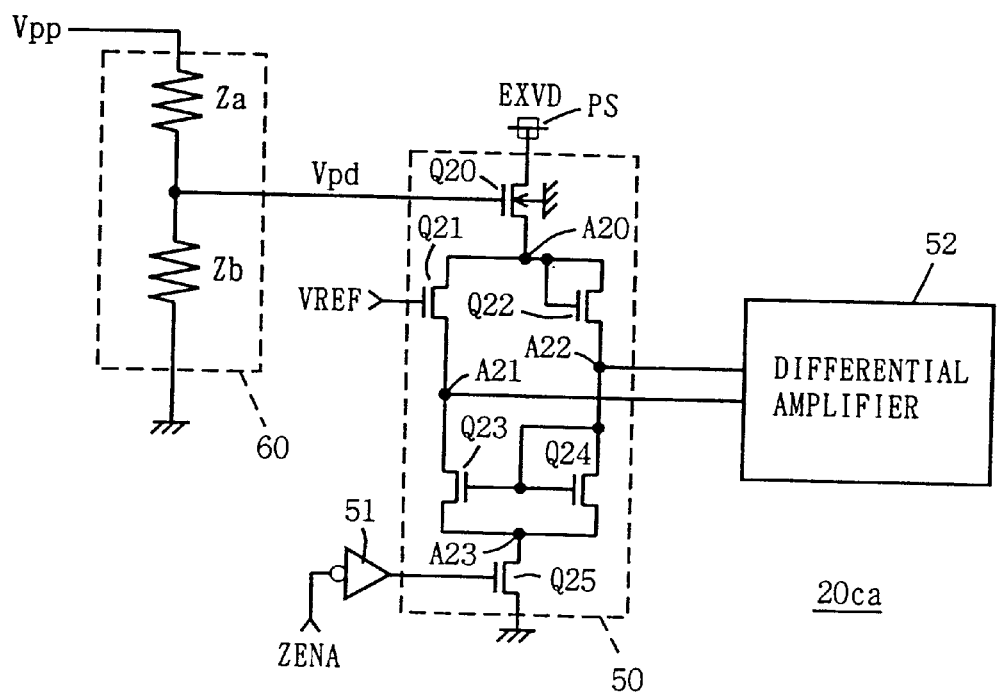
FIG. 37 illustrates a fifth structure of the Vpp detection circuit shown in FIG. 5.

FIG. 37 illustrates a fifth structure of the Vpp level detection circuit 20ca. This figure also shows the structure of a Vpp level detector 50. In the Vpp level detection circuit 20ca shown in FIG. 37, a voltage dividing circuit 60 is provided for dividing the high voltage Vpp with a prescribed ratio to generate a voltage Vpd. The voltage Vpd from the voltage dividing circuit 60 is supplied to the gate of a MOS transistor Q20 of the Vpp level detector 50. The remaining structure of this Vpp level detection circuit 20ca is identical to that shown in FIG. 30, and corresponding parts are denoted by the same reference numerals.

The voltage dividing circuit 60 includes resistive elements Za and Zb serially connected between a node receiving the high voltage Vpp and a ground node. The voltage Vpd is outputted from the node between the resistive elements Za and Zb. The voltage level of the voltage Vpd is expressed as follows:

$$Vpd = Zb/(Za+Zb)$$

The node A20 is at the reference voltage VREF level. The external power supply voltage EXVD must be held at a voltage level higher than that of the voltage supplied to the node A20, so that the MOS transistor Q20 transmits a voltage corresponding to the level of the high voltage Vpp. Therefore, the lower limit of the external power supply voltage EXVD is determined by the voltage level of the node A20. Due to the employment of the voltage Vpd, the voltage transmitted to the node A20 is Vpd−Vth. The voltage Vpd is lower than the high voltage Vpp. Therefore, the lower limit of the external power supply voltage EXVD can be expressed as follows:

$$EXVD \geq Vpd - Vth$$

Therefore, the voltage level of the lower limit of the external power supply voltage EXVD can be reduced as compared with the structure of directly detecting the level of the high voltage Vpp.

If the high voltage Vpp is sufficiently higher than the external power supply voltage EXVD, the node A20 reaches the voltage level of the external power supply voltage EXVD. In this state, the MOS transistor Q21 operates in a non-saturated region, and a current flowing through the MOS transistor Q21 rapidly changes to change the voltage level of the node A21 at a high speed even if the reference voltage VREF slightly fluctuates. By employing the voltage dividing circuit 60 and setting the node A20 at the voltage level of Vpd−Vth, therefore, it is possible to drive the MOS transistor Q21 in a saturated region, to reduce sensitivity with respect to fluctuation of the reference voltage VREF, and to prevent rapid control for the high voltage Vpp caused by rapid change of the reference voltage VREF. If the high voltage Vpp rapidly changes and its voltage level increases, breakdown voltage of a gate insulation film of the MOS transistor Q21 forming the Vpp level detector 50 deteriorates.

On the other hand, the reference voltage VREF is readily influenced by noise due to a large output load of the reference voltage generation circuit 20a. When noise on the reference voltage VREF for superposition on an output node of the voltage dividing circuit 60, the level of the voltage Vpd changes. However, the voltage dividing circuit 60 voltage-divides the noise from the reference voltage VREF, and superposes the same on the high voltage Vpp. Thus, it is possible to stably hold the high voltage Vpp at a constant voltage level even if noise is caused on the reference voltage VREF. Therefore, the voltage dividing circuit 60 becomes more immune against the noise from the reference voltage VREF as its voltage dividing ratio Zb/(Za+Zb) approaches 1. Assuming that $\Delta V$ represents the magnitude of the noise superposed on the voltage Vpd, the magnitude of the noise superposed on the high voltage Vpp is expressed as follows:

$\Delta V(Za/(Za+Zb)$

When the voltage dividing ratio of the voltage dividing circuit 60 is close to 1, therefore, influence by the noise from the reference voltage VREF with respect to the high voltage Vpp can be sufficiently suppressed so that the high voltage Vpp can be stably held at a constant voltage level even if the reference voltage VREF fluctuates to cause a noise. When noise is superposed on the voltage Vpd, its influence is transmitted to the node A20 through the MOS transistor Q20, since the voltage Vpd can be set at a voltage level substantially identical to that of the external power supply voltage EXVD. Therefore, influence by the noise on the reference voltage VREF on the detecting operation of the Vpp level detector 50 is canceled.

The resistive elements Z1 and Z2 of the voltage dividing circuit 60 can be formed in a step of fabricating MOS transistors of the Vpp level detector 50 by employing polysilicon interconnection lines. The resistive elements Z1 and Z2 can be formed at desired resistance values by ion implantation or the like.

Figure 38:
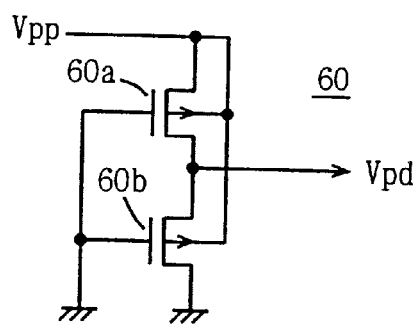
FIG. 38 is illustrates another structure of a voltage dividing circuit shown in FIG. 37.

FIG. 38 illustrates another structure of the voltage dividing circuit 60. Referring to FIG. 38, the voltage dividing circuit 60 includes p-channel MOS transistors 60a and 60b serially connected between a high voltage Vpp supply node and a ground node. The gates of the p-channel MOS transistors 60a and 60b are connected to the ground node. The p-channel MOS transistors 60a and 60b, whose channel resistances are relatively large, can readily form the voltage dividing circuit 60 of low current consumption by sufficiently reducing the values of the ratios β of the channel widths to the channel lengths. Further, it is possible to implement an optimum resistance ratio, i.e., an optimum voltage dividing ratio by adjusting surface ion concentrations of the channel regions of the MOS transistors 60a and 60b. By employing such p-channel MOS transistors 60a and 60b, the voltage dividing circuit 60 having a small occupying area, low current consumption and an optimum voltage dividing ratio can be readily implemented.

[Structure 6 of Vpp Level Detector]

Figure 39:
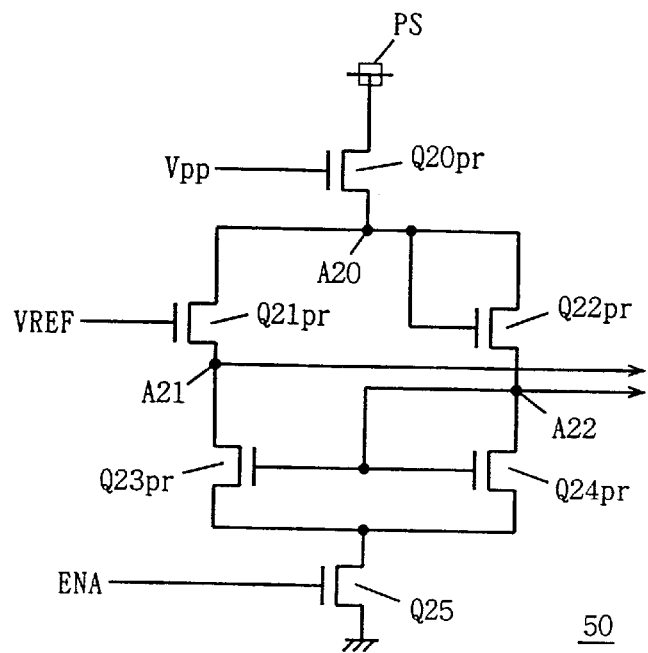
FIG. 39 illustrates a sixth structure of a Vpp detector included in the Vpp detection circuit shown in FIG. 5.

FIG. 39 illustrates a sixth structure of the Vpp level detector 50. Referring to FIG. 39, the Vpp level detector 50 includes n-channel MOS transistors Q20pr, Q21pr, Q22pr, Q23pr and Q24pr having variable (programmable) ratios of channel widths to channel lengths, and a current source transistor Q25 for activating the Vpp level detector 50. The MOS transistors Q20pr to Q24pr correspond to the MOS transistors Q20 to Q24 shown in FIG. 34.

Figure 40:
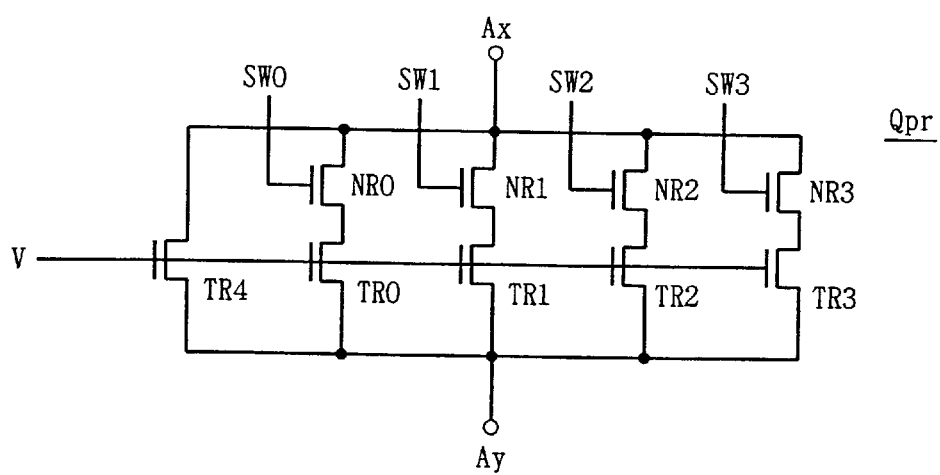
FIG. 40 illustrates the structure of a size-variable transistor shown in FIG. 39.

FIG. 40 illustrates an exemplary structure of a size-variable MOS transistor Qpr representing the MOS transistors Q20pr to Q24pr shown in FIG. 39. Referring to FIG. 40, the size-variable MOS transistor Qpr includes n-channel MOS transistors NR0, NR1, NR2 and NR3, provided in parallel with each other, having first conduction nodes (sources) connected to a node Ax, n-channel MOS transistors TR0 to TR3 serially connected with the MOS transistors NR0 to NR3 respectively, and an n-channel MOS transistor TR4 connected between the node Ax and a node Ay.

A voltage V depending on the position of the transistor Qpr is supplied to the gates of the MOS transistors TR0 to TR4. Tuning control signals SW0 to SW3 are supplied to the gates of the MOS transistors NR0 to NR3 respectively. These tuning control signals SW0 to SW3 are selectively set at high/low levels in a test operation, and the voltage levels thereof are fixedly set by a fuse element after completion of the test operation, to feed an optimum current between the nodes Ax and Ay.

The Vpp level detector 50 is formed by the size-variable MOS transistors Q20pr to Q24pr having the structure of the size-variable transistor Qpr shown in FIG. 40. The number of the MOS transistors TR0 to TR4 connected in parallel between the nodes Ax and Ay is adjusted by selectively setting the tuning control signals SW0 to SW3 at high/low levels, and the ratios β of the channel widths to the channel lengths of the size-variable transistors Q20pr to Q24pr are equivalently adjusted in response. Thus, it comes to that the channel resistance values of the size-variable transistors Q20pr to Q24pr are equivalently adjusted. When the voltage level of the node A21 rapidly fluctuates due to fluctuation of the reference voltage VREF, for example, the sensitivity of the MOS transistor Q21pr to the reference voltage VREF is weakened. More specifically, the size of the size-variable MOS transistor Q21pr is reduced as compared with that of the MOS transistor Q23pr. Even if the quantity of a current supplied by the MOS transistor Q21pr (channel resistance) fluctuates in accordance with the reference voltage VREF, the size-variable MOS transistor Q23pr absorbs this fluctuation to moderate the change of the voltage level of the node A21. Thus, the level of the high voltage Vpp can be slowly changed with no influence by rapid change of the reference voltage VREF.

As hereinabove described, it is possible to detect the level of the high voltage Vpp with slightly weakened sensitivity to fluctuation of the reference voltage VREF by rendering the sizes (the ratios of the channel widths to the channel lengths) of the MOS transistors Q20pr to Q24pr changeable (programmable) in the Vpp level detector 50, thereby stably detecting the level of the high voltage Vpp regardless of fluctuation of the reference voltage VREF.

In the structure of each of the Vpp level detectors 50 shown in FIGS. 32 to 39, the source of the current source transistor Q25 is connected to the ground node. However, the current source transistor Q25 may be arranged between a level shifting n-channel MOS transistor and the power supply node PS by employing a p-channel MOS transistor.

[Embodiment 4: Structures of Clock Generation Circuit and Vpp Pump Circuit]

Figure 41:
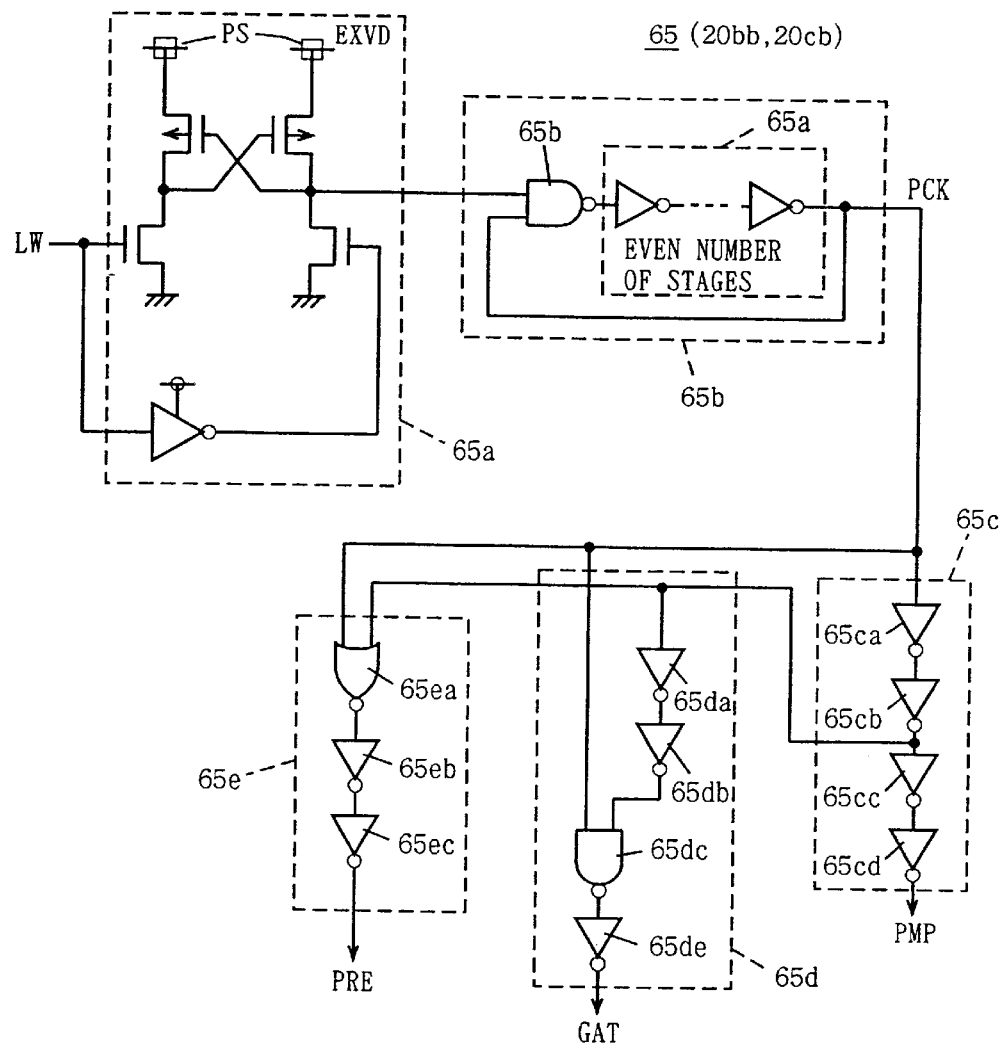
FIG. 41 illustrates the structure of a clock generation circuit shown in FIG. 5.

FIG. 41 illustrates the structure of the clock generation circuit 20bb or 20cb shown in FIG. 5. The clock generation circuits 20bb and 20cb included in the standby Vpp generation circuit 20b and the active Vpp generation circuit 20c respectively have the same structure, and hence they are represented by a clock generation circuit 65 in FIG. 41.

Referring to FIG. 41, the clock generation circuit 65 includes a level conversion circuit 65a converting the amplitude of the clock generation activation signal LW to the level of the external power supply voltage EXVD, a ring oscillator 65b selectively activated in response to an output signal from the level conversion circuit 65a for oscillating and outputting a pump control signal PCK, a gate circuit 65c outputting a pump clock signal PMP in accordance with the pump control signal PCK from the ring oscillator 65b, a gate circuit 65d generating a gate clock signal GAT determining a charge supply period in accordance with the pump control signal PCK and an output signal of the gate circuit 65c, and a gate circuit 65e generating an internal node precharge clock signal PRE in accordance with the output signal of the gate circuit 65c and the pump control signal PCK.

The level conversion circuit 65a is required when the output signal LW from the Vpp level detector 50 at the front stage is at the level of the internal power supply voltage INVD. In case of using the high voltage Vpp as one operating power supply voltage in the Vpp level detector 50 as shown in FIG. 34, for example, an operating power supply voltage of the differential amplifier 52 and CMOS invertor at the subsequent stage is set at the internal power supply voltage INVD, in order to reduce current consumption and to prevent reduction of the level of the high voltage Vpp. If the differential amplifier 52 and the CMOS invertor operate using the external power supply voltage EXVD as one operating power supply voltage in another structure, however, the level conversion circuit 65a is unnecessary.

The ring oscillator 65b includes an invertor train 65a including an even number of stages of cascaded invertors, and a NAND circuit 65b receiving output signals of the level conversion circuit 65a and the invertor train 65a and supplying its output signal to the invertor train 65a. The ring oscillator 65b is activated when the output signal of the level conversion circuit 65a is at a high level of the external power supply voltage EXVD, and outputs the pump control signal PCK having a prescribed cycle. When the output signal of the level conversion circuit 65a is at a low level, on the other hand, the ring oscillator 65b is inactivated and the pump control signal PCK is fixed at a high level.

The gate circuit 65c includes four stages of cascaded invertors 65ca to 65cd for delaying the pump control signal PCK. The pump clock signal PMP is obtained by delaying the pump control signal PCK by a prescribed time.

The gate circuit 65d includes an invertor 65da receiving an output signal of the invertor 65cb included in the gate circuit 65c, an invertor 65db receiving an output signal of the invertor 65da, a NAND circuit 65dc receiving an output signal of the invertor 65db and the pump control signal PCK, and an invertor 65de receiving an output signal of the NAND circuit 65dc and outputting the gate clock signal GAT. The gate circuit 65d is a rising edge delay circuit delaying the rising edge of the pump control signal PCK. Therefore, the gate clock signal GAT rises with a delay by a prescribed time from the rising edge of the pump control signal PCK, and falls in synchronization with the falling edge of the pump control signal PCK.

The gate circuit 65e includes a NOR circuit 65ea receiving the output signal of the invertor 65cb included in the gate circuit 65c, an invertor 65eb receiving an output signal of the NOR circuit 65ea, and an invertor 65ec receiving an output signal of the invertor 65eb and outputting the precharge clock signal PRE. The gate circuit 65e is an inverting falling edge delay circuit generating and inverting a signal which falls in synchronization with the rising edge of the pump control signal PCK and rises after a lapse of a prescribed time from the falling edge of the pump control signal PCK.

One operating power supply voltage for the ring oscillator 65b and the gate circuits 65c to 65e is the external power supply voltage EXVD, and the amplitudes of the pump control signal PCK and the clock signals PMP, GAT and PRE are equal to the external power supply voltage EXVD.

Figure 42:
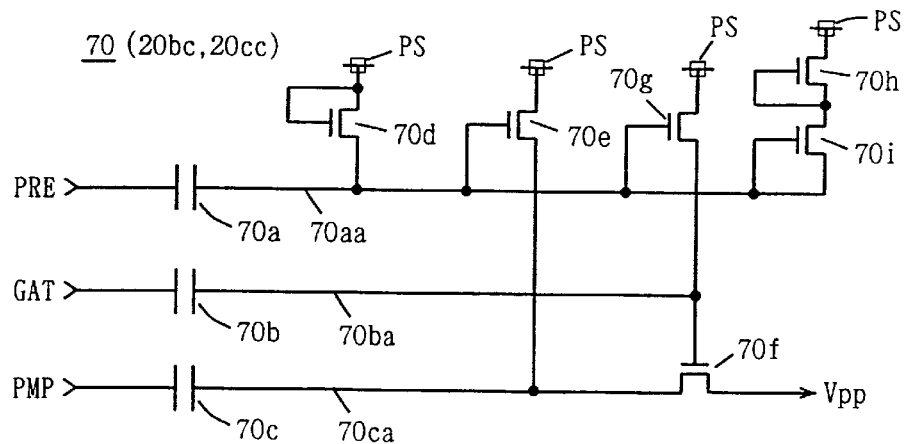
FIG. 42 illustrates the structure of a Vpp pump circuit shown in FIG. 5.

FIG. 42 illustrates an exemplary structure of the Vpp pump circuit 20bc or 20cc shown in FIG. 5. The Vpp pump circuits 20bc and 20cc having the same structure are represented by a Vpp pump circuit 70 in FIG. 42.

Referring to FIG. 42, the Vpp pump circuit 70 includes a capacitive element 70a receiving the precharge clock signal PRE, a capacitive element 70b receiving the gate clock signal GAT, a capacitive element 70c receiving the pump clock signal PMP, a precharging n-channel MOS transistor 70d connected between a power supply node PS and an output node 70aa of the capacitive element 70a, an n-channel MOS transistor 70e made conductive in response to a signal voltage on the node 70aa for electrically connecting the power supply node PS with an output node 70ca of the capacitive element 70c, an n-channel MOS transistor 70g precharging an output node 70ba of the capacitive element 70b at the power supply voltage EXVD level in response to the signal voltage of the node 70aa, n-channel MOS transistors 70h and 70i connected between a power supply node PS and the node 70aa, and an n-channel MOS transistor 70f made conductive in response to a signal voltage on the node 70ba for supplying charges from the node 70ca to an output node to generate the high voltage Vpp.

The n-channel MOS transistor 70d has a gate and one conduction node connected to the power supply node PS, and precharges the node 70aa at a voltage level of EXVD−Vthn. Each of the n-channel MOS transistors 70h and 70i has one conduction node connected to a gate thereof and clamps the node 70aa at a voltage level of EXVD+2Vthn in conduction thereof, where Vthn represents the threshold voltages of the MOS transistors 70d, 70h and 70i.

Figure 43:
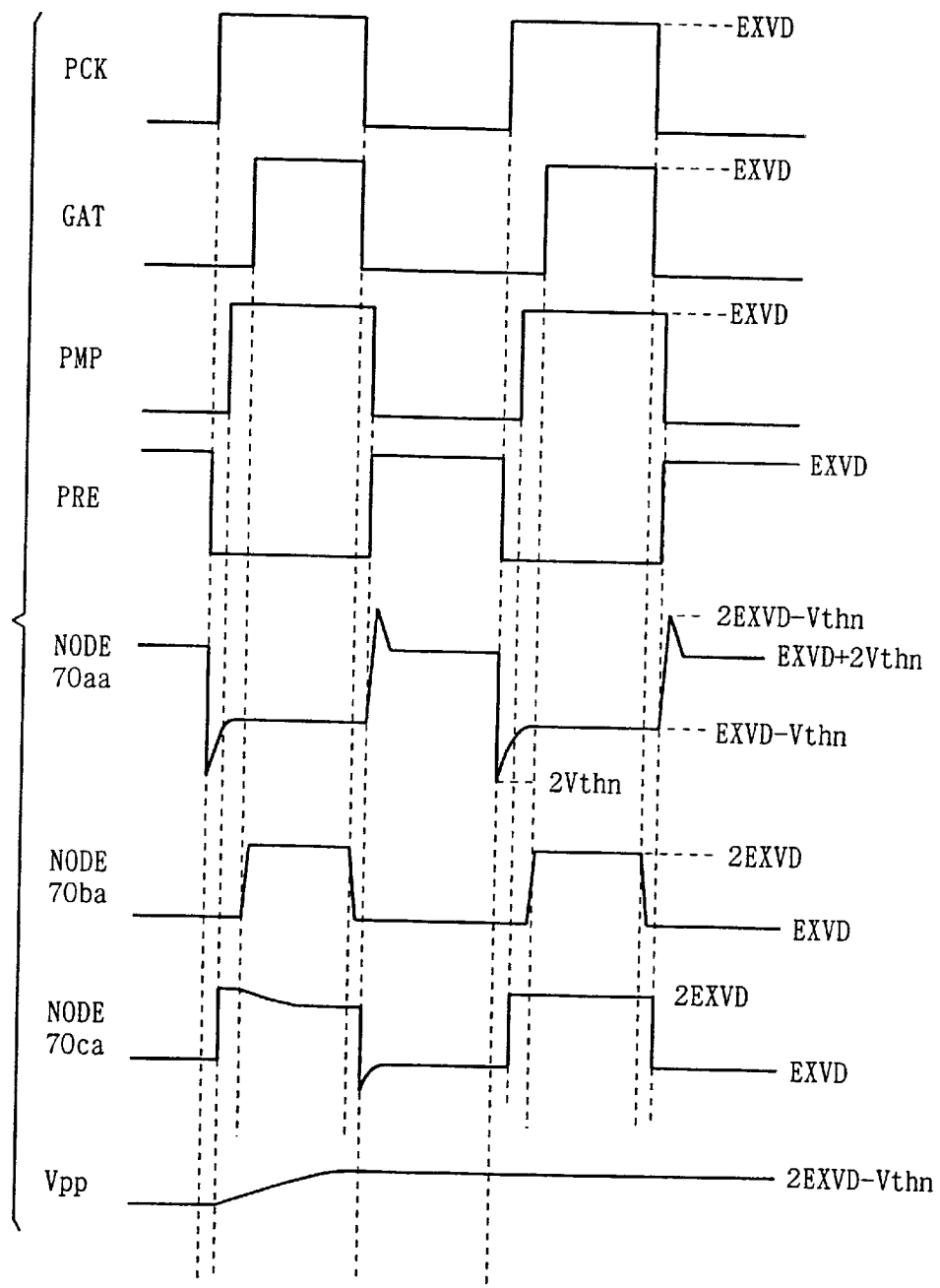
FIG. 43 is a signal waveform diagram representing an operation of the circuits shown in FIGS. 41 and 42.

The operations of the clock generation circuit 65 and the Vpp pump circuit 70 shown in FIGS. 41 and 42 are now described with reference to a signal waveform diagram shown in FIG. 43.

When the pump control signal PCK rises from a low level to a high level, the precharge clock signal PRE falls to a low level. Thus, the voltage level of the node 70aa reduces by capacitive coupling of the capacitive element 70a, the MOS transistor 70d enters an ON state, and the node 70aa is precharged at the voltage level of EXVD−Vthn. In this state, all MOS transistors 70e, 70g, 70h and 70i enter OFF states. Then, the pump clock signal PMP rises to a high level, and the voltage level of the node 70ca increases from the level of the external power supply voltage EXVD precharged by the MOS transistor 70g to a voltage level of 2·EXVD, due to capacitive coupling of the capacitive element 70c. In this state, the node 70ba is at the voltage level of the external power supply voltage EXVD, and the MOS transistor 70f is in an OFF state.

Then, the gate clock signal GAT rises to a high level, whereby the voltage of the node 70ba increases from the level of the external power supply voltage EXVD to the voltage level of 2·EXVD due to capacitive coupling of the capacitive element 70b. Thus, the MOS transistor 70f conducts, the node 70ca supplies charges to the output node, and the voltage level of the high voltage Vpp increases. When the voltage level of the node 70ca becomes equal to that of the high voltage Vpp at the output node, the MOS transistor 70f stops the charge supplying operation. Finally, the high voltage Vpp can be increased to a voltage level of 2·EXVD−Vthn.

Then, the pump control signal PCK falls to a low level, whereby the gate clock signal GAT falls to a low level and the voltage level of the node 70ba reduces from the voltage level of 2·EXVD to that of the external power supply voltage EXVD due to capacitive coupling of the capacitive element 70b. The MOS transistor 70f enters an OFF state in response. Then, the pump clock signal PMP falls from a high level to a low level, and the voltage level of the node 70ca reduces. At this time, the precharge clock signal PRE rises to a high level, the voltage of the node 70aa increases from the voltage level of EXVD−Vthn to the voltage level of 2·EXVD−Vthn, and the node 70aa is precharged at a level of EXVD+2·Vthn due to clamp operations of the MOS transistors 70h and 70i. Further, the MOS transistors 70e and 70g enter ON states, to precharge the nodes 70ba and 70ca at the level of the external power supply voltage EXVD respectively. This operation is thereafter so repeated so that the node 70ca supplies charges to the output node until the high voltage Vpp reaches a prescribed voltage level below 2·EXVD−Vthn.

In the Vpp pump circuit 70 shown in FIG. 42, the maximum voltage difference between the nodes 70aa and 70ba is at the voltage level of EXVD−Vthn, and that between the nodes 70ba and 70ca is at the level of the external power supply voltage EXVD. Therefore, it is possible to prevent gate insulation films of the MOS transistors 70d to 70i forming the Vpp pump circuit 70 from receiving of a large voltage, and the high voltage Vpp can be stably generated.

[Structure 2 of Vpp Pump Circuit]

Figure 44A:
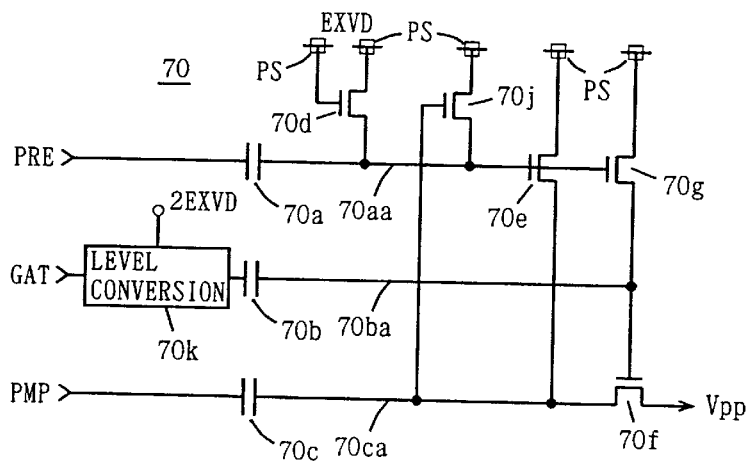
FIG. 44A illustrates another structure of the Vpp pump circuit shown in FIG. 5.

FIG. 44A illustrates a second structure of the Vpp pump circuit 70. In the Vpp pump circuit 70 shown in FIG. 44A, a level conversion circuit 70k converts the amplitude of the gate clock signal GAT to the voltage level of 2·EXVD. In place of the MOS transistors 70h and 70i for clamping the voltage level of the output node 70aa of the capacitive element 70a, this Vpp pump circuit 70 is provided with an n-channel MOS transistor 70j holding the node 70aa at the external power supply voltage EXVD level in response to a signal potential of an output node 70ca of a capacitive element 70c. The remaining structure of this Vpp pump circuit 70 is identical to that shown in FIG. 42, and corresponding parts are denoted by the same reference numerals, to omit the description thereof.

Figure 44B:
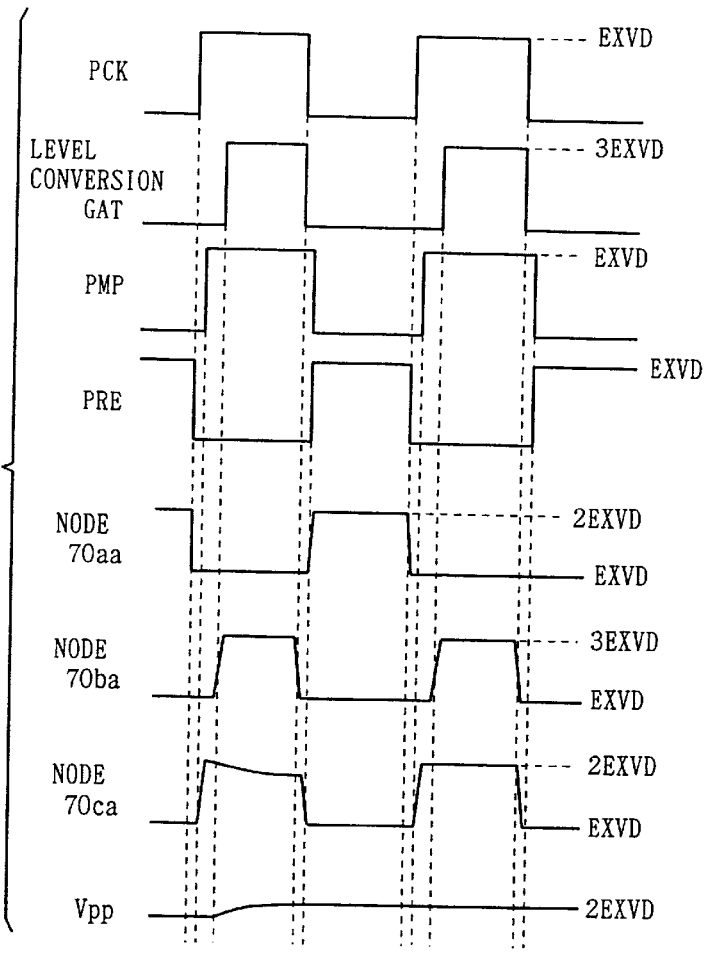
FIG. 44B is a signal waveform diagram representing an operation of the pump circuit shown in FIG. 44A.

The operation of the Vpp pump circuit 70 shown in FIG. 44A is now described with reference to a signal waveform diagram shown in FIG. 44B. When the precharge clock signal PRE falls to a low level in response to rise of the pump control signal PCK, the voltage level of the node 70aa is reduced. A MOS transistor 70d holds the voltage level of the node 70aa not to reduce below EXVD−Vth. Then, the pump clock signal PMP rises to a high level, and the voltage level of the node 70ca falls from a precharge voltage level (EXVD level) to a voltage level of 2·EXVD. The MOS transistor 70j enters an ON state following increase of the voltage level of the node 70ca, to hold the node 70aa at the external power supply voltage EXVD level.

Then, the gate clock signal GAT rises and the voltage of the node 70ba increases from the precharge voltage level (EXVD level) to a level of 3·EXVD (a high level of a signal from a level conversion circuit 70k is 2·EXVD). The MOS transistors 70g and 70f enter OFF and ON states, respectively, following increase of the voltage level of the node 70ba, so that the node 70ca transmits charges to an output node for increasing the voltage level of the high voltage Vpp. When the voltage level of the node 70ca becomes equal to that of the high voltage Vpp, transportation of the charges is stopped.

Then, the pump control signal PCK falls, whereby the gate clock signal GAT falls to a low level, the voltage level of the node 70ba is reduced to that of the external power supply voltage EXVD, and the MOS transistor 70f enters an OFF state. Then, the pump clock signal PMP falls and the precharge clock signal PRE rises, whereby the MOS transistor 70e enters an ON state to precharge the node 70ca at the external power supply voltage EXVD level. While the MOS transistor 70g also enters an ON state to precharge the node 70ba at the external power supply voltage EXVD level, the MOS transistor 70d is in an OFF state when the node 70aa is at the level of 2·EXVD.

The voltages of the nodes 70aa, 70ba and 70ca change between the voltage 2·EDVD and the voltage EXVD, between the voltage 3·EXVD and the voltage EXVD and between the voltage 2·EXVD and the voltage EXVD respectively when the level of the high voltage Vpp exceeds that of the external power supply voltage EXVD. Therefore, the high voltage Vpp can reach the level of the voltage 2·EXVD.

In the structure of the Vpp pump circuit 70 shown in FIG. 44A, the maximum voltage differences between the nodes 70aa and 70ba, between the nodes 70aa and 70ca and between the nodes 70ba and 70ca are 2·EXVD, EXVD and EXVD respectively. Therefore, a voltage applied to gate insulation films of the MOS transistors 70d, 70j, 70e and 70g is at the voltage level 2·EXVD at the maximum. The level conversion circuit 70k generates the voltage 2·EXVD, whereby the MOS transistors 70d, 70e, 70g and 70j can be formed by those identical to elements included in the level conversion circuit 70k, thereby guaranteeing the reliability of the gate insulation films.

As hereinabove described, the Vpp pump circuit 70 is so formed as to hold a precharge signal line node at the level of the external power supply voltage EXVD in a pump operation for generating the high voltage Vpp, whereby it is possible to prevent the gate insulation films of the MOS transistors from receiving an excess voltage, to guarantee breakdown voltage and to implement the Vpp pump circuit 70 stably generating the high voltage Vpp of a desired voltage level.

[Embodiment 5: Structure of Output High Voltage Generation Circuit]

Figure 45:
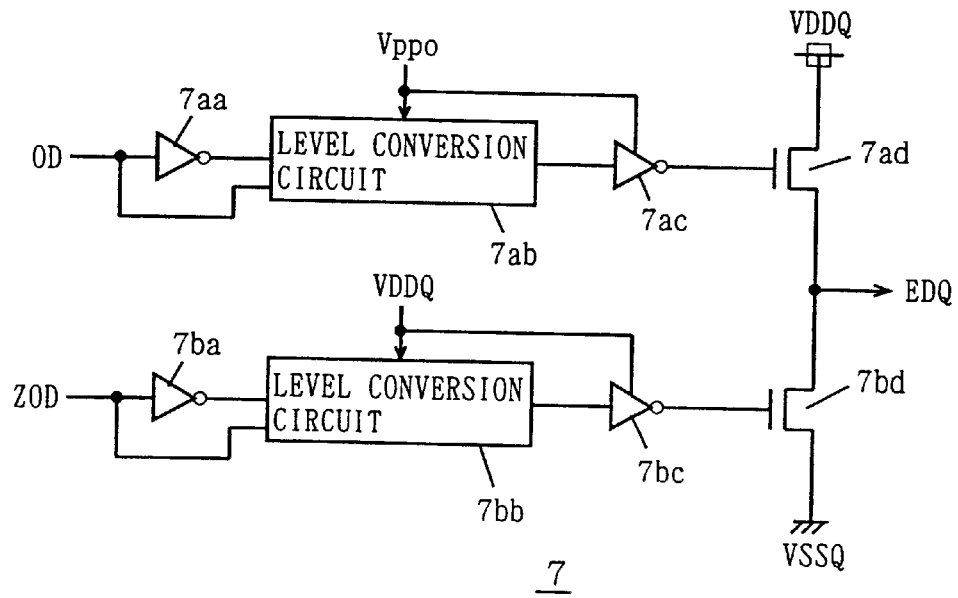
FIG. 45 illustrates the structure of an output circuit shown in FIG. 1.

FIG. 45 schematically illustrates the structure of the output circuit 7 shown in FIG. 1. Referring to FIG. 45, the output circuit 7 generates external read data EDQ in accordance with complementary internal read data OD and ZOD read from a selected memory cell of the memory cell array 2. The output circuit 7 includes an invertor 7aa receiving the internal read data OD, a level conversion circuit 7ab converting the amplitude of the internal read data OD to the level of the output high voltage Vppo in accordance with the internal read data OD and an output signal of the invertor 7aa, an invertor 7ac operating using the output high voltage Vppo as one operating power supply voltage for inverting an output signal of the level conversion circuit 7ab, and an n-channel MOS transistor 7ad made conductive when an output signal of the invertor 7ac is at a high level for driving the external read data EDQ to the level of the external power supply voltage VDDQ. The MOS transistor 7ad enters an OFF state when the output signal of the invertor 7ac is at a low level.

The output circuit 7 further includes an invertor 7ba inverting the complementary internal read data ZOD, a level conversion circuit 7bb converting the amplitude of the internal read data ZOD to the level of the external power supply voltage VDDQ in accordance with the internal read data ZOD and an output signal of the invertor 7ba, an invertor 7bc operating using the external power supply voltage VDDQ as one operating power supply voltage for inverting an output signal of the level conversion circuit 7bb, and an n-channel MOS transistor 7bd made conductive when an output signal of the invertor 7bc is at a high level for driving the external read data EDQ to the level of a ground voltage VSSQ. The invertors 7aa and 7ba operate using the internal power supply voltage INVD (Vccp) as one operating power supply voltage. The read data OD and ZOD have the amplitude of the voltage level of the internal power supply voltage INVD (Vcca: refer to FIG. 1).

The level conversion circuits 7ab and 7bb are similar in structure to those shown in FIGS. 3A and 41. The external power supply voltages VDDQ and VSSQ are supplied dedicatedly to the output circuit 7 through terminals different from those for the power supply voltages VDD and VSS for the internal circuit operation. Consider that the voltage levels of the output power supply voltage VDDQ and the device power supply voltage VDD are different from each other. The high voltage Vppo must be set at a voltage level higher than that of the output power supply voltage VDDQ.

Therefore, the voltage level of the output high voltage Vppo must be adjusted in accordance with the level (standard) of the output power supply voltage VDDQ.

Figure 46:
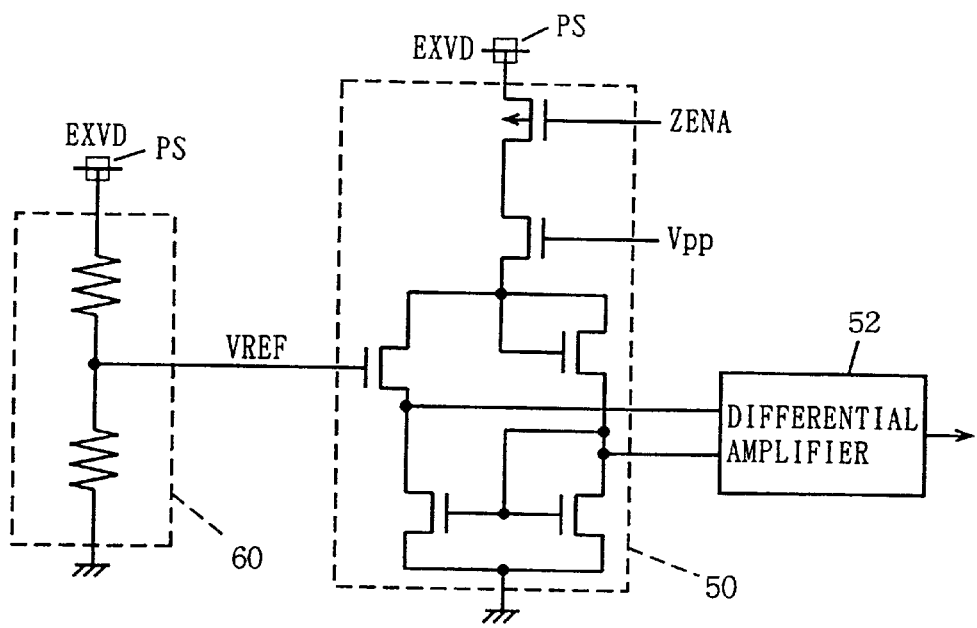
FIG. 46 schematically illustrates the structure of a Vpp detection circuit suitable for the output circuit shown in FIG. 45.

FIG. 46 illustrates the structure of a main part of the Vpp level detection circuit according to an embodiment 5 of the present invention. This figure shows the structure of the Vpp level detector 50. In the structure of the Vpp level detection circuit shown in FIG. 46, the reference voltage VREF is generated by voltage-dividing the external power supply voltage EXVD. Therefore, the voltage level of the reference voltage VREF is proportionate to that of the external power supply voltage EXVD. The Vpp level detector 50 compares the reference voltage VREF which is proportionate to the external power supply voltage EXVD with the high voltage Vpp generated in the interior. The structure of the Vpp level detector 50 is substantially identical to that of the Vpp level detector 50 described with reference to the embodiment 3, except for that a current source transistor is provided not on a ground node side but on an external power supply node PS side. In accordance with an output signal of the Vpp level detector 50, a signal for activating a charge pump operation is generated through a differential amplifier 52 and succeeding circuits.

As shown in FIG. 46, the level of the high voltage Vpp is determined on the basis of the external power supply voltage EXVD, for setting the voltage level of the output high voltage Vppo supplied to the output circuit 7 in proportionate to that of the output power supply voltage VDDQ. Even if this semiconductor memory device is employed in different systems, an interface voltage is different and the voltage level of the output power supply voltage VDDQ is different, therefore, the voltage level of the output high voltage Vppo is automatically adjusted in the interior a plurality of output power supply voltages can be accommodated with a single chip. A comparison reference voltage in the high voltage generation circuit 12 is now described.

[Structure 1 of High Voltage Generation Circuit]

Figure 47:
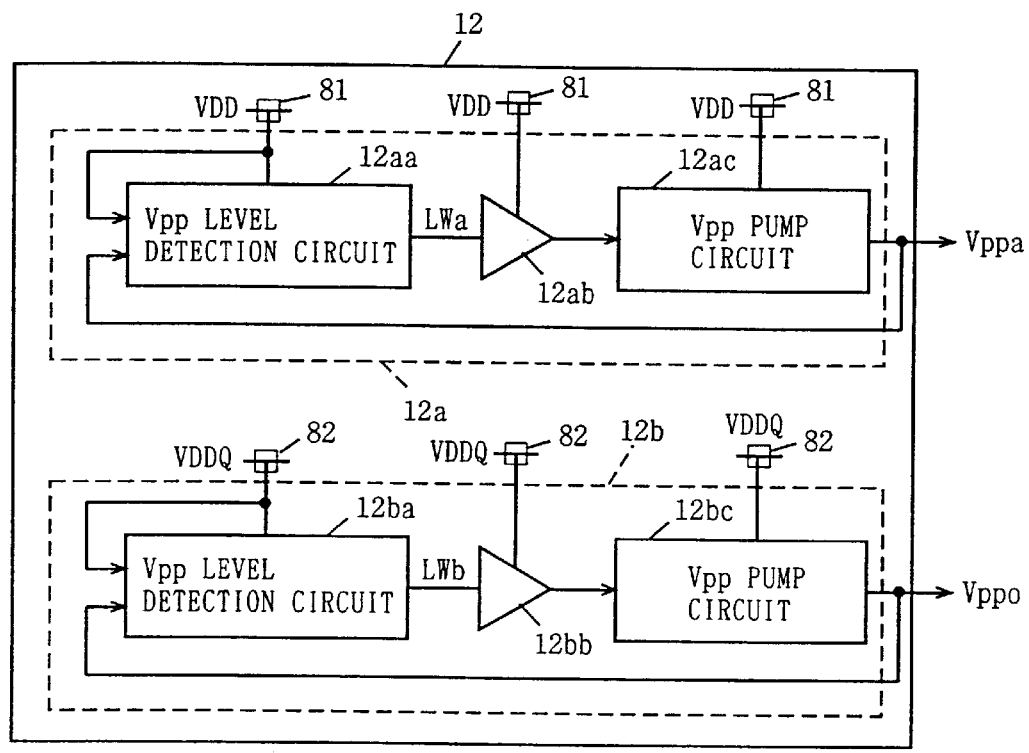
FIG. 47 illustrates a first power supply voltage distribution of a high voltage generation circuit having two power sources.

FIG. 47 schematically illustrates a first structure of the high voltage generation circuit 12 (see FIG. 1). Referring to FIG. 47, the high voltage generation circuit 12 includes an array high voltage generation circuit 12a for generating the array high voltage Vppa and an output high voltage generation circuit 12b for generating the output high voltage Vppo, as shown in FIG. 4.

The array high voltage generation circuit 12a includes a Vpp level detection circuit 12aa detecting the voltage level of the array high voltage Vppa in accordance with the externally applied device power supply voltage VDD of a power supply node 81, a Vpp clock generation circuit 12ab operating using the device power supply voltage VDD as one operating power supply voltage for generating a charge pump clock signal in activation of an activation control (clock generation activation) signal LWa from the Vpp level detection circuit 12aa, and a Vpp pump circuit 12ac performing a charge pump operation in accordance with the clock signal from the clock generation circuit 12ab for generating the array high voltage Vppa. The Vpp pump circuit 12ac generates the array high voltage Vppa from the device power supply voltage VDD.

The output high voltage generation circuit 12b includes a Vpp level detection circuit 12ba controlling the voltage level of the output high voltage Vppo in accordance with the output power supply voltage VDDQ supplied to a power supply node 82, a clock generation circuit 12bb operating using the output power supply voltage VDDQ as one operating power supply voltage for generating a charge pump clock signal in response to activation of a clock generation activation signal LWb from the Vpp level detection circuit 12ba, and a Vpp pump circuit 12bc performing a charge pump operation in accordance with the clock signal from the clock generation circuit 12bb for generating the output high voltage Vppo from the output power supply voltage VDDQ.

In this high voltage generation circuit 12, the array high voltage generation circuit 12a and the output high voltage generation circuit 12b each include both standby high voltage generation circuits and active high voltage generation circuits respectively. The Vpp level detection circuits 12aa and 12ba, the clock generation circuits 12ab and 12bb and the Vpp pump circuits 12ac and 12bc are similar in structure to those described with reference to the embodiments 1 to 4.

In the structure of the high voltage generation circuit 12 shown in FIG. 47, the voltage level of the output high voltage Vppo is determined on the basis of the voltage level of the output power supply voltage VDDQ. Even if the voltage level of the output high voltage VDDQ is changed, therefore, the output high voltage Vppo is generated in response to the changed voltage level (e.g., Vppo=VDDQ+ Vth when no voltage dividing circuit is provided or the voltage dividing ratio is 1), so that output data of a voltage level corresponding to an interface power supply voltage can be generated.

The array high voltage generation circuit 12a generates the array high voltage Vppa in accordance with the device power supply voltage VDD, and voltages transmitted to the peripheral circuit (row selection circuit) in the array 2 and onto the word lines can be set at optimum levels.

[Structure 2 of High Voltage Generation Circuit]

Figure 48:
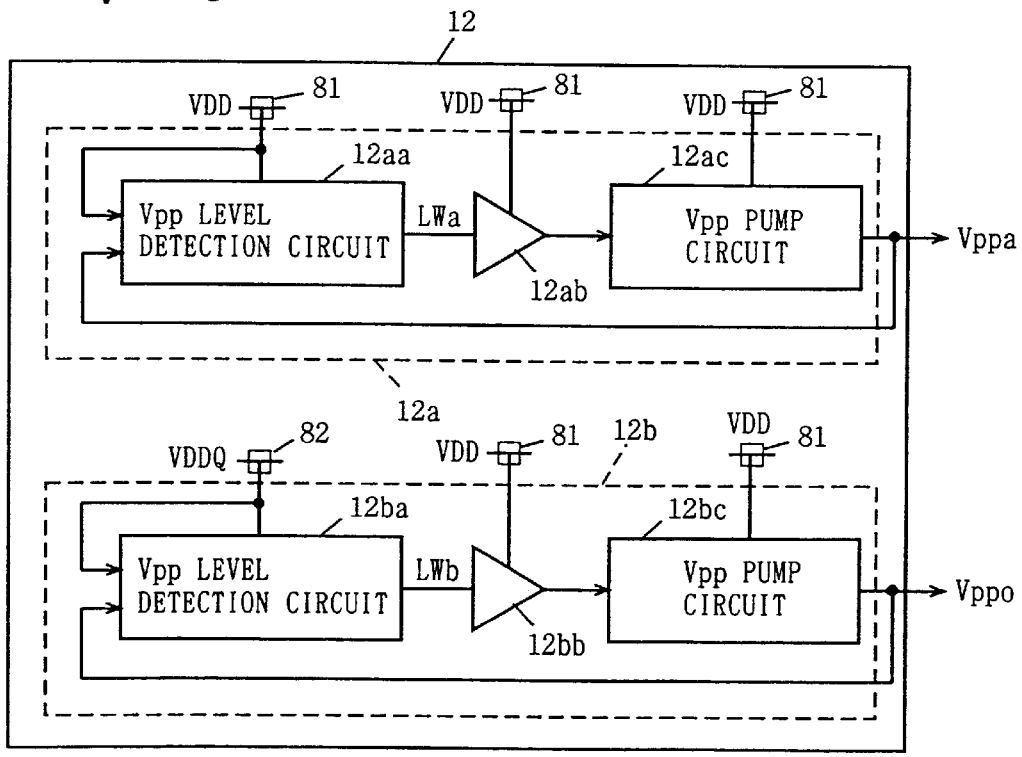
FIG. 48 illustrates a second power supply voltage distribution of the high voltage generation circuit having two power sources.

FIG. 48 schematically illustrates a second structure of the high voltage generation circuit 12. In the high voltage generation circuit 12 shown in FIG. 48, a clock generation circuit 12bb and a Vpp pump circuit 12bc in an output high voltage generation circuit 12b receive the device power supply voltage VDD from a power supply node 81. A Vpp level detection circuit 12ba receives the output power supply voltage VDDQ supplied to a power supply node 82. The remaining structure is identical to that shown in FIG. 47, and corresponding parts are denoted by the same reference numerals.

Figure 58:
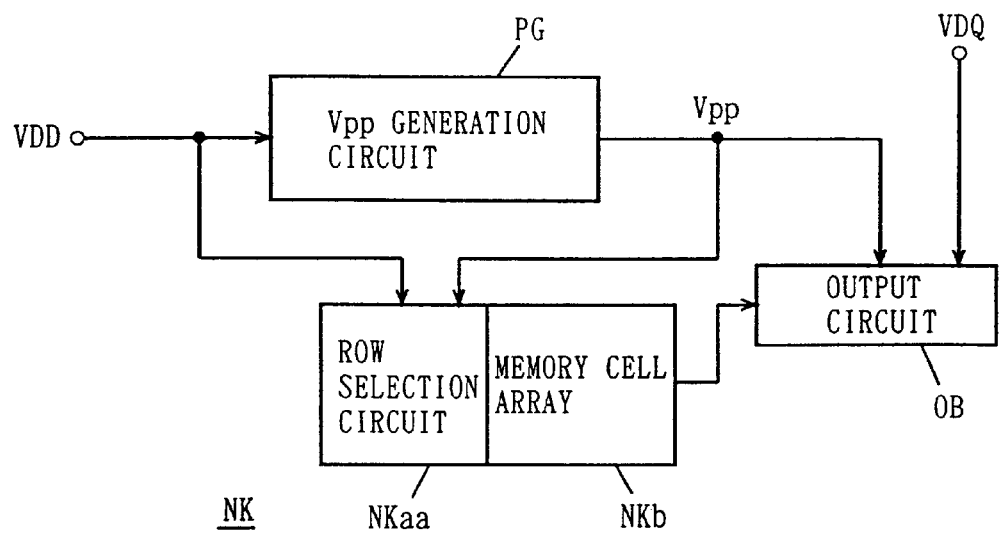
FIG. 58 schematically illustrates a manner of high voltage generation in a conventional semiconductor memory device.

In the high voltage generation circuit 12 shown in FIG. 48, the voltage level of the output high voltage Vppo is determined in accordance with that of the output power supply voltage VDDQ supplied to the power supply node 82. Only the Vpp level detection circuit 12ba employs the output power supply voltage VDDQ. Therefore, the output circuit 7 can dedicatedly use the output power supply voltage VDDQ in data output, since the output power supply voltage VDDQ is not used for generating the output high voltage Vppo by a charge pump operation. Thus, external read data can be stably generated at a high speed. While the device power supply voltage VDD is used for generating the array high voltage Vppa and the output high voltage Vppo, the structure is identical to that of the conventional circuit shown in FIG. 58 and no particular problem arises with respect to an internal circuit operation even if the device power supply voltage VDD is used for generating the output high voltage Vppo.

[Structure 3 of High Voltage Generation Circuit]

Figure 49:
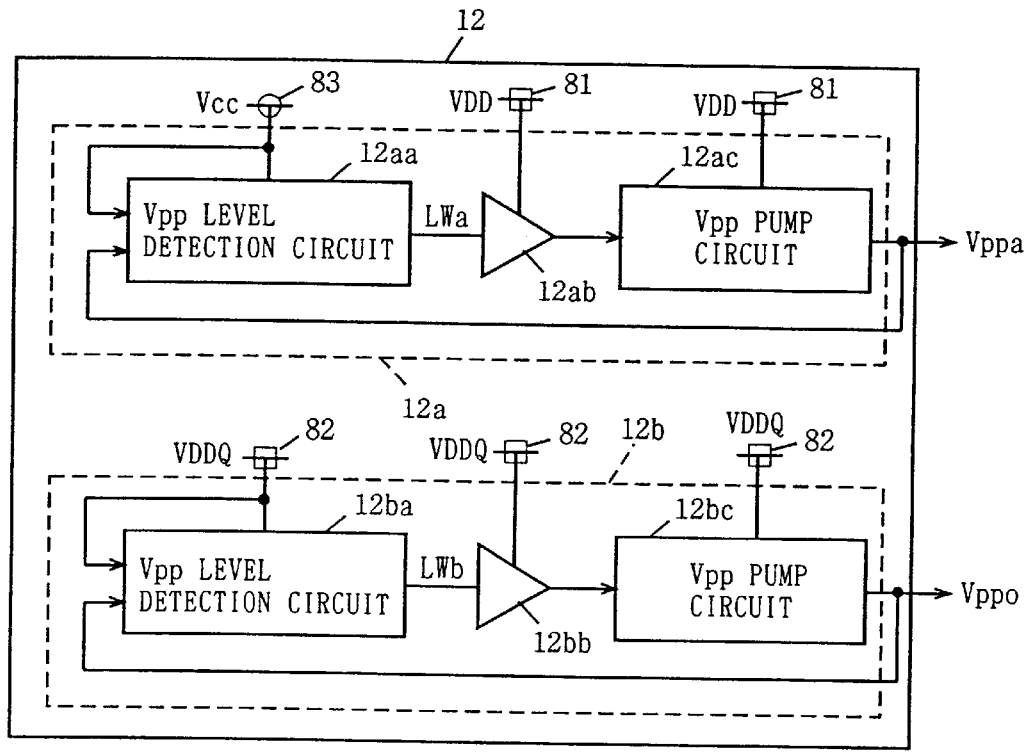
FIG. 49 illustrates a third power supply voltage distribution of the high voltage generation circuit having two power sources.

FIG. 49 schematically illustrates a third structure of the high voltage generation circuit 12. In the high voltage generation circuit 12 shown in FIG. 49, the voltage level of the array high voltage Vppa is set on the basis of that of an array power supply voltage Vcc on an internal power supply node 83. The remaining structure is identical to that of the high voltage generation circuit 12 shown in FIG. 47, and corresponding parts are denoted by the same reference numerals.

In the structure shown in FIG. 49, the array power supply voltage Vcc may be either the peripheral power supply voltage Vccp supplied to the peripheral circuit or the sense amplifier power supply voltage Vcca employed for driving the sense amplifier 5. The internal power supply circuit 10 shown in FIG. 1 generates the array power supply voltage Vcc. FIG. 26 shows an exemplary structure of the internal power supply circuit 10 as the internal power supply circuit 40.

In case of setting the voltage level of the array high voltage Vppa in accordance with that of the peripheral power supply voltage Vccp, it is not necessary to use the power supply voltage Vcca for the sense amplifier 5 consuming a large current in sense amplification. In word line selection and driving the word line into non-selected state with the array high voltage Vppa consumed, therefore, it is possible to prevent the operation of generating the array high voltage Vppa from exerting bad influence on the sense amplifier power supply voltage Vcca, thereby guaranteeing a stable sense operation. In case of employing the sense amplifier power supply voltage Vcca for setting the voltage level of the array high voltage Vppa, it is possible to set the voltage level of the array high voltage Vppa in accordance with a bit line voltage (the sense amplifier 5 charges/discharges bit lines). Therefore, the voltage level of the array high voltage Vppa can be set at an optimum level in accordance with the level of the power supply voltage supplied to the memory cells of the memory cell array 2. The output high voltage generation circuit 12*b* is identical in structure to that shown in FIG. 47.

[Structure 4 of High Voltage Generation Circuit]

Figure 50:
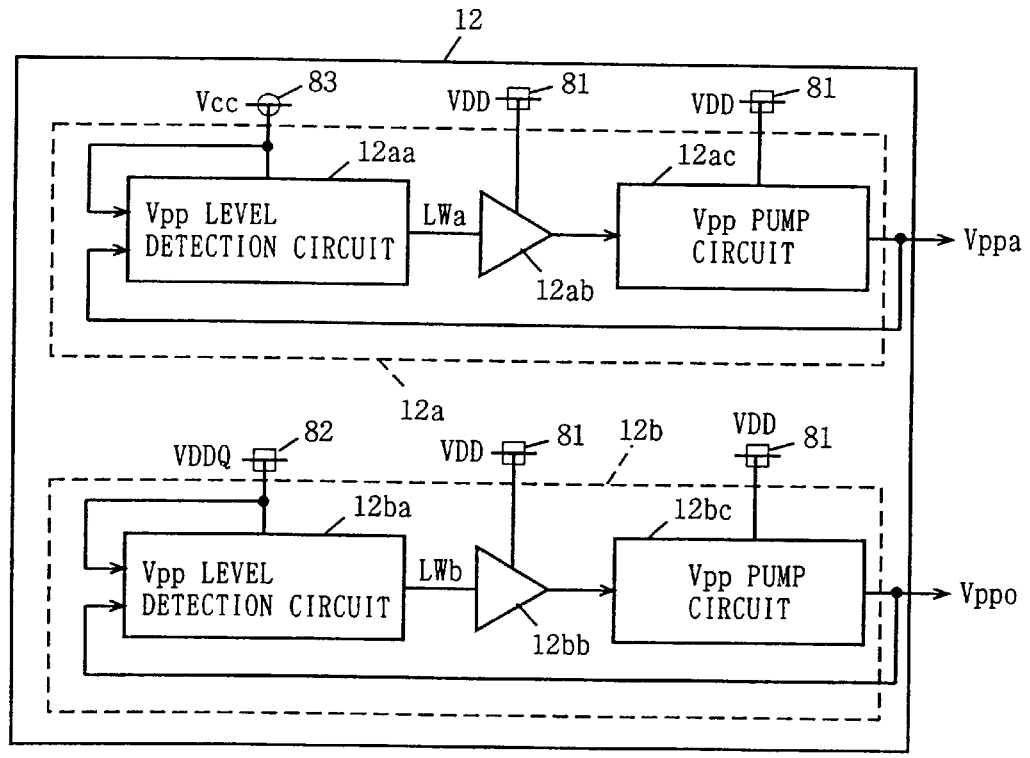
FIG. 50 illustrates a fourth power supply voltage distribution of the high voltage generation circuit having two power sources.

FIG. 50 schematically illustrates a fourth structure of the high voltage generation circuit 12. The high voltage generation circuit 12 shown in FIG. 50 is identical in structure to that shown in FIG. 49, except that a clock generation circuit 12*bb* and a Vpp pump circuit 12*bc* use the device power supply voltage VDD supplied to a power supply node 81 in an output high voltage generation circuit 12*b*. Corresponding parts are denoted by the same reference numerals, to omit the description thereof.

In the high voltage generation circuit 12 shown in FIG. 50, the internal power supply voltage (array power supply voltage) Vcc decides the voltage level of the array high voltage Vppa, while the voltage level of the output high voltage Vppo is determined in accordance with that of the output power supply voltage VDDQ. Therefore, the high voltage Vppa used in the interior and the high voltage Vppo for interfacing with an external device can be set at optimum voltage levels by determining these voltages in accordance with the voltage levels of the power supply voltage Vcc generated in the interior and the output power supply voltage VDDQ supplied from the exterior respectively.

In the high voltage generation circuit 12 according to the embodiment 5 of the present invention, as hereinabove described, different high voltage generation circuits 12*a* and 12*b* generate the array high voltage Vppa and the output high voltage Vppo respectively while the voltage level of the output high voltage Vppo is set in accordance with that of the output power supply voltage VDD when the device power supply voltage VDD and the external power supply voltage VDDQ are separately supplied at different voltage levels, whereby the voltage level of the output high voltage Vppo can be automatically changed in the interior in response to that of the output power supply voltage VDDQ level and it is possible to cope with the voltage levels of a plurality of interface power supply voltages (output power supply voltages) with a single chip.

[Another Exemplary Application]

Figure 51:
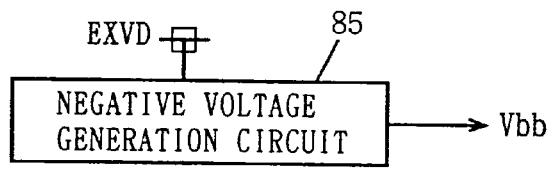
FIG. 51 illustrates another exemplary application of the present invention.

FIG. 51 illustrates the structure of another exemplary application of the present invention. This figure shows a negative voltage generation circuit 85 generating the negative voltage Vbb from the external power supply voltage EXVD. The negative voltage Vbb from the negative voltage generation circuit 85 is supplied to a P-type semiconductor substrate region of the memory cell array 2 shown in FIG. 1, for example. The threshold voltage of the n-channel MOS transistors is increased as the absolute value of the negative voltage Vbb is made large, while the threshold voltage is reduced if the absolute value thereof is small. Therefore, an optimum value is present also for the negative voltage Vbb, and it is necessary to bring the negative voltage Vbb to a prescribed value at a high speed after the start of power supply. Thus, the circuit part generating the high voltage Vpp described with reference to each of the embodiments 1 and 3 can be applied to the circuit part generating the negative voltage Vbb. The level detection of the negative voltage Vbb and the operation for generating the same can be controlled by changing the voltage polarities of the respective circuits and the channel conductivity types of the MOS transistors in the components of respective embodiments.

In the structure shown in FIG. 1, the high voltage Vpp is transmitted to a non-selected word line (main and sub word lines). However, the present invention is also applicable to such a structure that the non-selected word line is driven to the negative voltage Vbb level and the selected word line is driven to the high voltage Vpp level. In this case, a structure providing detection circuits for the negative voltage Vbb and the high voltage Vpp respectively is utilized.

In the embodiment 5, the voltage levels of the device power supply voltage VDD and the output power supply voltage VDDQ are different from each other. In the structures of the embodiments 1 to 4, however, the voltages VDD and VDDQ may be at the same voltage level. The structures of the embodiments 1 to 4 are applicable also to a semiconductor memory device having a single power source.

The voltage level of the high voltage Vpp is detected. However, the embodiment 3 of the present invention is also applicable to a structure detecting not only the level of the high voltage Vpp but also the level of a general signal voltage.

[Another Structure of Voltage Level Detection Circuit]

Figure 52:
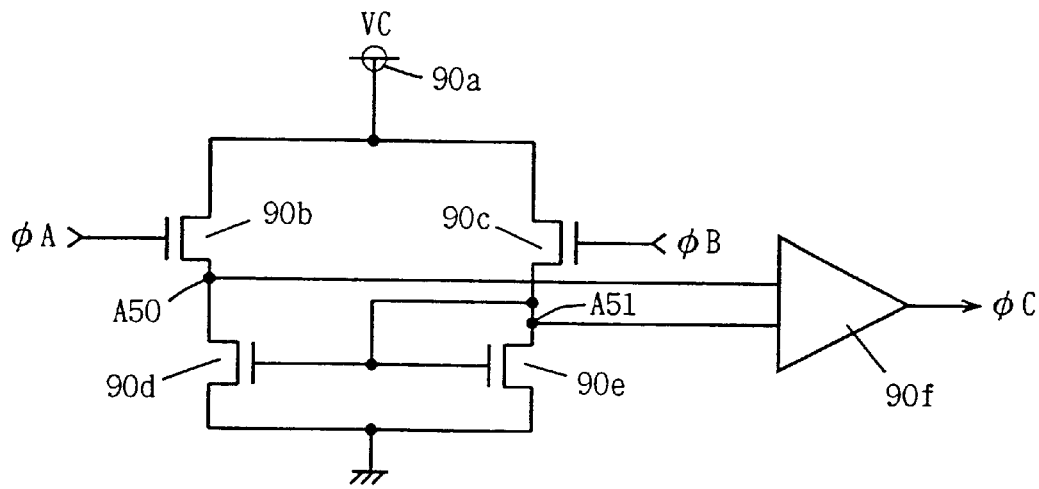
FIG. 52 illustrates another exemplary usage of the Vpp level detector.
Figure 53:
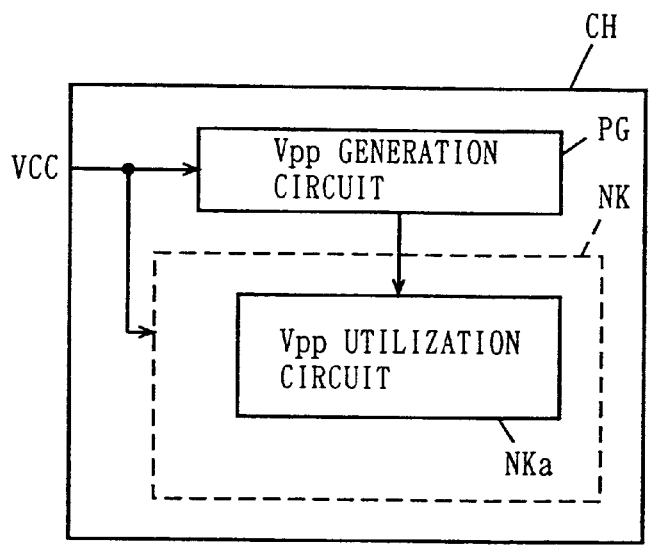
FIG. 53 schematically illustrates the structure of a conventional semiconductor circuit device.
Figure 54:
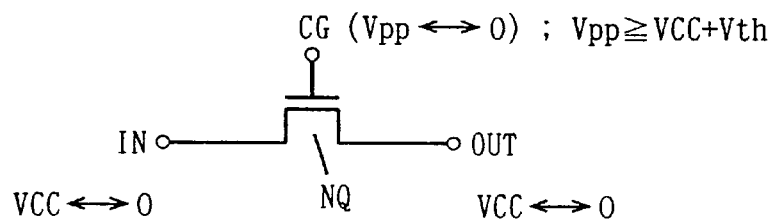
FIG. 54 is an illustration for explaining the reason why a high voltage is employed.
Figure 55:
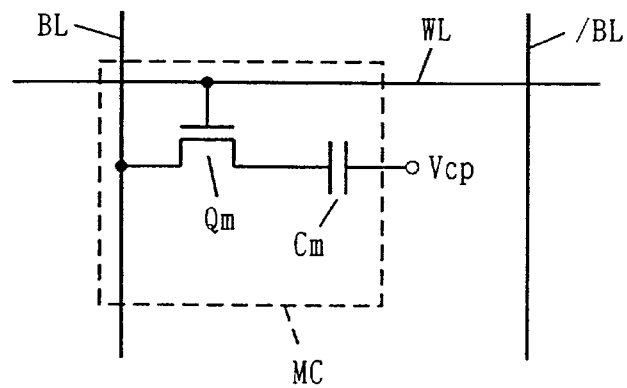
FIG. 55 schematically illustrates the structure of a part utilizing the high voltage.
Figure 56:
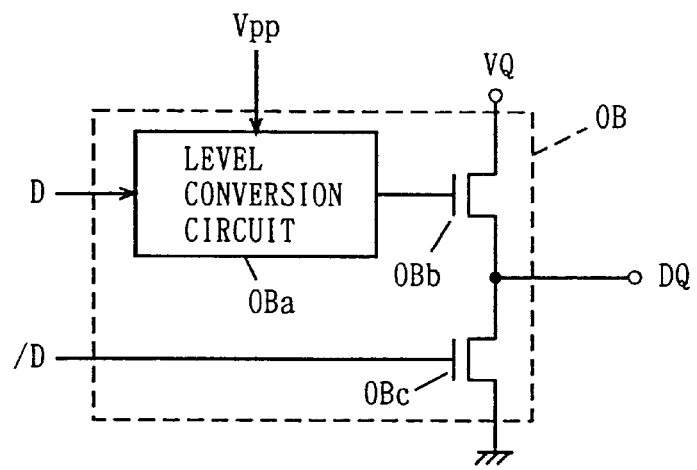
FIG. 56 schematically illustrates the structure of an output circuit part of the conventional semiconductor circuit device.
Figure 57:
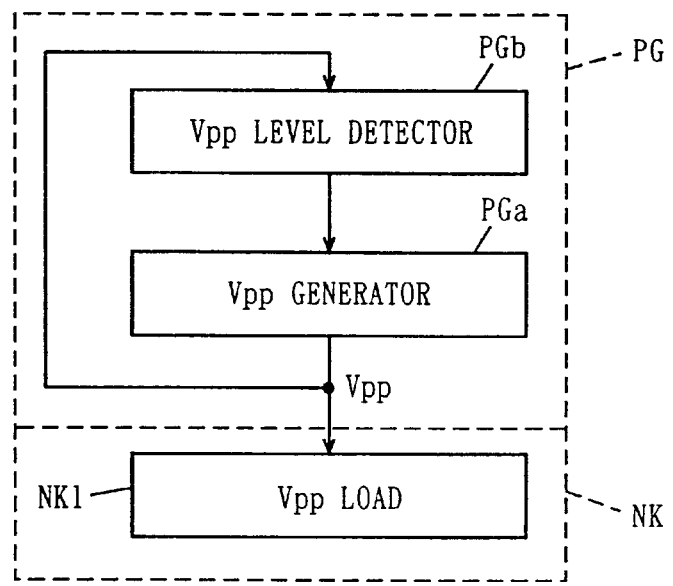
FIG. 57 schematically illustrates the structure of a conventional high voltage generation circuit.

FIG. 52 illustrates the structure of another exemplary application of the Vpp level detector 50. The circuit shown in FIG. 52 forms a comparison circuit comparing the voltage levels of signals φA and φB with each other. Referring to FIG. 52, the comparison circuit includes an n-channel MOS transistor 90*b* connected between a power supply node 90*a* and a node A50 and receiving the signal φA on its gate, an n-channel MOS transistor 90*c* connected between the power supply node 90*a* and a node A51 and receiving the signal φB on its gate, an n-channel MOS transistor 90*d* connected between the node A50 and a ground node with its node connected to the node A51, an n-channel MOS transistor 90*e* connected between the node A51 and the ground node with its gate connected to the node A51, and a differential amplifier 90*f* differentially amplifying signals of the nodes A50 and A51. The differential amplifier 90*f* outputs a signal φC indicating the result of the comparison.

In the comparison circuit shown in FIG. 52, the MOS transistors 90*b* to 90*e* are identical in size to each other. The MOS transistors 90*d* and 90*e* form a current mirror circuit. The MOS transistors 90*b* and 90*c* are different in channel resistance from each other in response to the voltage levels of the signals φA and φB. When the voltage levels of the signals φA and φB are lower than that of a power supply voltage VC, the MOS transistors 90b and 90c operate in the saturated region. Voltages responsive to the difference between saturation currents for the MOS transistors 90b and 90c appear at the voltage nodes A50 and A51. The differential amplifier 90f differentially amplifies the voltages at the nodes A50 and A51, thereby setting the signal φC at a high or low level in response to the voltage levels of the signals φA and φB.

The compare circuit shown in FIG. 52 is a current controlled compare circuit, which performs current amplification with no voltage amplification (equivalently to resistance division by the channel resistance ratio, and the dividing ratio is set in response to the voltage levels of the signals φA and φB, leading to equivalent shifting of the levels of the signals φA and φB). Therefore, the comparison circuit can compare the levels at a high speed. Further, all MOS transistors 90b to 90e are of the same conductivity type, whereby the temperature characteristics thereof can be equalized with each other so that the MOS transistors 90b to 90e cancel the temperature dependency of the voltages at the nodes A50 and A51 and the comparison circuit can compare the levels with no temperature dependency.

According to the present invention, as hereinabove described, the internal voltage generation circuit generating the internal voltage of the prescribed voltage level in activation thereof is forcibly activated for a prescribed period after the start of power supply, whereby it is possible to bring the internal voltage to the prescribed voltage level at a high speed after the start of power supply. Further, the level of the internal voltage generated from the power supply voltage is detected with reference to the level of the external power supply voltage after the start of power supply, whereby the level of the internal voltage can be correctly detected through the power supply voltage entering a stable state at the fastest timing.

Further, the comparison circuit formed by the same conductivity type MOS transistors detects the level of the internal voltage by a level shift operation, whereby temperature dependency can be eliminated and the level can be detected at a high speed with low current consumption.

In addition, the level of the output high voltage is determined in accordance with the level of the output power supply voltage supplied from the exterior, whereby it is possible to cope with a plurality of types of interface power supply voltages with a single chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device comprising:
   an internal circuit utilizing a first internal voltage;
   a first internal voltage generation circuit generation said first internal voltage in accordance with at least an externally applied first power supply voltage; and
   a second internal voltage generation circuit for generating a second internal voltage in accordance with an externally applied second power supply voltage different in voltage level from and same in logic level as the first power supply voltage, the first and second power supply voltage being individually applied to first and second power nodes fixedly separated from each other, respectively; and an output circuit operating using at least said second internal voltage as an operating power supply voltage, for externally outputting a signal received from said internal circuit, said output circuit including a circuit for driving the signal externally output, to a level of said externally applied second power supply voltage.

2. The semiconductor circuit device in accordance with claim 1, wherein said first internal voltage generation circuit includes:
   a first level detector for detecting a level of said first voltage on the basis of said first power supply voltage, and
   a first voltage generator selectively activated in response to an output signal of said first level detector for generating said first internal voltage from said first power supply voltage, and
   said second internal voltage generation circuit includes:
   a second level detector for detecting a level of said second internal voltage on the basis of the second power supply voltage, and
   a second voltage generator for generating said second internal voltage from said second power supply voltage in response to an output signal of said second level detector.

3. The semiconductor circuit device in accordance with claim 1, wherein said first internal voltage generation circuit includes:
   a first level detector for detecting a level of said first internal voltage on the basis of said first power supply voltage, and
   a first voltage generator selectively activated in response to an output signal of said first level detector for generating said firt internal voltage from the first power supply voltage, and
   said second internal generation circuit includes:
   a second level detector for detecting a level of said second internal voltage on the basis of said second power supply voltage, and
   a second voltage generator selectively activated in response to an output signal of said second level detector for generating said second internal voltage from said first power supply voltage.

4. The semiconductor circuit device according to claim 1, wherein said internal circuit includes an array circuit utilizing a down-converted voltage obtained by down-converting the first power supply voltage,
   said first internal voltage generation circuit includes:
   a first voltage level detector for detecting a voltage level of the first internal voltage on the basis of said down-converted voltage, and
   a first voltage generator selectively activated in response to an output signal of said first votlage level detector for generating said first internal votlage, and
   said second internal voltage generation circuit includes:
   a second votlage level detector for detecting a votlage level of said second internal voltage on the basis of the second power supply voltage and
   a second votlage generator selectively activated in response to an output signal of said second voltage level detector for generating said second internal voltage from said second supply voltage.

5. The semiconductor circuit device in accordance with claim 1, wherein said first internal voltage generation circuit includes:

a first voltage level detector for detecting a level of said first internal voltage on the basis of a voltage obtained by down-converting the first power supply voltage, and a first voltage genrator selectively activated in response to an output signal of said first voltage level detector for generating said first internal voltage from said first power supply voltage, and said second internal voltage generation circuit includes:

a second voltage level detector for detecting a level of said second internal voltage on the basis of the second power supply voltage, and a second voltage generator selectively activated in response to an output signal of said second voltage level detector for generating said second internal voltage from said first power supply voltage.

* * * * *